United States Patent
Kunitake et al.

(10) Patent No.: US 11,823,733 B2
(45) Date of Patent: Nov. 21, 2023

(54) MEMORY DEVICE, SEMICONDUCTOR DEVICE, AND ELECTRONIC DEVICE EACH INCLUDING REDUNDANT MEMORY CELL

(71) Applicant: SEMICONDUCTOR ENERGY LABORATORY CO., LTD., Atsugi (JP)

(72) Inventors: Hitoshi Kunitake, Kanagawa (JP);
Yuto Yakubo, Kanagawa (JP);
Takanori Matsuzaki, Kanagawa (JP);
Yuki Okamoto, Kanagawa (JP);
Tatsuya Onuki, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 192 days.

(21) Appl. No.: 17/600,379

(22) PCT Filed: Apr. 17, 2020

(86) PCT No.: PCT/IB2020/053638
§ 371 (c)(1),
(2) Date: Sep. 30, 2021

(87) PCT Pub. No.: WO2020/222068
PCT Pub. Date: Nov. 5, 2020

(65) Prior Publication Data
US 2022/0208248 A1    Jun. 30, 2022

(30) Foreign Application Priority Data
Apr. 30, 2019 (JP) .................................. 2019-087072

(51) Int. Cl.
*G11C 5/06* (2006.01)
*G11C 11/408* (2006.01)
(Continued)

(52) U.S. Cl.
CPC ...... *G11C 11/4085* (2013.01); *G11C 11/4093* (2013.01); *G11C 11/4096* (2013.01); *G11C 29/789* (2013.01)

(58) Field of Classification Search
CPC ....... G11C 5/063; G11C 7/18; G11C 11/4097; G11C 5/025; G11C 5/04
(Continued)

(56) References Cited

U.S. PATENT DOCUMENTS 5,764,577 A    6/1998   Johnston et al.
7,239,564 B2   7/2007   Mutaguchi
(Continued)

FOREIGN PATENT DOCUMENTS

CN    001992084 A    7/2007
CN    102436846 A    5/2012
(Continued)

OTHER PUBLICATIONS

International Search Report (Application No. PCT/IB2020/053638) dated Jul. 7, 2020.
(Continued)

*Primary Examiner* — Son T Dinh
(74) *Attorney, Agent, or Firm* — NIXON PEABODY LLP; Jeffrey L. Costellia

(57) ABSTRACT

A memory device includes m memory cell blocks, m×(k+1) word lines, n bit lines, and a word line driver circuit (m, k, and n are each an integer greater than or equal to 1). The memory cell block includes memory cells of (k+1) rows×n columns, and each of the memory cells is electrically connected to a word line and a bit line. The word line driver circuit has a function of outputting signals to m×k word lines that are selected from m×(k+1) word lines by using a switch transistor, and selection information is written to a gate of the switch transistor by using a transistor having a low
(Continued)

off-state current. The memory cells of k rows×n columns included in the memory cell block are normal memory cells, and each of the memory cell blocks includes redundant memory cells of one row×n columns.

9 Claims, 25 Drawing Sheets

(51) Int. Cl.
  *G11C 11/4093* (2006.01)
  *G11C 11/4096* (2006.01)
  *G11C 29/00* (2006.01)

(58) Field of Classification Search
  USPC .............................................. 365/63, 189.05
  See application file for complete search history.

(56) References Cited

U.S. PATENT DOCUMENTS

| | | | |
|---|---|---|---|
| 7,719,872 | B2 | 5/2010 | Kato |
| 8,339,832 | B2 | 12/2012 | Kato |
| 8,514,642 | B2 | 8/2013 | Koyama |
| 8,581,625 | B2 | 11/2013 | Yoneda et al. |
| 9,007,812 | B2 | 4/2015 | Koyama et al. |
| 9,299,393 | B2 | 3/2016 | Koyama et al. |
| 9,385,054 | B2 | 7/2016 | Kurokawa |
| 9,443,990 | B2 * | 9/2016 | Kato ................ H01L 29/40117 |
| 9,595,964 | B2 | 3/2017 | Yoneda et al. |
| 9,900,007 | B2 | 2/2018 | Yoneda et al. |
| 9,990,997 | B2 * | 6/2018 | Matsuzaki .......... G11C 11/4097 |
| 10,236,033 | B2 | 3/2019 | Koyama et al. |
| 10,665,270 | B2 | 5/2020 | Koyama et al. |
| 2005/0141264 | A1 | 6/2005 | Mutaguchi |
| 2007/0147129 | A1 | 6/2007 | Kato |
| 2012/0063208 | A1 | 3/2012 | Koyama et al. |
| 2012/0063209 | A1 | 3/2012 | Koyama et al. |
| 2012/0293206 | A1 | 11/2012 | Yoneda et al. |
| 2013/0107645 | A1 | 5/2013 | Kato |
| 2020/0342915 | A1 | 10/2020 | Koyama et al. |

FOREIGN PATENT DOCUMENTS

| | | |
|---|---|---|
| CN | 103563254 A | 2/2014 |
| EP | 0871124 A | 10/1998 |
| JP | 10-283795 A | 10/1998 |
| JP | 2005-174533 A | 6/2005 |
| JP | 2007-200521 A | 8/2007 |
| JP | 2012-256822 A | 12/2012 |
| JP | 2012-257216 A | 12/2012 |
| KR | 1998-0081112 A | 11/1998 |
| KR | 2007-0070112 A | 7/2007 |
| KR | 2014-0014330 A | 2/2014 |
| KR | 2014-0040159 A | 4/2014 |
| WO | WO-2012/157593 | 11/2012 |

OTHER PUBLICATIONS

Written Opinion (Application No. PCT/IB2020/053638) dated Jul. 7, 2020.

Yamazaki.S et al., "Properties of crystalline In—Ga—Zn-oxide semiconductor and its transistor characteristics", Jpn. J. Appl. Phys. (Japanese Journal of Applied Physics), Mar. 31, 2014, vol. 53, No. 4S, pp. 04ED18-1-04ED18-10.

Kato.K et al., "Evaluation of Off-State Current Characteristics of Transistor Using Oxide Semiconductor Material, Indium-Gallium-Zinc Oxide", Jpn. J. Appl. Phys. (Japanese Journal of Applied Physics), 2012, vol. 51, pp. 021201-1-021201-7.

* cited by examiner

FIG. 23A
| Amorphous | Intermediate state<br>New crystalline phase<br>Crystalline | Crystal |
|---|---|---|
| • completely amorphous | • CAAC<br>• nc<br>• CAC | • single crystal<br>• poly crystal |
FIG. 23B
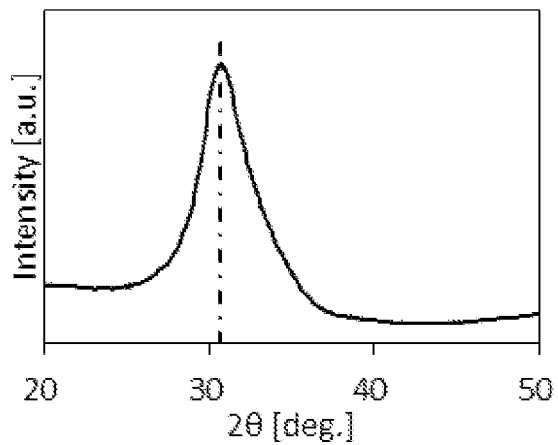
FIG. 23C
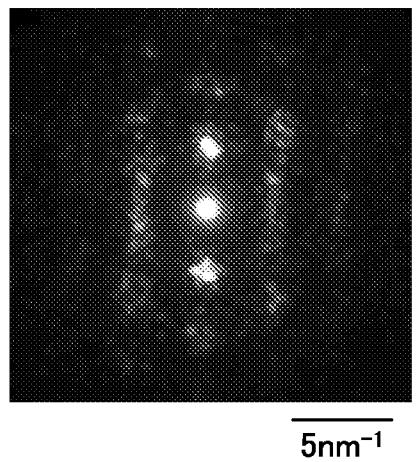

MEMORY DEVICE, SEMICONDUCTOR DEVICE, AND ELECTRONIC DEVICE EACH INCLUDING REDUNDANT MEMORY CELL

TECHNICAL FIELD

One embodiment of the present invention relates to a memory device. In particular, one embodiment of the present invention is a memory device (also referred to as a semiconductor memory device, a semiconductor memory, or a memory) that can function by utilizing semiconductor characteristics and includes a redundant memory cell.

Moreover, one embodiment of the present invention relates to a semiconductor device. In this specification and the like, a semiconductor device refers to a device that utilizes semiconductor characteristics and indicates, for example, a circuit including a semiconductor element (a transistor, a diode, a photodiode, and the like), a device including the circuit, and the like. Note that in this specification and the like, a semiconductor device refers to any device that can function by utilizing semiconductor characteristics; examples of the semiconductor device include an integrated circuit, a chip provided with an integrated circuit, an electronic component in which a chip is incorporated in a package, and an electronic device provided with an integrated circuit.

Note that one embodiment of the present invention is not limited to the above technical field. The technical field of the invention disclosed in this specification and the like relates to an object, a method, or a manufacturing method. One embodiment of the present invention relates to a process, a machine, manufacture, or a composition of matter.

BACKGROUND ART

A DRAM (Dynamic Random Access Memory) is widely known as a memory device used in various kinds of electronic devices. The DRAM is a memory device that includes memory cells each being composed of one transistor and one capacitor and stores data by accumulating electric charge in the capacitor.

A DRAM includes redundant memory cells, in addition to normally-used memory cells (also referred to as normal memory cells) in some cases, and for example, when defects are observed in some of the normal memory cells in pre-shipment inspection, the memory cells are switched to the redundant memory cells and then shipment is made. Thus, redundant memory cells and circuits for switching defective memory cells to the redundant memory cells (also referred to as switching circuits or redundant circuits) are used as a technology of improving a yield of the DRAM.

Meanwhile, a transistor including a metal oxide in a region where a channel of the transistor is formed (also referred to as a channel formation region) (such a transistor is also referred to as an oxide semiconductor transistor or an OS transistor) has been attracting attention. For example, as a metal oxide applicable to the transistor, an In—Ga—Zn oxide (called IGZO, or the like) is known.

The drain current of the OS transistor in an off state (such a current is also referred to as off-state current) is extremely low (e.g., see Non-Patent Documents 1 and 2); thus, when the OS transistor is used in a memory cell of a DRAM, electric charge accumulated in a capacitor can be retained for a long time.

Moreover, an OS transistor is a thin film transistor and thus can be provided to be stacked. For example, Patent Document 1 discloses such a DRAM structure that a plurality of layers including memory cells formed using OS transistors are stacked above a peripheral circuit formed with a transistor formed using a semiconductor substrate. By stacking a plurality of layers including memory cells of the DRAM, the chip area of the DRAM can be reduced.

In this specification and the like, a DRAM in which an OS transistor is used for a memory cell is referred to as an oxide semiconductor DRAM or a DOSRAM (registered trademark, Dynamic Oxide Semiconductor Random Access Memory).

REFERENCE

Patent Document

[Patent Document 1] United States Patent Application Publication No. 2012/0063208

Non-Patent Documents

[Non-Patent Document 1] S. Yamazaki et al., "Properties of crystalline In—Ga—Zn-oxide semiconductor and its transistor characteristics", Jpn. J. Appl. Phys., vol. 53, 04ED18 (2014).

[Non-Patent Document 2] K. Kato et al., "Evaluation of Off-State Current Characteristics of Transistor Using Oxide Semiconductor Material, Indium-Gallium-Zinc Oxide", Jpn. J. Appl. Phys., vol. 51, 021201 (2012).

SUMMARY OF THE INVENTION

Problems to be Solved by the Invention

A memory device including redundant memory cells requires redundant memory cells and circuits for switching defective normal memory cells to the redundant memory cells, in addition to normal memory cells. However, when the number of memory cells included in the memory device increases (the amount of data that can be stored in the memory device increases), the number of redundant memory cells also increases, and the circuit scale of the switching circuits becomes large and the switching circuits become complex.

An object of one embodiment of the present invention is to provide a memory device that includes redundant memory cells and easily switches normal memory cells to redundant memory cells. Alternatively, an object of one embodiment of the present invention is to provide a small-sized memory device that includes redundant memory cells, consumes low power, and is highly reliable.

Note that one embodiment of the present invention does not necessarily achieve all the above objects and only needs to achieve at least one of the objects. The descriptions of the above objects do not preclude the existence of other objects. Objects other than these are apparent from the descriptions of the specification, the claims, the drawings, and the like, and objects other than these can be derived from the descriptions of the specification, the claims, the drawings, and the like.

Means for Solving the Problems

One embodiment of the present invention is a memory device including a word line driver circuit, a switching circuit, and a memory cell array. The word line driver circuit has a function of outputting signals to k (k is an integer greater than or equal to 1) signal lines, the memory cell array includes k+1 word lines, and each of the k+1 word lines is electrically connected to a plurality of memory cells. The switching circuit includes 2×k switch transistors, and each of gates of the 2×k switch transistors is electrically connected to one of a source and a drain of a transistor and one terminal of a capacitor. One of a source and a drain of one of the 2×k switch transistors is electrically connected to one of the k signal lines, the other of the source and the drain of the one of the 2×k switch transistors is electrically connected to one of the k+1 word lines, one of a source and a drain of a different one of the 2×k switch transistors is electrically connected to the one of the k signal lines, and the other of the source and the drain of the different one of the 2×k switch transistors is electrically connected to a different one of the k+1 word lines.

In the above embodiment, the transistor contains a metal oxide in a channel formation region.

In the above embodiment, the switch transistors and the transistor each contain a metal oxide in a channel formation region.

One embodiment of the present invention is a memory device including a word line driver circuit, first to m-th (m is an integer greater than or equal to 1) switching circuits, and first to m-th memory cell blocks. The word line driver circuit includes first to m-th circuits, and the j-th (j is an integer greater than or equal to 1 and less than or equal to m) circuit has a function of outputting signals to the j-th switching circuit through first to k-th (k is an integer greater than or equal to 1) signal lines. The j-th memory cell block includes k+1 word lines, and each of the k+1 word lines is electrically connected to a plurality of memory cells. The j-th switching circuit includes 2×k switch transistors, and in the j-th switching circuit, each of gates of the 2×k switch transistors is electrically connected to one of a source and a drain of a transistor and one terminal of a capacitor. In the j-th switching circuit, one of a source and a drain of one of the 2×k switch transistors is electrically connected to one of the k signal lines, the other of the source and the drain of the one of the 2×k switch transistors is electrically connected to one of the k+1 word lines, one of a source and a drain of a different one of the 2×k switch transistors is electrically connected to the one of the k signal lines, and the other of the source and the drain of the different one of the 2×k switch transistors is electrically connected to a different one of the k+1 word lines.

In the above embodiment, the transistor contains a metal oxide in a channel formation region.

In the above embodiment, the switch transistor and the transistor each contain a metal oxide in a channel formation region.

One embodiment of the present invention is a memory device including a semiconductor substrate including a word line driver circuit, and an element layer including first to m-th (m is an integer greater than or equal to 1) switching circuits and first to m-th memory cell blocks. The word line driver circuit includes first to m-th circuits, and the j-th (j is an integer greater than or equal to 1 and less than or equal to m) circuit has a function of outputting signals to the j-th switching circuit through first to k-th (k is an integer greater than or equal to 1) signal lines. The j-th memory cell block includes k+1 word lines, and each of the k+1 word lines is electrically connected to a plurality of memory cells. The j-th switching circuit includes 2×k switch transistors, and in the j-th switching circuit, gates of the 2×k switch transistors is electrically connected to one of a source and a drain of a transistor and one terminal of a capacitor. In the j-th switching circuit, one of a source and a drain of one of the 2×k switch transistors is electrically connected to one of the k signal lines, the other of the source and the drain of the one of the 2×k switch transistors is electrically connected to one of the k+1 word lines, one of a source and a drain of a different one of the 2×k switch transistors is electrically connected to the one of the k signal lines, and the other of the source and the drain of the different one of the 2×k switch transistors is electrically connected to a different one of the k+1 word lines. The element layer is provided to be stacked above the semiconductor substrate.

In the above embodiment, the transistor and the switch transistors that are formed in the element layer each contain a metal oxide in a channel formation region.

In the above embodiment, the semiconductor substrate is a single crystal silicon substrate, and the transistor and the switch transistors that are provided in the element layer each contain a metal oxide in a channel formation region.

Effect of the Invention

According to one embodiment of the present invention, a memory device that includes redundant memory cells and easily switches normal memory cells to redundant memory cells can be provided. Alternatively, according to one embodiment of the present invention, a small-sized memory device that includes redundant memory cells, consumes low power, and is highly reliable can be provided.

Note that the description of these effects does not preclude the existence of other effects. One embodiment of the present invention does not necessarily have all the effects. Effects other than these are apparent from the descriptions of the specification, the claims, the drawings, and the like, and effects other than these can be derived from the descriptions of the specification, the claims, the drawings, and the like.

BRIEF DESCRIPTION OF THE DRAWINGS

FIG. 23A is a diagram showing the classification of crystal structures of IGZO. FIG. 23B is a graph showing an XRD spectrum of a CAAC-IGZO film. FIG. 23C is an image showing nanobeam electron diffraction patterns of a CAAC-IGZO film.

MODE FOR CARRYING OUT THE INVENTION

Figure 1:
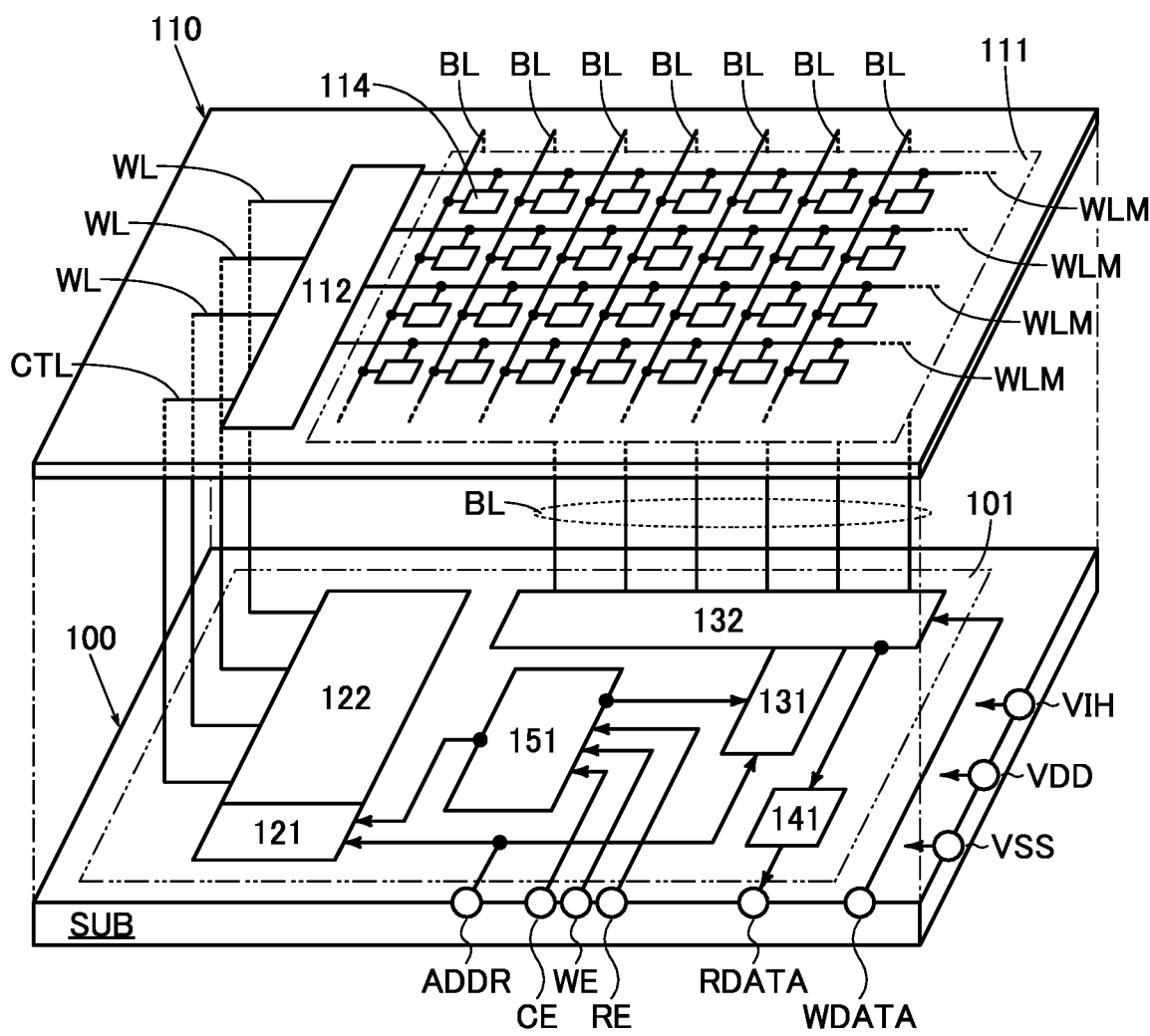
FIG. 1 is a schematic perspective view illustrating a structure example of a memory device.

Hereinafter, embodiments are described with reference to the drawings. However, the embodiments can be implemented with many different modes, and it is readily appreciated by those skilled in the art that modes and details thereof can be changed in various ways without departing from the spirit and scope thereof. Thus, the present invention should not be construed as being limited to the following description of the embodiments.

A plurality of embodiments described below can be combined as appropriate. In addition, in the case where a plurality of structure examples are described in one embodiment, the structure examples can be combined as appropriate.

Note that in the drawings attached to this specification, the block diagram in which components are classified according to their functions and shown as independent blocks is illustrated; however, it is difficult to separate completely actual components according to their functions, and it is possible for one component to relate to a plurality of functions.

In the drawings and the like, the size, the layer thickness, the region, or the like is exaggerated for clarity in some cases. Therefore, they are not limited to the illustrated scale. The drawings schematically show ideal examples, and shapes, values, or the like are not limited to shapes, values, or the like shown in the drawings.

In the drawings and the like, the same elements, elements having similar functions, elements formed of the same material, elements formed at the same time, or the like are sometimes denoted by the same reference numerals, and description thereof is not repeated in some cases.

In this specification and the like, the term "film" and the term "layer" can be interchanged with each other. For example, the term "conductive layer" can be changed into the term "conductive film" in some cases. As another example, the term "insulating film" can be changed into the term "insulating layer" in some cases.

In this specification and the like, the terms for describing arrangement such as "over" and "below" do not necessarily mean "directly over" and "directly below", respectively, in the positional relationship between components. For example, the expression "a gate electrode over a gate insulating layer" does not exclude the case where there is an additional component between the gate insulating layer and the gate electrode.

In this specification and the like, ordinal numbers such as "first", "second", and "third" are used in order to avoid confusion among components, and the terms do not limit the components numerically.

In this specification and the like, when a plurality of components are denoted by the same reference signs, and in particular need to be distinguished from each other, an identification numeral such as "_1", "_2", "[n]", or "[m,n]" is sometimes added to the reference signs. For example, the second wiring GL is referred to as a wiring GL[2].

In this specification and the like, "electrically connected" includes the case where connection is made through an "object having any electric function". There is no particular limitation on the "object having any electric function" as long as electric signals can be transmitted and received between components that are connected through the object. Examples of the "object having any electric function" include a switching element such as a transistor, a resistor, an inductor, a capacitor, and other elements with a variety of functions as well as an electrode and a wiring. Furthermore, even when the expression "being electrically connected" is used, there is a case in which no physical connection portion is made and a wiring is just extended in an actual circuit.

In addition, in this specification and the like, the term "electrode" or "wiring" does not functionally limit these components. For example, an "electrode" is used as part of a "wiring" in some cases, and vice versa.

In this specification and the like, a "terminal" in an electric circuit refers to a portion where a current or a potential is input (or output) or a signal is received (or transmitted). Accordingly, part of a wiring or an electrode functions as a terminal in some cases.

In general, a "capacitor" has a structure in which two electrodes face each other with an insulator (dielectric) therebetween. This specification and the like include a case where a "capacitor element" is the above-described "capacitor". That is, this specification and the like include cases where a "capacitor element" is one having a structure in which two electrodes face each other with an insulator therebetween, one having a structure in which two wirings face each other with an insulator therebetween, or one in which two wirings are positioned with an insulator therebetween.

In this specification and the like, a "voltage" often refers to a potential difference between a given potential and a reference potential (e.g., a ground potential). Thus, a voltage and a potential difference can be interchanged with each other.

In this specification and the like, a transistor is an element having at least three terminals of a gate, a drain, and a source. In addition, a channel formation region is included between the drain (a drain terminal, a drain region, or a drain electrode) and the source (a source terminal, a source region, or a source electrode), and a current can flow between the source and the drain through the channel formation region. Note that in this specification and the like, a channel formation region refers to a region through which current mainly flows.

Furthermore, functions of a source and a drain might be switched when a transistor of opposite polarity is employed or a direction of current flow is changed in circuit operation, for example. Thus, the terms of a source and a drain are interchangeable for use in this specification and the like.

Furthermore, unless otherwise specified, an off-state current in this specification and the like refers to a drain current of a transistor in an off state (also referred to as a non-conduction state or a cutoff state). Unless otherwise specified, the off state of an n-channel transistor refers to a state where the gate voltage Vgs with respect to a source is lower than a threshold voltage Vth, and the off state of a p-channel transistor refers to a state where the gate voltage Vgs with respect to a source is higher than the threshold voltage Vth. That is, the off-state current of an n-channel transistor sometimes refers to drain current at the time when the voltage Vgs of a gate with respect to a source is lower than the threshold voltage Vth.

In the above description of the off-state current, the drain may be replaced with the source. That is, the off-state current sometimes refers to a source current when a transistor is in the off state. In addition, a leakage current sometimes expresses the same meaning as the off-state current. Furthermore, in this specification and the like, the off-state current sometimes refers to a current that flows between a source and a drain when a transistor is in the off state.

Furthermore, in this specification and the like, an on-state current sometimes refers to a current that flows between a source and a drain when a transistor is in the on state (also referred to as a conduction state).

In this specification and the like, a metal oxide means an oxide of metal in a broad sense. Metal oxides are classified into an oxide insulator, an oxide conductor (including a transparent oxide conductor), an oxide semiconductor, and the like.

For example, in the case where a metal oxide is used in a channel formation region of a transistor, the metal oxide is referred to as an oxide semiconductor in some cases. That is to say, in the case where a metal oxide has at least one of an amplifying function, a rectifying function, and a switching function, the metal oxide can also be called a metal oxide semiconductor. In other words, a transistor containing a metal oxide in a channel formation region can be referred to as an "oxide semiconductor transistor" or an "OS transistor". Similarly, the "transistor using an oxide semiconductor" described above is also a transistor containing a metal oxide in a channel formation region.

Furthermore, in this specification and the like, a metal oxide containing nitrogen is also referred to as a metal oxide in some cases. A metal oxide containing nitrogen may be referred to as a metal oxynitride. The details of a metal oxide are described later.

Embodiment 1

In this embodiment, configuration examples of a memory device according to one embodiment of the present invention are described. The memory device according to one embodiment of the present invention is a memory device that can function by utilizing semiconductor characteristics, and is also called a semiconductor memory device, a semiconductor memory, or simply a memory. The memory device according to one embodiment of the present invention has a structure in which a plurality of layers including OS transistors are stacked above a layer including a transistor formed on a semiconductor substrate. The OS transistor has a characteristic of an extremely low off-state current.

<Schematic Perspective View of Memory Device>

FIG. 1 is a schematic perspective view illustrating a configuration example of a memory device 10 according to one embodiment of the present invention. The memory device 10 illustrated in FIG. 1 includes a layer 100 and a layer 110 and has a structure in which the layer 110 is stacked above the layer 100.

In each of the layer 100 and the layer 110, a circuit that can function by utilizing semiconductor characteristics is provided; specifically, a peripheral circuit 101 is provided in the layer 100, and a memory cell array 111 and a switching circuit 112 are provided in the layer 110. Note that in the drawings described in this specification and the like, the flow of main signals is indicated by an arrow or a line, and a power supply line and the like are omitted in some cases.

The peripheral circuit 101 includes a row decoder 121, a word line driver circuit 122, a column decoder 131, a bit line driver circuit 132, an output circuit 141, and a control logic circuit 151. The peripheral circuit 101 has a function of a driver circuit and a control circuit for the memory cell array 111 and the switching circuit 112.

The peripheral circuit 101 is formed with transistors formed on a semiconductor substrate SUB. There is no particular limitation on the semiconductor substrate SUB as long as a channel region of a transistor can be formed thereon. For example, a single crystal silicon substrate, a single crystal germanium substrate, a compound semiconductor substrate (such as a SiC substrate or a GaN substrate), an SOI (Silicon on Insulator) substrate, or the like can be used.

As the SOI substrate, the following substrate may be used: an SIMOX (Separation by Implanted Oxygen) substrate which is formed in such a manner that after an oxygen ion is implanted into a mirror-polished wafer, an oxide layer is formed at a certain depth from the surface and defects generated in a surface layer are eliminated by high-temperature annealing, or an SOI substrate formed by using a Smart-Cut method in which a semiconductor substrate is cleaved by utilizing growth of a minute void, which is formed by implantation of a hydrogen ion, by thermal treatment; an ELTRAN method (a registered trademark: Epitaxial Layer Transfer); or the like. A transistor formed using a single crystal substrate contains a single crystal semiconductor in a channel formation region.

In this embodiment, a case in which a single crystal silicon substrate is used as the semiconductor substrate SUB is described. A transistor formed on a single crystal silicon substrate is referred to as a Si transistor. The peripheral circuit 101 formed using Si transistors can operate at high speed.

The memory cell array 111 includes a plurality of memory cells 114, and the memory cell 114 is formed using an OS transistor. Furthermore, the switching circuit 112 is also formed using an OS transistor. The OS transistor is a thin film transistor, and thus, the memory cell array 111 and the switching circuit 112 can be stacked over the semiconductor substrate SUB. Thus, formation of the memory cells 114 and the switching circuit 112 using OS transistors enables a reduction in the chip area of the memory device 10 (a reduction in the size of the memory device 10). Furthermore, the OS transistor can be manufactured with a manufacturing apparatus similar to that for a Si transistor and thus can be manufactured at low cost.

Here, an oxide semiconductor has a bandgap of 2.5 eV or larger, preferably 3.0 eV or larger; thus, an OS transistor has a low leakage current due to thermal excitation and also has extremely low off-state current. Note that off-state current refers to current that flows between a source and a drain when a transistor is off.

A metal oxide used in a channel formation region of the OS transistor is preferably an oxide semiconductor containing at least one of indium (In) and zinc (Zn). Typical examples of such an oxide semiconductor include an In-M-Zn oxide (an element M is Al, Ga, Y, or Sn, for example). Reducing both impurities serving as electron donors, such as moisture or hydrogen, and oxygen vacancies can make an oxide semiconductor i-type (intrinsic) or substantially i-type. Such an oxide semiconductor can be referred to as a highly purified oxide semiconductor. Note that the details of an OS transistor are described in Embodiment 3 and Embodiment 4.

As illustrated in FIG. 1, in the memory cell array 111, the memory cells 114 are arranged in a matrix, and each of the memory cells 114 is electrically connected to a wiring WLM and a wiring BL. The memory cell 114 is selected by a potential applied to the wiring WLM, and data is written to the selected memory cell 114 through the wiring BL. Alternatively, the memory cell 114 is selected by a potential applied to the wiring WLM, and data is read from the selected memory cell 114 through the wiring BL. In other words, the wiring WLM has a function of a word line of the memory cell 114, and the wiring BL has a function of a bit line of the memory cell 114.

The memory cells 114 are electrically connected to the switching circuit 112 through the wirings WLM and are electrically connected to the bit line driver circuit 132 through the wirings BL. Furthermore, the switching circuit 112 is electrically connected to the word line driver circuit 122 through wirings WL and a wiring CTL. The wiring CTL is a wiring for transmitting a control signal of the switching circuit 112.

Note that although the electrical connection between the memory cells 114 and the switching circuit 112, the electrical connection between the switching circuit 112 and the word line driver circuit 122, and the electrical connection between the memory cells 114 and the bit line driver circuit 132 are described later with reference to FIG. 3 and FIG. 4, the number of wirings WL is less than the number of wirings WLM, and normally-used memory cells and redundant memory cells are included as the memory cells 114. Moreover, the peripheral circuit 101 is described with reference to FIG. 2.

<Block Diagram of Memory Device>

Figure 2:
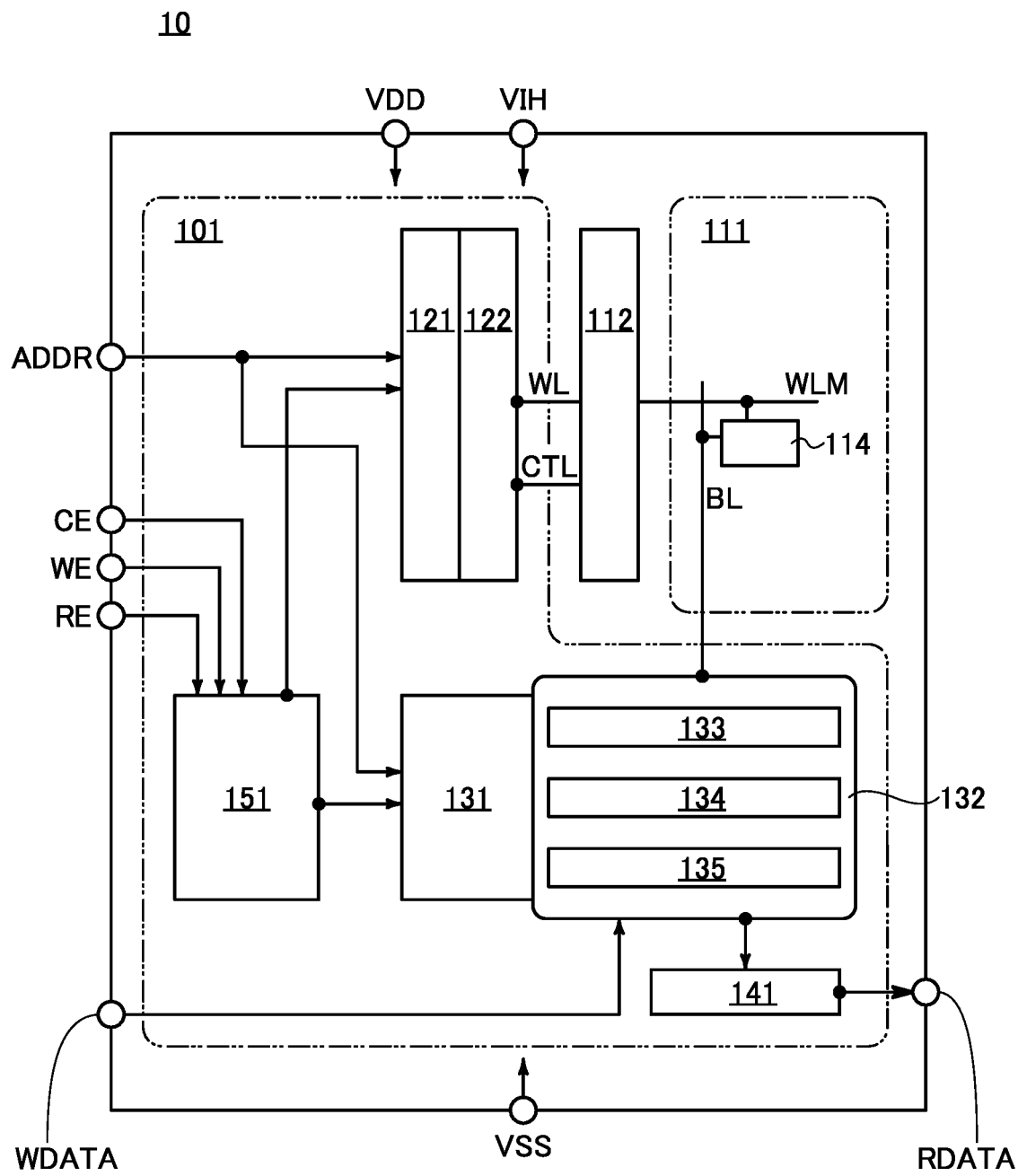
FIG. 2 is a block diagram illustrating a structure example of a memory device.

FIG. 2 is a block diagram illustrating a structure example of the memory device 10. In the block diagram illustrated in FIG. 2, some memory cells 114 included in the memory cell array 111 are not illustrated, and only one memory cell 114 is illustrated as a representative example.

As illustrated in FIG. 2, the memory device 10 includes the peripheral circuit 101, the memory cell array 111, and the switching circuit 112. The peripheral circuit 101 includes the row decoder 121, the word line driver circuit 122, the column decoder 131, the bit line driver circuit 132, the output circuit 141, and the control logic circuit 151.

The memory cell array 111 includes the plurality of memory cells 114 (only one memory cell 114 is illustrated in FIG. 2), the memory cell 114 is electrically connected to the switching circuit 112 through the wiring WLM, the switching circuit 112 is electrically connected to the word line driver circuit 122 through the wiring WL and the wiring CTL, and the memory cell 114 is electrically connected to the bit line driver circuit 132 through the wiring BL.

The memory cell 114 has a function of storing data by accumulating and retaining charge. The memory cell 114 may have a function of storing binary (high level or low level) data or may have a function of storing data of four or more levels. The memory cell 114 may have a function of storing analog data.

An OS transistor has an extremely low off-state current and thus is suitably used as a transistor included in the memory cell 114. An off-state current per micrometer of channel width of an OS transistor can be, for example, lower than or equal to 100 zA/µm, lower than or equal to 10 zA/µm, lower than or equal to 1 zA/µm, or lower than or equal to 10 yA/µm. The use of an OS transistor in the memory cell 114 can retain data written to the memory cell 114 for a long time. Thus, the refresh frequency of the memory cell 114 can be low, and the memory device 10 can be a memory with low power consumption.

Since a feature of an OS transistor is the on-state current less likely to increase even in a high-temperature environment, the memory device 10 can operate even when the temperature of the installation environment is high. The data stored in the memory cell 114 is less likely to be lost even in a high-temperature environment caused by heat generation by the peripheral circuit 101. The use of an OS transistor in the memory cell 114 can increase the reliability of the memory device 10.

In addition, the memory cell 114 using an OS transistor can rewrite and read data by charging or discharging of charge; thus, a substantially unlimited number of times of data writing and data reading are possible. Unlike a magnetic memory, a resistive random access memory, or the like, the memory cell 114 using an OS transistor has no change in the structure at the atomic level and thus exhibits high rewrite endurance. Furthermore, unlike in a flash memory, unstableness due to the increase of electron trap centers is not observed in the memory element using the OS transistor even when rewrite operation is repeated.

A transistor other than an OS transistor may be used as the transistor used in the memory cell 114 as long as its off-state current is low. For example, a transistor including a semiconductor with a wide bandgap in a channel formation region can be used. The semiconductor with a wide bandgap refers to a semiconductor whose bandgap is larger than or equal to 2.2 eV in some cases, and examples thereof include silicon carbide, gallium nitride, and diamond.

The bit line driver circuit 132 includes a precharge circuit 133, a sense amplifier 134, and an input/output circuit 135. The precharge circuit 133 has a function of precharging the wiring BL. The sense amplifier 134 has a function of amplifying a data signal read from the wiring BL, and the input/output circuit 135 has a function of writing a data signal to the wiring BL and outputting a data signal read from the wiring BL to the output circuit 141. Note that the structure example of the bit line driver circuit 132 is described in Embodiment 2.

Note that the wiring BL and the wiring WLM are wirings connected to the memory cell 114 included in the memory cell array 111; the details are described later. An amplified data signal is output to the outside of the memory device 10 as a digital data signal RDATA through the output circuit 141.

As power from the outside, a low power supply potential VSS, a high power supply potential VDD for the peripheral circuit 101, and a high power supply potential VIH for the memory cell array 111 are supplied to the memory device 10. Here, the high power supply potential VDD is higher than the low power supply potential VSS, and the high power supply potential VIH is higher than or equal to the high power supply potential VDD. Note that the low power supply potential VSS is used as a reference potential in the memory device 10.

Control signals (CE, WE, and RE), an address signal ADDR, and a data signal WDATA are input to the memory device 10 from the outside. The address signal ADDR is input to the row decoder 121 and the column decoder 131, and WDATA is input to the bit line driver circuit 132.

Note that the control signals (CE, WE, and RE), the address signal ADDR, the data signal WDATA, and the data signal RDATA are digital signals represented by a high level or a low level (represented by High or Low, H or L, 1 or 0, or the like in some cases). In this embodiment, the potential VDD is used to express the high level of a digital signal, and the potential VSS is used to express the low level of the digital signal. The potential VIH is used for the high level of the write word line WLM, and the potential VSS is used for the low level of the write word line WLM.

The control logic circuit 151 processes the signals (CE, WE, and RE) input from the outside, and generates control signals for the row decoder 121 and the column decoder 131. CE denotes a chip enable signal, WE denotes a write enable signal, and RE denotes a read enable signal. Signals processed by the control logic circuit 151 are not limited to them, and other control signals may be input as necessary.

Note that in the memory device 10, each of the above circuits, signals, and potentials can be appropriately selected as needed. Alternatively, another circuit, another signal, or another potential may be added.

<Configuration Example 1 of Memory Cell Array>

Figure 3A:
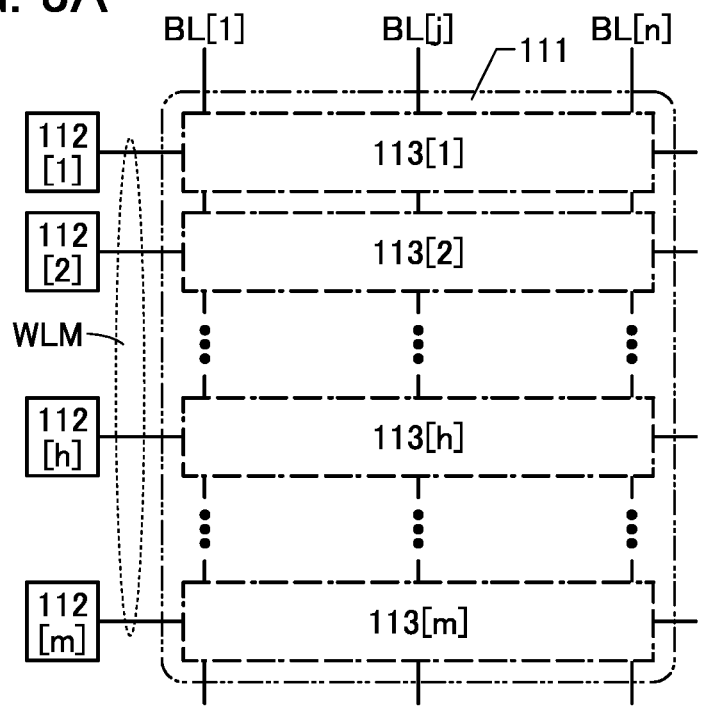
FIG. 3A and FIG. 3B are diagrams illustrating a configuration example of a memory cell array and electrical connection between the memory cell array and a switching circuit.
Figure 3B:
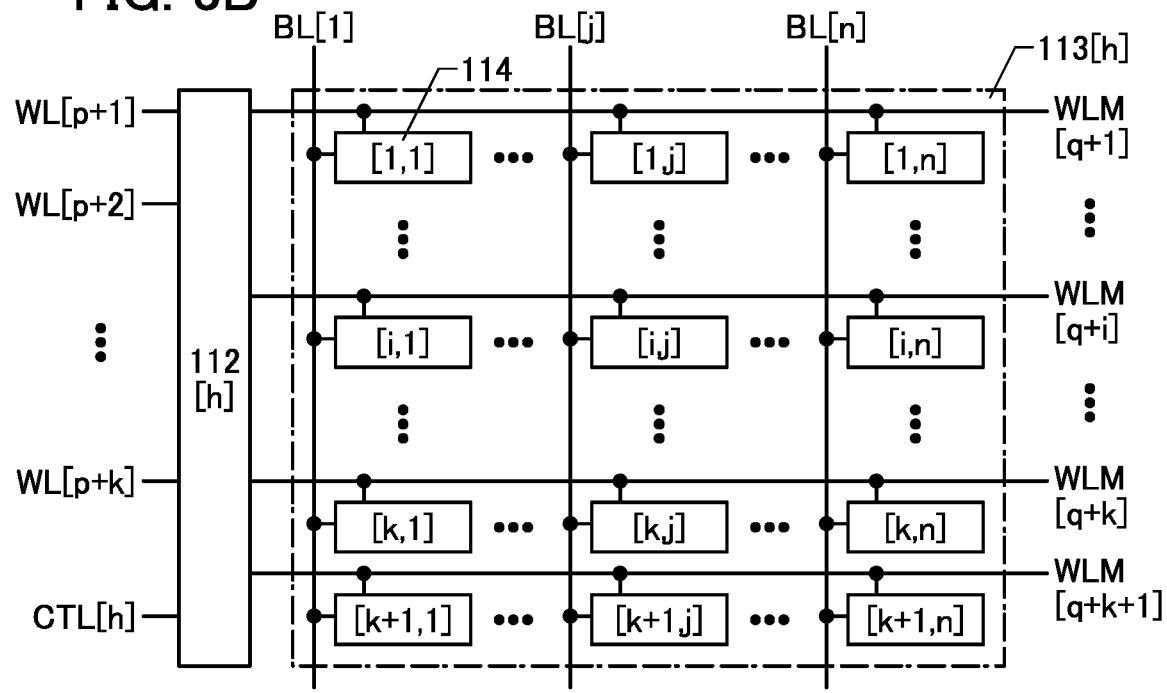

FIG. 3A and FIG. 3B are diagrams illustrating a configuration example of the memory cell array 111 and the electrical connection between the memory cell array 111 and the switching circuits 112.

The relationship between the memory cell array 111, memory cell blocks 113, and the switching circuits 112 is described with reference to FIG. 3A. As illustrated in FIG. 3A, the plurality of memory cells 114 included in the memory cell array 111 can be divided into m (m is an integer greater than or equal to 1) memory cell blocks 113. In other words, the memory cell array 111 includes m memory cell blocks 113, and each of the memory cell blocks 113 includes the memory cells 114.

Here, when h is an integer greater than or equal to 1 and less than or equal to m, the memory cell block 113[$h$] that is one of the memory cell blocks 113 is electrically connected to the switching circuit 112[$h$] through the wiring WLM. The memory device 10 includes the switching circuit 112[1] to the switching circuit 112[$m$].

Furthermore, the memory device 10 includes n (n is an integer greater than or equal to 1) wirings BL, and each of the memory cell block 113[1] to the memory cell block 113[$m$] is electrically connected to the wiring BL[1] to the wiring BL[n].

The configuration example of the memory cell block 113[$h$] and the relationship between the memory cell block 113[$h$] and the switching circuit 112[$h$] are described with reference to FIG. 3B. As illustrated in FIG. 3B, the memory cell block 113 [$h$] includes a total of (k+1)×n memory cells 114 (k is an integer greater than or equal to 1) of k+1 memory cells 114 in one column and n memory cells 114 in one row.

The memory cells 114 are arranged in a matrix, and [1,1], [$i,j$], [k,n], [k+1,n] (i is an integer greater than or equal to 1 and less than or equal to k+1, and j is an integer greater than or equal to 1 and less than or equal to n), and the like illustrated in FIG. 3B indicate addresses of the memory cells 114.

Each of the memory cells 114 is electrically connected to the wiring WLM and the wiring BL. In the memory cell block 113[$h$], the memory cell 114[$i,j$] is electrically connected to a wiring WLM[q+i] and the wiring BL[j]. Here, q=(k+1)×(h−1).

That is, the memory device 10 includes m×(k+1) wirings WLM, and in the memory cell block 113[$h$], the memory cell 114[$i,j$] is electrically connected to the switching circuit 112[$h$] through the wiring WLM[q+i].

Moreover, the memory device 10 includes m×k wirings WL and m wirings CTL. The switching circuit 112[$h$] is electrically connected to the word line driver circuit 122 through the wiring WL[p+1] to the wiring WL[p+k] and the wiring CTL[$h$]. Here, p=k×(h−1).

<Configuration Example 2 of Memory Cell Array>

Here, for easy understanding, a configuration example of the memory cell array 111 and the electrical connection between the memory cell array 111 and the switching circuits 112 in the case where k=4 is described with reference to FIG. 4A.

Figure 4A:
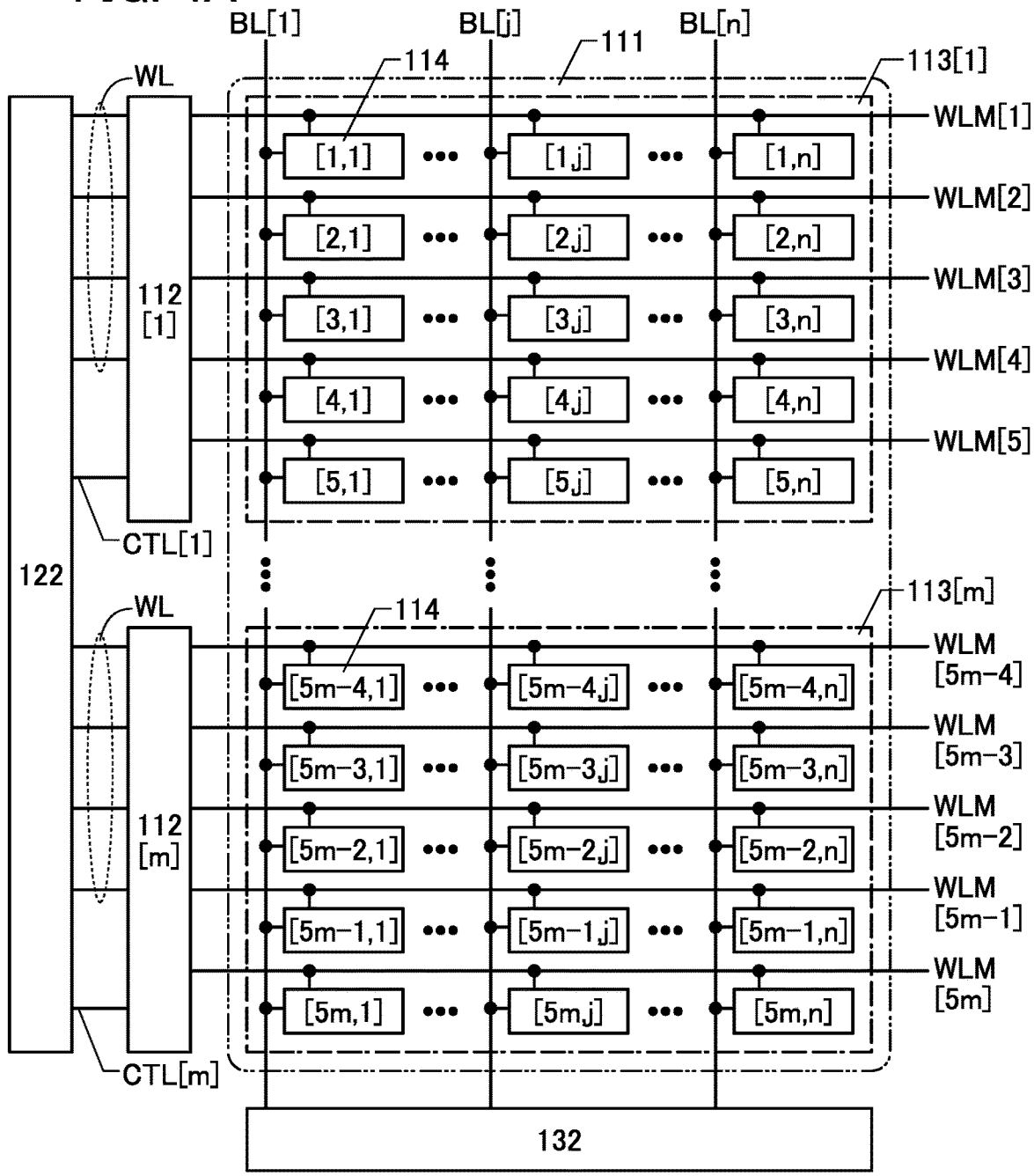
FIG. 4A is a diagram illustrating a configuration example of a memory cell array and electrical connection between the memory cell array and a switching circuit.

As illustrated in FIG. 4A, each of the memory cell block 113[1] to the memory cell block 113[$m$] includes 5×n memory cells 114. The memory device 10 includes n wirings BL and 5×m wirings WLM, and each of the memory cells 114 is electrically connected to the bit line driver circuit 132 through the wiring BL and is electrically connected to any of the switching circuit 112[1] to the switching circuit 112[$m$] through the wiring WLM.

Furthermore, the memory device 10 includes 4×m wirings WL and m wirings CTL, and each of the switching circuits 112 is electrically connected to the word line driver circuit 122 through the wirings WL and the wiring CTL.

That is, the number of wirings WLM connected to each of the switching circuit 112[1] to the switching circuit 112[$m$] is 5, and the number of wirings WL connected to each of the switching circuit 112[1] to the switching circuit 112[$m$] is 4. The switching circuit 112[1] to the switching circuit 112[$m$] have a function of electrically connecting four wirings WL and four wirings WLM and a function of bringing one wiring WLM into a non-selection state.

<Configuration Example of Memory Cell>

Figure 4B:
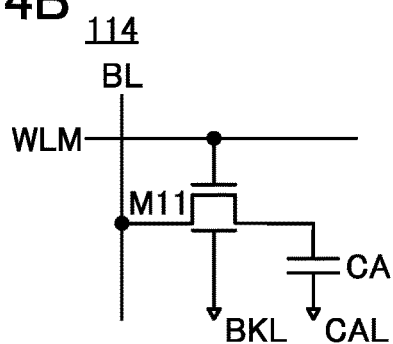
FIG. 4B is a circuit diagram illustrating a configuration example of a memory cell.

FIG. 4B is a circuit diagram illustrating a configuration example of the memory cell 114. The memory cell 114 includes a transistor M11 and a capacitor CA. Note that the transistor M11 includes a front gate (also simply referred to as a gate) and a back gate.

One of a source and a drain of the transistor M11 is electrically connected to a first terminal of the capacitor CA, and the other of the source and the drain of the transistor M11 is connected to the wiring BL. The gate of the transistor M11 is connected to the wiring WLM, and the back gate of the transistor M11 is connected to a wiring BKL. A second terminal of the capacitor CA is connected to a wiring CAL.

The wiring BL functions as a bit line, and the wiring WLM functions as a word line. The wiring CAL functions as a wiring for applying a predetermined potential to the second terminal of the capacitor CA. The wiring BKL functions as a wiring for applying a predetermined potential to the back gate of the transistor M11. The threshold voltage of the transistor M11 can be increased or decreased by supplying a given potential to the wiring BKL.

The transistor M11 has a function of a switch for controlling conduction or non-conduction between the first terminal of the capacitor CA and the wiring BL. To perform data writing or reading, a high-level potential is applied to the wiring WLM so that the first terminal of the capacitor CA and the wiring BL are brought into a conduction state. In other words, the memory cell 114 is a memory device that retains data by accumulating charges in the capacitor CA, and writing or reading of the data retained in the memory cell 114 is performed through the wiring BL and the transistor M11.

Note that a transistor containing a metal oxide in its channel formation region (OS transistor) can be used as the transistor M11. For example, in the channel formation region of the transistor M11, a metal oxide containing any one of an indium, an element M (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like), and zinc can be used. In particular, a metal oxide formed of indium, gallium, and zinc is preferable.

Furthermore, the capacitor CA has a structure in which an insulator is sandwiched between conductors serving as electrodes. As a conductor included in the electrode, a semiconductor to which a conductivity is imparted or the like can be used besides metal.

Since the OS transistor has an extremely low off-state current, data written to the memory cell 114 can be retained for a long time when the OS transistor is used as the transistor M11. Thus, the refresh frequency of the memory cell 114 can be low, and the memory device 10 can be a memory device with low power consumption.

When the OS transistor is used as the transistor M11, the memory cell 114 may retain multilevel data or analog data. When the OS transistor is used as the transistor M11, the memory device 10 can be operated even when the capacitance of the capacitor CA included in the memory cell 114 is decreased. When the OS transistor is used as the transistor M11, the above-described DOSRAM can be formed.

Note that the transistor M11 may have a structure without a back gate.

<Configuration Example of Switching Circuit>

Figure 5:
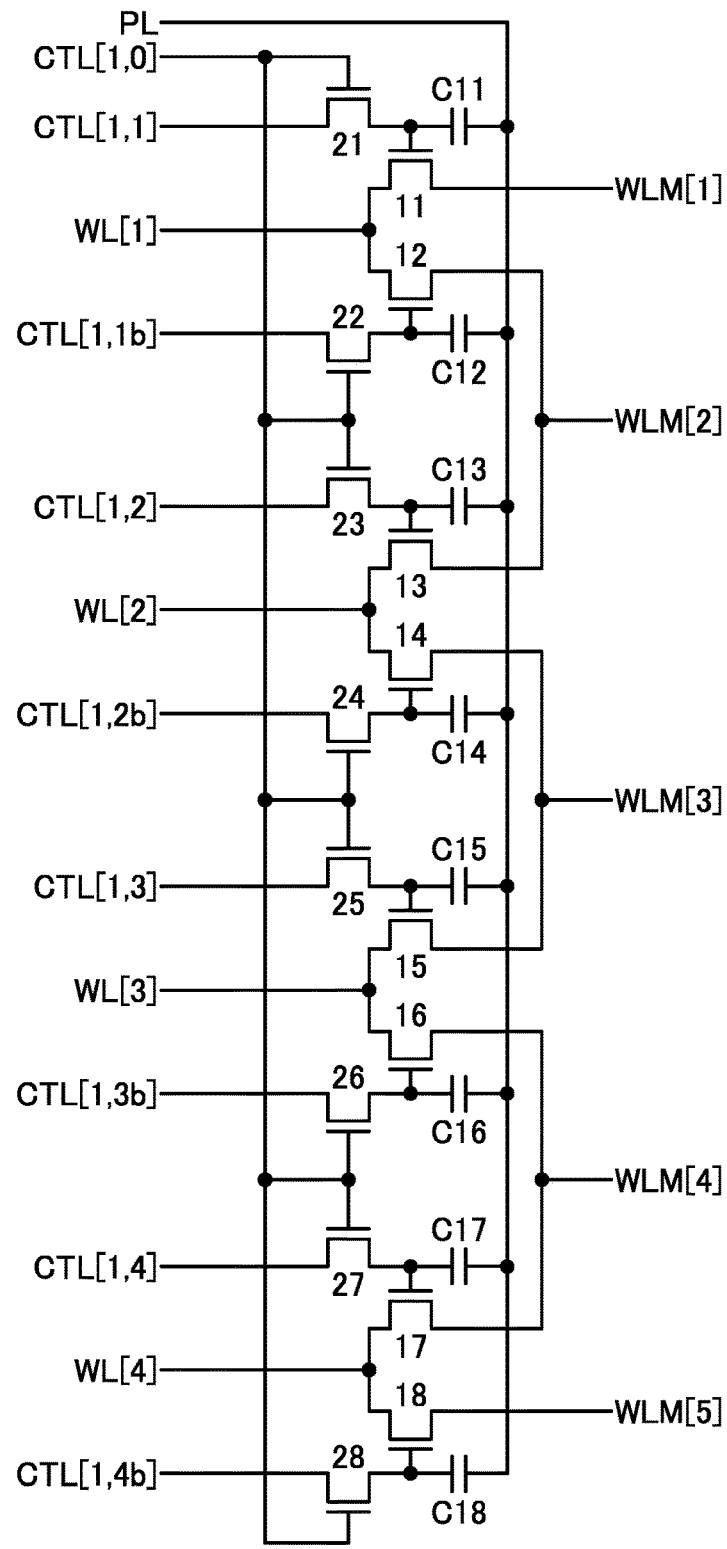
FIG. 5 is a circuit diagram illustrating a configuration example of a switching circuit.

A configuration example of the switching circuit 112[1] is illustrated in FIG. 5 as a representative example of the switching circuit 112[1] to the switching circuit 112[m].

The switching circuit 112[1] includes a transistor 11 to a transistor 18, a transistor 21 to a transistor 28, and a capacitor C11 to a capacitor C18. The transistor 11 to the transistor 18 and the transistor 21 to the transistor 28 are n-channel transistors. Note that the transistor 21 to the transistor 28 preferably have a low off-state current, and the transistor 11 to the transistor 18 are switch transistors for controlling the conduction state between the wiring WL and the wiring WLM.

A wiring WL[1] to a wiring WL[4], a wiring WLM[1] to a wiring WLM[5], a wiring CTL[1], and a wiring PL are connected to the switching circuit 112[1]; moreover, the wiring CTL[1] is divided into a wiring CTL[1,0] to a wiring CTL[1,4] and a wiring CTL[1,1b] to a wiring CTL[1,4b].

Note that a signal transmitted through the wiring CTL[1,1b] is an inverted signal of a signal transmitted through the wiring CTL[1,1], a signal transmitted through the wiring CTL[1,2b] is an inverted signal of a signal transmitted through the wiring CTL[1,2], a signal transmitted through the wiring CTL[1,3b] is an inverted signal of a signal transmitted through the wiring CTL[1,3], and a signal transmitted through the wiring CTL[1,4b] is an inverted signal of a signal transmitted through the wiring CTL[1,4].

Moreover, a signal transmitted through the wiring CTL[1,0] controls the timing of taking in signals transmitted through the wiring CTL[1,1] to the wiring CTL[1,4] and the wiring CTL[1,1b] to the wiring CTL[1,4b].

In the switching circuit 112[1], the wiring WL[1] is electrically connected to one of a source and a drain of the transistor 11 and one of a source and a drain of the transistor 12. Similarly, the wiring WL[2] is electrically connected to one of a source and a drain of the transistor 13 and one of a source and a drain of the transistor 14, the wiring WL[3] is electrically connected to one of a source and a drain of the transistor 15 and one of a source and a drain of the transistor 16, and the wiring WL[4] is electrically connected to one of a source and a drain of the transistor 17 and one of a source and a drain of the transistor 18.

The wiring WLM[1] is electrically connected to the other of the source and the drain of the transistor 11, the wiring WLM[2] is electrically connected to the other of the source and the drain of the transistor 12 and the other of the source and the drain of the transistor 13, the wiring WLM[3] is electrically connected to the other of the source and the drain of the transistor 14 and the other of the source and the drain of the transistor 15, the wiring WLM[4] is electrically connected to the other of the source and the drain of the transistor 16 and the other of the source and the drain of the transistor 17, and the wiring WLM[5] is electrically connected to the other of the source and the drain of the transistor 18.

The wiring CTL[1,0] is electrically connected to gates of the transistor 21 to the transistor 28, the wiring CTL[1,1] is electrically connected to one of a source and a drain of the transistor 21, the wiring CTL[1,1b] is electrically connected to one of a source and a drain of transistor 22, the wiring CTL[1,2] is electrically connected to one of a source and a drain of transistor 23, the wiring CTL[1,2b] is electrically connected to one of a source and a drain of transistor 24, the wiring CTL[1,3] is electrically connected to one of a source and a drain of transistor 25, the wiring CTL[1,3b] is electrically connected to one of a source and a drain of transistor 26, the wiring CTL[1,4] is electrically connected to one of a source and a drain of transistor 27, and the wiring CTL[1,4b] is electrically connected to one of a source and a drain of the transistor 28.

The other of the source and the drain of the transistor 21 is electrically connected to a gate of the transistor 11 and one terminal of the capacitor C11, the other of the source and the drain of the transistor 22 is electrically connected to a gate of the transistor 12 and one terminal of the capacitor C12, the other of the source and the drain of the transistor 23 is electrically connected to a gate of the transistor 13 and one terminal of the capacitor C13, the other of the source and the drain of the transistor 24 is electrically connected to a gate of the transistor 14 and one terminal of the capacitor C14, the other of the source and the drain of the transistor 25 is electrically connected to a gate of the transistor 15 and one terminal of the capacitor C15, the other of the source and the drain of the transistor 26 is electrically connected to a gate of the transistor 16 and one terminal of the capacitor C16, the other of the source and the drain of the transistor 27 is electrically connected to a gate of the transistor 17 and one terminal of the capacitor C17, and the other of the source and the drain of the transistor 28 is electrically connected to a gate of the transistor 18 and one terminal of the capacitor C18.

The wiring PL is electrically connected to the other terminals of the capacitor C11 to the capacitor C18. Note that the wiring PL functions as a wiring for applying a predetermined potential to the other terminals of the capacitor C11 to the capacitor C18.

<Operation Example of Switching Circuit>

For example, when signals transmitted through the wiring CTL[1,1] to the wiring CTL[1,4] are at a high level, the wiring WL[1] and the wiring WLM[1], the wiring WL[2] and the wiring WLM[2], the wiring WL[3] and the wiring WLM[3], and the wiring WL[4] and the wiring WLM[4] are each brought into a conduction state. The wiring WLM[5] is in a non-selection state.

For example, when signals transmitted through the wiring CTL[1,1] to the wiring CTL[1,4] are at a low level, the wiring WL[1] and the wiring WLM[2], the wiring WL[2] and the wiring WLM[3], the wiring WL[3] and the wiring WLM[4], and the wiring WL[4] and the wiring WLM[5] are each brought into a conduction state. The wiring WLM[1] is in anon-selection state.

For example, when a signal transmitted through the wiring CTL[1,1] is at a high level and signals transmitted through the wiring CTL[1,2] to the wiring CTL[1,4] are at a low level, the wiring WL[1] and the wiring WLM[1], the wiring WL[2] and the wiring WLM[3], the wiring WL[3] and the wiring WLM[4], and the wiring WL[4] and the wiring WLM[5] are each brought into a conduction state. The wiring WLM[2] is in a non-selection state.

For example, when signals transmitted through the wiring CTL[1,1] and the wiring CTL[1,2] are at a high level and signals transmitted through the wiring CTL[1,3] and the wiring CTL[1,4] are at a low level, the wiring WL[1] and the wiring WLM[1], the wiring WL[2] and the wiring WLM[2], the wiring WL[3] and the wiring WLM[4], and the wiring WL[4] and the wiring WLM[5] are each brought into a conduction state. The wiring WLM[3] is in a non-selection state.

Note that although not illustrated in FIG. 5, the switching circuit 112[1] preferably has a function of making the wiring WLM that is brought into a non-selection state at a low level. Furthermore, in the case where the off-state current of the transistor 21 to the transistor 28 is sufficiently low, the capacitor C11 to the capacitor C18 may be omitted.

In the memory cell block 113[1] and the switching circuit 112[1], for example, in the case where signals transmitted through the wiring CTL[1,1] to the wiring CTL[1,4] are set to a high level at an initial state and a defect is found in the memory cell 114 electrically connected to the wiring WLM[2] in pre-shipment inspection, the signal transmitted through the wiring CTL[1,1] is set to a high level and signals transmitted through the wiring CTL[1,2] to the wiring CTL[1,4] are set to a low level, so that the memory cell block 113[1] can be a conforming item.

In this case, it can be said that the memory cells 114 electrically connected to the wiring WLM[1] to the wiring WLM[4] are normal memory cells, and the memory cell 114 electrically connected to the wiring WLM[5] is a redundant memory cell.

When similar measures are taken for the memory cell block 113[1] to the memory cell block 113[*m*], the yield of the memory device 10 can be improved. Moreover, the inspection for finding a defective memory cell is not limited to the pre-shipment inspection and may be performed after the start of use of the memory device 10.

<Configuration Example of Word Line Driver Circuit>

Figure 6A:
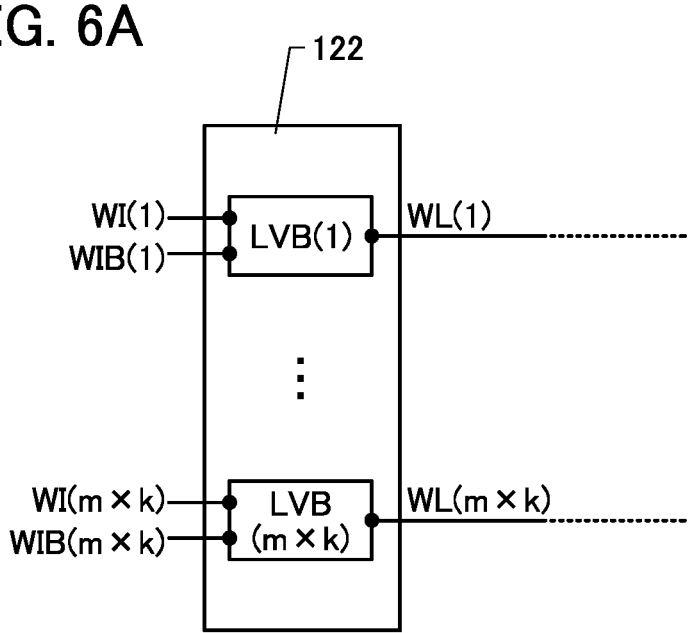
FIG. 6A is a block diagram illustrating a configuration example of a word line driver circuit.

FIG. 6A is a block diagram illustrating a configuration example of the word line driver circuit 122.

The word line driver circuit 122 has a function of outputting signals to m×k wirings WL. A signal WI and a signal WIB for driving the wiring WL are input to the word line driver circuit 122 from the row decoder 121. Here, the signal WI and the signal WIB are digital signals represented by a high level or a low level, and the signal WIB is an inverted signal whose logic is inverted from that of the signal WI.

Furthermore, the word line driver circuit 122 has a function of outputting signals to m wirings CTL. The function of outputting signals to the wirings CTL by the word line driver circuit 122 can be similar to the function of outputting signals to the wirings WL by the word line driver circuit 122; thus, the description is omitted in this embodiment.

Since the number of wirings WL is m×k, the number of signals WI and the number of signals WIB are each also m×k. In FIG. 6A, the wirings WL, the wirings WI, and the wirings WIB are each represented by WL(1) to WL(m×k), WI(1) to WI(m×k), and WIB(1) to WIB(m×k).

Because the low power supply potential VSS and the high power supply potential VDD are supplied to the row decoder 121, a potential corresponding to a high level of each of the signal WI and the signal WIB is the high power supply potential VDD and a potential corresponding to a low level of each of the signal WI and the signal WIB is the low power supply potential VSS.

Meanwhile, in the memory cell array 111, the high power supply potential VIH is used as a potential corresponding to a high level of the wiring WL, and the low power supply potential VSS is used as a potential corresponding to a low level of the wiring WL.

Thus, the word line driver circuit 122 has a function of adjusting a high level of an input signal (also referred to as level adjustment) and a function of adding the ability to drive the wiring WL to an input signal (also referred to as buffering). The word line driver circuit 122 includes m×k circuits LVB, which are denoted by LVB(1) to LVB(m×k) in FIG. 6A. The circuit LVB has a function of adjusting a high level of an input signal and a function of adding an ability to drive the wiring WL to the input signal.

Figure 6B:
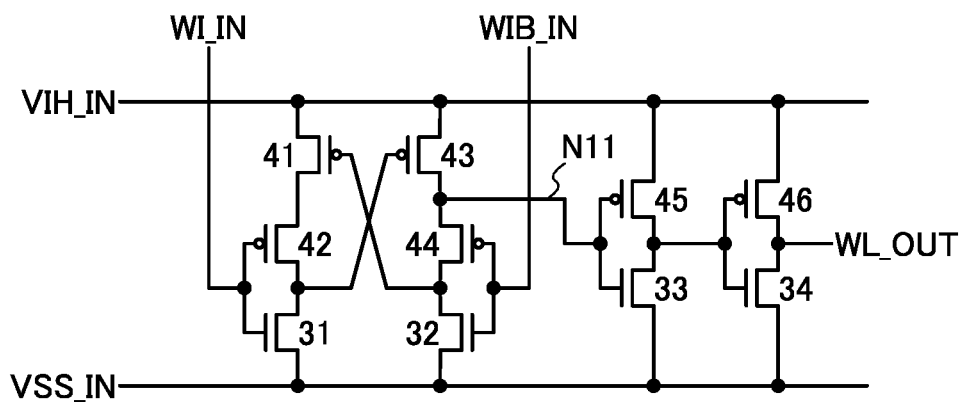
FIG. 6B is a circuit diagram illustrating a configuration example of a circuit LVB.

FIG. 6B is a circuit diagram illustrating a structure example of the circuit LVB.

The circuit LVB includes an n-channel transistor 31 to an n-channel transistor 34 and a p-channel transistor 41 to a p-channel transistor 46. Furthermore, the circuit LVB includes an input terminal WI_IN, an input terminal WIB_IN, a wiring VIH_IN, a wiring VSS_IN, and an output terminal WL_OUT.

In the circuit LVB, the signal WI is input to the input terminal WI_IN, the signal WIB is input to the input terminal WIB_IN, the high power supply potential VIH is input to the wiring VIH_IN, and the low power supply potential VSS is input to the wiring VSS_IN. Then, the circuit LVB outputs a signal for driving the wiring WL from the output terminal WL_OUT.

In the circuit LVB, one of a source and a drain of the transistor 31 is electrically connected to the wiring VSS_IN, the other of the source and the drain of the transistor 31 is electrically connected to one of a source and a drain of the transistor 42 and a gate of the transistor 43, and a gate of the transistor 31 is electrically connected to the input terminal WI_IN and a gate of the transistor 42. The other of the source and the drain of the transistor 42 is electrically connected to one of a source and a drain of the transistor 41, and the other of the source and the drain of the transistor 41 is electrically connected to the wiring VIH_IN.

One of a source and a drain of the transistor 32 is electrically connected to the wiring VSS_IN, the other of the source and the drain of the transistor 32 is electrically connected to one of a source and a drain of the transistor 44 and a gate of the transistor 41, and a gate of the transistor 32 is electrically connected to the input terminal WIB_IN and a gate of the transistor 44. The other of the source and the drain of the transistor 44 is electrically connected to one of a source and a drain of the transistor 43, and the other of the source and the drain of the transistor 43 is electrically connected to the wiring VIH_IN. Here, a connection portion of the other of the source and the drain of the transistor 44 and the one of the source and the drain of the transistor 43 is referred to as a node N11, and other elements and the like electrically connected to the node N11 are described later.

The transistor 31, the transistor 32, and the transistor 41 to the transistor 44 have a function of level adjustment for converting a potential corresponding to a high level of the input signal WI and signal WIB from the high power supply potential VDD to the high power supply potential VIH.

In the circuit LVB, one of a source and a drain of the transistor 33 is electrically connected to the wiring VSS_IN; the other of the source and the drain of the transistor 33 is electrically connected to one of a source and a drain of the transistor 45, a gate of the transistor 34, and a gate of the transistor 46; and a gate of the transistor 33 is electrically connected to the node N11 and a gate of the transistor 45. The other of the source and the drain of the transistor 45 is electrically connected to the wiring VIH_IN.

One of a source and a drain of the transistor 34 is electrically connected to the wiring VSS_IN, the other of the source and the drain of the transistor 34 is electrically connected to one of a source and a drain of the transistor 46 and the output terminal WL_OUT, and the other of the source and the drain of the transistor 46 is electrically connected to the wiring VIH_IN.

The transistor 33, the transistor 34, the transistor 45, and the transistor 46 have a function of buffering for outputting a signal of the node N11 from the output terminal WL_OUT.

As described above, the circuit LVB has a function of changing a high level of the signal WI and the signal WIB, which is represented by a high level or a low level using the high power supply potential VDD and the low power supply potential VSS to the high power supply potential VIH and outputting the high power supply potential VIH to the wiring WL.

<Memory Device>

In the memory device according to one embodiment of the present invention, the number of wirings WLM functioning as word lines of the memory cell 114 is greater than the number of wirings WL to which the word line driver circuit 122 outputs signals. The memory cells 114 are connected to each of the wirings WLM, and redundant memory cells are included in the memory cells 114. The switching circuit 112 has a function of controlling a conduction state between the wiring WLM and the wiring WL, and in the case where a defective memory cell is found in the memory cell 114, the wiring WLM connected to the defective memory cell is brought into a non-conduction state with the wiring WL, so that the defective memory cell can be unused.

Moreover, selection information is written to the gate of the switch transistor that controls the conduction state between the wiring WL and the wiring WLM by using a transistor having a low off-state current; thus, after the inspection for finding a defective memory cell is performed, the selection information can be retained for a long time. That is, the conduction state between the wiring WLM and the wiring WL can be retained.

Furthermore, when the switching circuit 112 is formed using an OS transistor, the switching circuit 112 can be provided to be stacked above the peripheral circuit 101. The switching circuit 112 can be provided near the memory cell array 111, and signal delay can be reduced. Moreover, the chip area of the memory device 10 can be reduced.

Note that this embodiment can be implemented in combination with the other embodiments described in this specification as appropriate.

Embodiment 2

Figure 7:
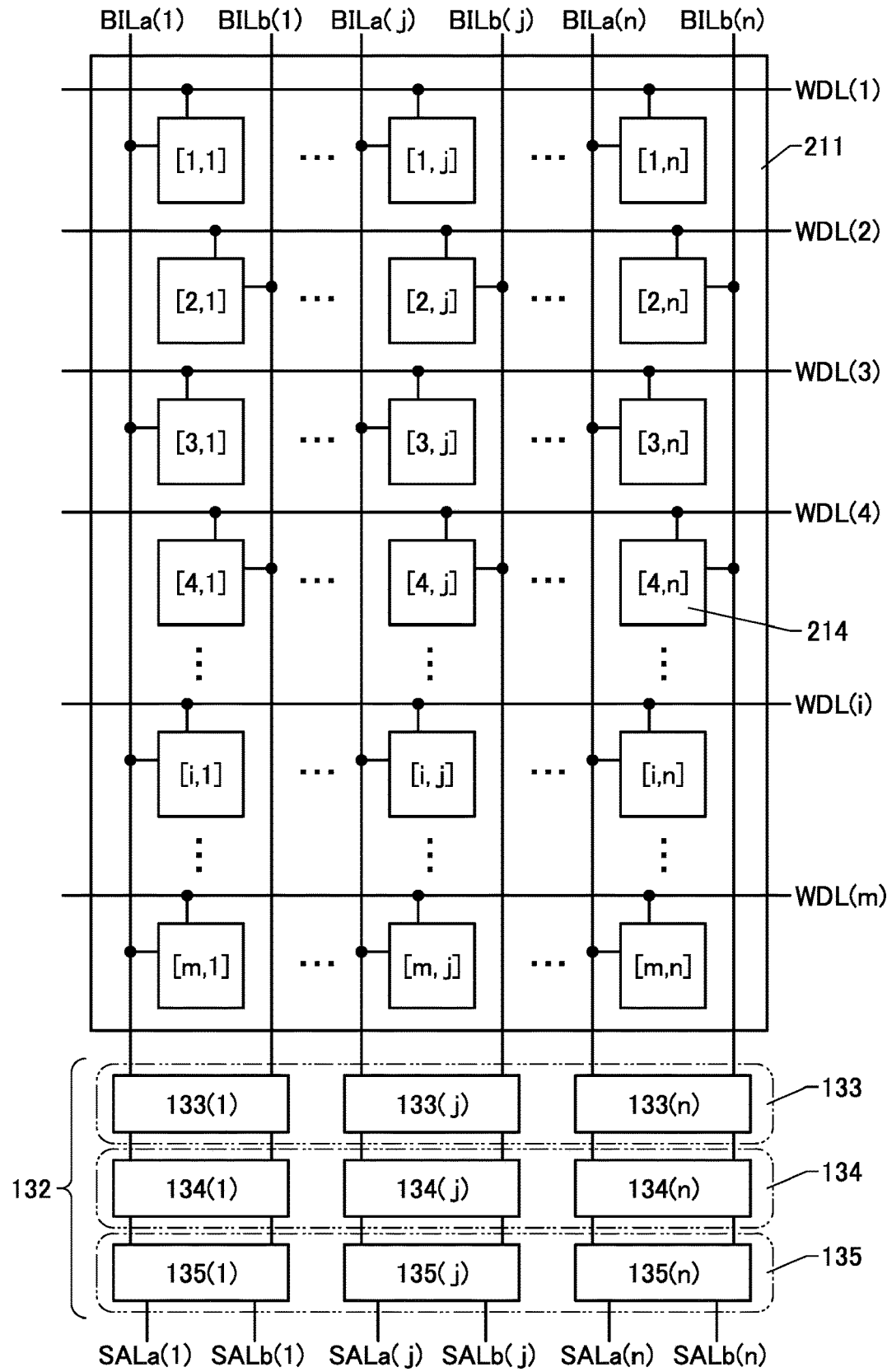
FIG. 7 is a diagram illustrating a configuration example of a memory cell array and a bit line driver circuit.

In this embodiment, the configuration example and the operation example of the precharge circuit 133, the sense amplifier 134, and the input/output circuit 135 that are included in the bit line driver circuit 132 described in the above embodiment are described. Note that a memory cell array 211 illustrated in FIG. 7 is different from the memory cell array 111 described in the above embodiment and is a memory cell array having a folded bit-line architecture. For example, when the memory cells 214, which are included in the memory cell array 211, in each of the memory cell block 113 are connected to the same bit line, the memory cell array 211 can also be used as the memory cell array 111. Note that the memory cell array 211 can also be used for a memory cell array having an open bit-line architecture.

The memory cell array 211 illustrated in FIG. 7 includes a total of m×n memory cells 214 of m memory cells 214 in one column and n memory cells 214 in one row (m and n are each an integer greater than or equal to 1), and the memory cells 214 are arranged in a matrix. FIG. 7 also illustrates addresses of the memory cells 214. For example, [i,j] indicates the memory cell 214 in the i-th row and the j-th column (i is an integer greater than or equal to 1 and less than or equal to m and j is an integer greater than or equal to 1 and less than or equal to n).

Furthermore, the memory cell array 211 illustrated in FIG. 7 includes m wirings WDL functioning as a word line, and the wiring WDL(1) is electrically connected to the memory cells 214 in the first row. Similarly, the wiring WDL(i) is electrically connected to the memory cells 214 in the i-th row.

In addition, the memory cell array 211 illustrated in FIG. 7 includes two wirings BIL (a wiring BILa and a wiring BILb) in one column. In FIG. 7 and the like, the wiring BILa in the first column is referred to as a wiring BILa(1), and the wiring BILb in the j-th column is referred to as a wiring BILb(j).

The memory cell 214 placed in an odd-numbered row is electrically connected to one of the wiring BILa and the wiring BILb, and the memory cell 214 placed in an even-numbered row is electrically connected to the other of the wiring BILa and the wiring BILb.

Moreover, the wiring BILa and the wiring BILb are electrically connected to the precharge circuit 133, the sense amplifier 134, and the input/output circuit 135, which are provided in every column. The input/output circuit 135 is electrically connected to a wiring SALa and a wiring SALb in every column. In FIG. 7 and the like, the precharge circuit 133 in the first column is referred to as a precharge circuit 133(1), and the precharge circuit 133 in the j-th column is referred to as a precharge circuit 133(j). The same applies to the sense amplifier 134 and the input/output circuit 135.

<Circuit Structure Example>

Figure 8:
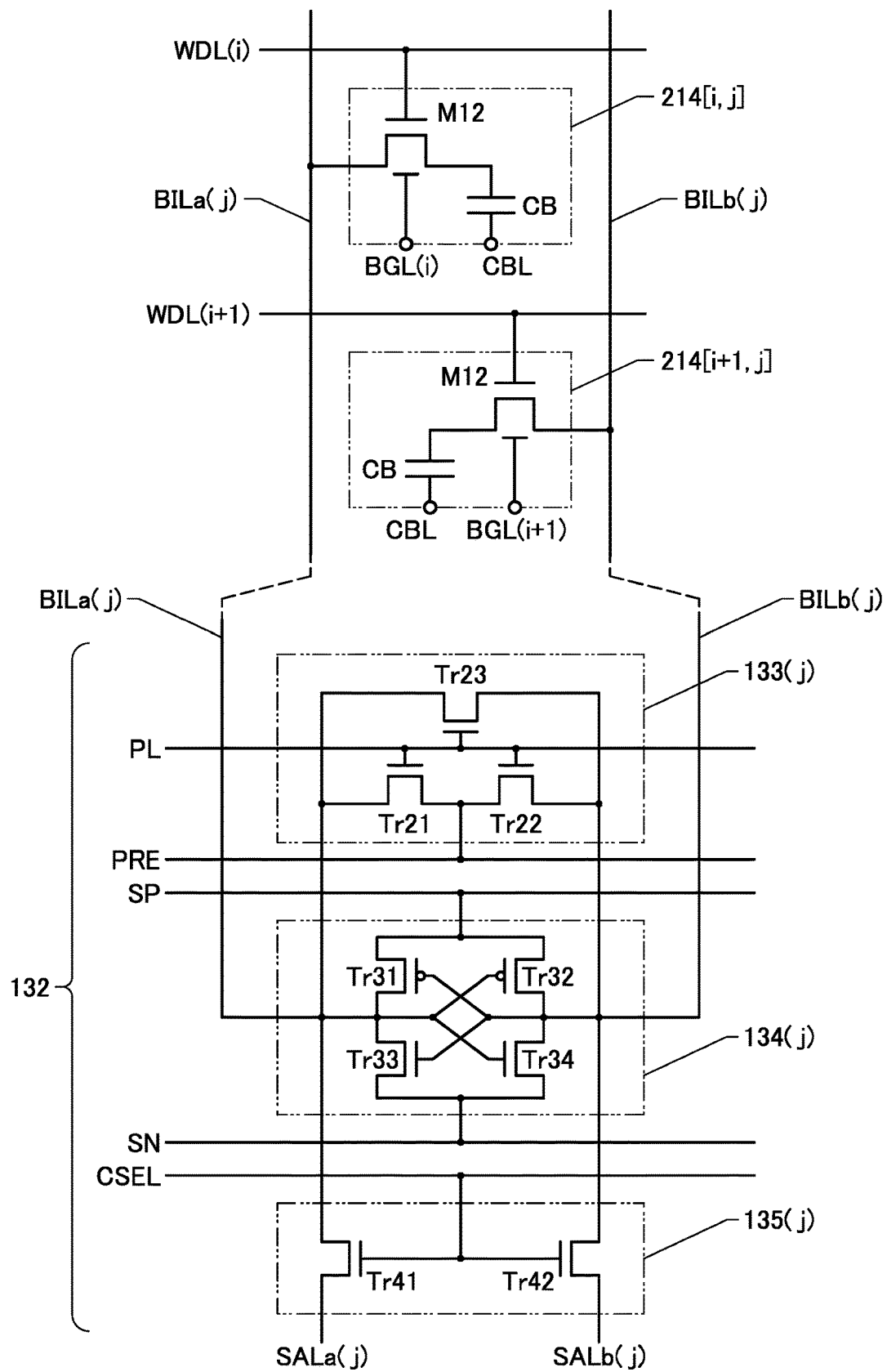
FIG. 8 is a diagram illustrating an example of a circuit configuration.

FIG. 8 illustrates a circuit structure example of the memory cells 214, the precharge circuit 133, the sense amplifier 134, and the input/output circuit 135 that are in the j-th column.

<The Precharge Circuit 133>

The precharge circuit 133(j) includes an n-channel transistor Tr21 to an n-channel transistor Tr23. Note that the transistor Tr21 to the transistor Tr23 may be p-channel transistors. One of a source and a drain of the transistor Tr21 is connected to a wiring BILa(j), and the other of the source and the drain is connected to a wiring PRE. One of a source and a drain of the transistor Tr22 is connected to the wiring BILb(j), and the other of the source and the drain is connected to the wiring PRE. One of a source and a drain of the transistor Tr23 is connected to the wiring BILa(j), and the other of the source and the drain is connected to the wiring BILb(j). A gate of the transistor Tr21, a gate of the transistor Tr22, and a gate of the transistor Tr23 are connected to the wiring PL. The precharge circuit 133(j) has a function of initializing the potentials of the wiring BILa(j) and the wiring BILb(j).

<The Sense Amplifier 134>

The sense amplifier 134(j) includes a p-channel transistor Tr31, a p-channel transistor Tr32, an n-channel transistor Tr33, and an n-channel transistor Tr34. One of a source and a drain of the transistor Tr31 is connected to a wiring SP, and the other of the source and the drain is connected to a gate of the transistor Tr32, a gate of the transistor Tr34, and the wiring BILa(j). One of a source and a drain of the transistor Tr33 is connected to the gate of the transistor Tr32, the gate of the transistor Tr34, and the wiring BILa(j) and the other of the source and the drain is connected to a wiring SN. One of a source and a drain of the transistor Tr32 is connected to the wiring SP, and the other of the source and the drain is connected to a gate of the transistor Tr31, a gate of the transistor Tr33, and the wiring BILb(j). One of a source and a drain of the transistor Tr34 is connected to the gate of the transistor Tr31, the gate of the transistor Tr33, and the wiring BILb(j), and the other of the source and the drain is connected to the wiring SN. The sense amplifier 134(j) has a function of amplifying potentials of the wirings BILa(j) and BILb(j). Note that the sense amplifier 134(j) functions as a latch sense amplifier.

<The Input/Output Circuit 135>

The input/output circuit 135(j) includes an n-channel transistor Tr41 and an n-channel transistor Tr42. Note that the transistor Tr41 and the transistor Tr42 may be p-channel transistors. One of a source and a drain of the transistor Tr41 is connected to the wiring BILa(j), and the other of the source and the drain is connected to a wiring SALa(j). One of a source and a drain of the transistor Tr42 is connected to the wiring BILb(j), and the other of the source and the drain is connected to a wiring SALb(j). A gate of the transistor Tr41 and a gate of the transistor Tr42 are connected to a wiring CSEL.

The input/output circuit 135(j) has a function of controlling the conduction state between the wiring BILa(j) and the wiring SALa(j) and the conduction state between the wiring BILb(j) and the wiring SALb(j) on the basis of a potential supplied to the wiring CSEL. That is, whether a potential is output to the wiring SALa(j) and the wiring SALb(j) can be selected by the input/output circuit 135(j).

The wiring SP, the wiring SN, the wiring CSEL, the wiring PRE, and the wiring PL have a function of transmitting a signal or a potential for controlling the operation of the precharge circuit 133, the sense amplifier 134, and the input/output circuit 135. The wiring SP, the wiring SN, the wiring CSEL, the wiring PRE, and the wiring PL are connected to the control logic circuit 151 illustrated in FIG. 1. The control logic circuit 151 has a function of supplying a control signal to the wiring SP, the wiring SN, the wiring CSEL, the wiring PRE, and the wiring PL.

<Operation Example>

Operation modes of the memory device 10 are described using a memory cell 214[i,j], the precharge circuit 133(j), the sense amplifier 134(j), and the input/output circuit 135(j) illustrated in FIG. 8. Furthermore, −3 V is supplied to a wiring BGL(i).

<Reading Mode>

First, an operation example of the sense amplifier 134(j) when data is read from the memory cell 214[i,j] is described with reference to a timing chart shown in FIG. 9.

[Period T11]

In Period T11, the precharge circuit 133(j) is operated, and the potentials of the wiring BILa(j) and the wiring BILb(j) are initialized. Specifically, the potential of the wiring PL is set to a high level (VH_PL) to bring the transistor Tr21 to the transistor Tr23 into an on state. Thus, a potential Vpre of the wiring PRE is supplied to the wiring BILa(j) and the wiring BILb(j). Note that the potential Vpre can be set to (VH_SP+VL_SN)/2, for example. VH_SP is a high-level potential supplied to the wiring SP, and VL_SN is a low-level potential supplied to the wiring SN.

Note that in Period T11, the potential of the wiring CSEL is at a low level (VL_CSEL), and the transistor Tr41 and the transistor Tr42 in the input/output circuit 135(j) are in an off state. In addition, the potential of the wiring WDL(i) is at a low level (VL_WDL), and the transistor M12 included in the memory cell 214[i,j] is in an off state. Similarly, although not illustrated in FIG. 9, the potential of a wiring WDL[i+1] is at a low level (VL_WDL), and the transistor M12 included in a memory cell 214[i+1,j] is in an off state. In addition, the potentials of the wiring SP and the wiring SN are the potential Vpre, and the sense amplifier 134(j) is in a halting state.

Note that VL_WDL is preferably a potential lower than VL_SN. Moreover, VL_WDL is preferably a potential lower than a potential obtained by subtracting Vth of the transistor M12 from VL_SN. In other words, in the case where VL_SN is a reference potential (0 V), VL_WDL is a negative potential (also referred to as a "minus potential" or a "negative bias").

A negative bias is supplied to the wiring WDL(i), whereby the transistor M12 can be brought into an off state more surely. A memory device whose data retention time is long even in a high-temperature environment, in particular, can be provided.

The transistor M12 can also be brought into an off state by supply of a negative bias to the wiring BGL(i). In particular, in the case where both of the wiring WDL(i) and the wiring BGL(i) are supplied with a negative bias, the same effect can be obtained with a smaller bias than in the case where only one of them is supplied with a negative bias. Moreover, electric field stress applied to the transistor M12 can be reduced, so that the transistor M12 can have higher reliability. Furthermore, the power consumption of the transistor M12 can be reduced. That is, the reliability of the memory device 10 can be increased, and the power consumption can be reduced.

[Period T12]

In Period T12, the potential of the wiring PL is set to a low level (VL_PL) to bring the transistor Tr21 to the transistor Tr23 into an off state. The wiring WDL(i) is selected. Specifically, the potential of the wiring WDL(i) is set to a high level (VH_WDL) to bring the transistor M12 included in the memory cell 214[i,j] into an on state. This establishes electrical continuity between the wiring BILa(j) and the capacitor CB through the transistor M12 in the memory cell 214[i,j], and the potential of the wiring BILa(j) changes in accordance with the amount of charge retained in the capacitor CB.

Here, VH_WDL is preferably a potential higher than VH_SP. Specifically, VH_WDL is preferably a potential higher than a potential obtained by adding Vth of the transistor M12 to VH_SP.

Figure 9:
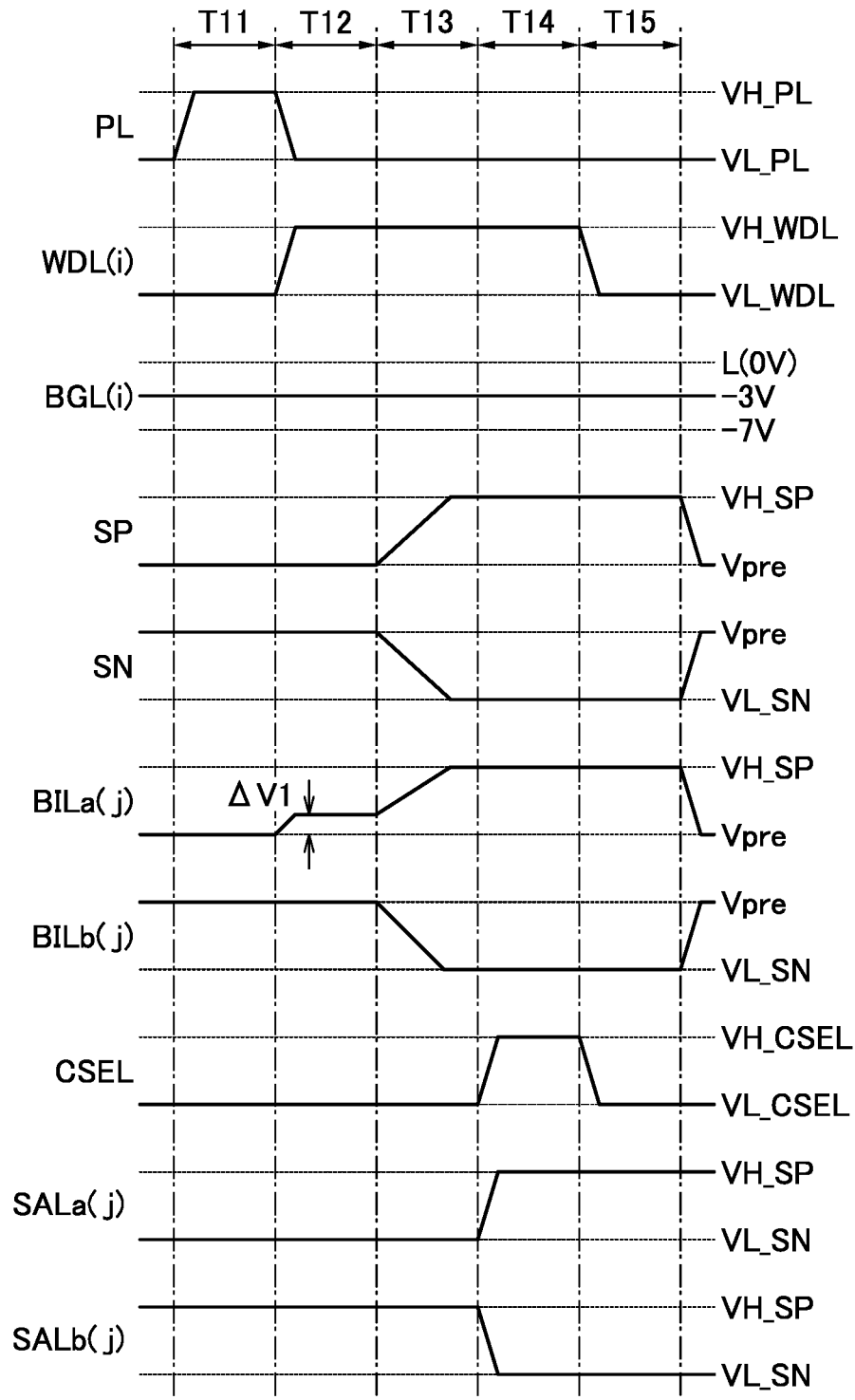
FIG. 9 is a timing chart showing an example of operation of a memory device.

FIG. 9 shows the case where data "1" is stored in the memory cell 214[i,j] and the amount of charge accumulated in the capacitor CB is large, as an example. Specifically, in the case where the amount of charge accumulated in the capacitor CB is large, the release of charge from the capacitor CB to the wiring BILa(j) increases the potential of the wiring BILa(j) from the potential Vpre by ΔV1. On the other hand, in the case where data "0" is stored in the memory cell 214[i,j] and the amount of charge accumulated in the capacitor CB is small, charge flows from the wiring BILa(j) to the capacitor CB, decreasing the potential of the wiring BILa(j) by ΔV2 (not illustrated).

Note that in Period T12, the potential of the wiring CSEL is at a low level (VL_CSEL), and the transistor Tr41 and the transistor Tr42 in the input/output circuit 135(j) are in an off state. In addition, the potentials of the wiring SP and the wiring SN are the potential Vpre, and the sense amplifier 134(j) remains in a halting state.

[Period T13]

In Period T13, the potential of the wiring SP is changed to a high level (VH_SP) and the potential of the wiring SN is changed to a low level (VL_SN). Thus, the sense amplifier 134(j) is in an operation state. The sense amplifier 134(j) has a function of amplifying a potential difference between the wiring BILa(j) and the wiring BILb(j) (ΔV1 in FIG. 9). Bringing the sense amplifier 134(j) into an operation state makes the potential of the wiring BILa(j) closer to the potential of the wiring SP (VH_SP) from Vpre+ΔV1. In addition, the potential of the wiring BILb(j) is made closer to the potential of the wiring SN (VL_SN) from Vpre.

Note that in the case where the potential of the wiring BILa(j) is Vpre−ΔV2 in the initial stage of Period T13, bringing the sense amplifier 134(j) into an operating state makes the potential of the wiring BILa(j) closer to the potential of the wiring SN (VL_SN) from Vpre−ΔV2. In addition, the potential of the wiring BILb(j) is made closer to the potential of the wiring SP (VH_SP) from the potential Vpre.

In Period T13, the potential of the wiring PL is at a low level (VL_PL), and the transistor Tr21 to the transistor Tr23 in the precharge circuit 133(j) are in an off state. In addition, the potential of the wiring CSEL is at a low level (VL_CSEL), and the transistor Tr41 and the transistor Tr42 in the input/output circuit 135(j) are in an off state. Furthermore, the potential of the wiring WDL(i) is at a high level (VH_WDL), and the transistor M12 included in the memory cell 214[i,j] is in an on state. Consequently, the amount of charge corresponding to the potential of the wiring BILa(j) (VH_SP) is accumulated in the capacitor CB in the memory cell 214[i,j].

[Period T14]

In Period T14, the potential of the wiring CSEL is controlled to bring the input/output circuit 135(j) into an on state. Specifically, the potential of the wiring CSEL is set to a high level (VH_CSEL) to bring the transistor Tr41 and the transistor Tr42 into an on state. Accordingly, the potential of the wiring BILa(j) is supplied to the wiring SALa(j), and the potential of the wiring BILb(j) is supplied to the wiring SALb(j).

Note that in Period T14, the potential of the wiring PL is at a low level (VL_PL), and the transistor Tr21 to the transistor Tr23 in the precharge circuit 133(j) are in an off state. In addition, the potential of the wiring WDL(i) is at a high level (VH_WDL), and the transistor M12 included in the memory cell 214[i,j] is in an on state. The potential of the wiring SP is at a high level (VH_SP), the potential of the wiring SN is at a low level (VL_SN), and the sense amplifier 134(j) is in an operation state. Consequently, charge corresponding to the potential of the wiring BILa(j) (VH_SP) is accumulated in the capacitor CB in the memory cell 214[i,j].

[Period T15]

In Period T15, the potential of the wiring CSEL is controlled to bring the input/output circuit 135(j) into an off state. Specifically, the potential of the wiring CSEL is set to a low level (VL_CSEL) to bring the transistor Tr41 and the transistor Tr42 into an off state.

In addition, in Period T15, VL_WDL is supplied to the wiring WDL(i) to bring the wiring WDL(i) into a non-selection state. Specifically, the potential of the wiring WDL(i) is set to a low level (VL_WDL). Consequently, the transistor included in the memory cell 214[i,j] is brought into an off state. Thus, the amount of charge corresponding to the potential of the wiring BILa(j) (VH_SP) is retained in the capacitor CB included in the memory cell 214[i,j]. Accordingly, data is retained in the memory cell 214[i,j] even after the data is read.

When VL_WDL supplied to the wiring WDL(i) is set to a negative potential, the transistor M12 can be brought into an off state more surely. A memory device whose data retention time is long even in a high-temperature environment, in particular, can be provided.

Note that in Period T15, even when the input/output circuit 135(j) is brought into an off state, in the case where the sense amplifier 134(j) is in an operation state, the potentials of the wiring BILa(j) and the wiring BILb(j) are retained by the sense amplifier 134(j). Therefore, the sense amplifier 134(j) has a function of temporarily retaining data that has been read from the memory cell 214M.

Through the operations described above, data can be read from the memory cell 214[i,j]. The read data is supplied to the output circuit 141 (see FIG. 1) through the wiring SALa(j) and/or the wiring SALb(j). Note that reading of data from the memory cell 214[i+1,j] can be performed in a manner similar to that of the memory cell 214[i,j].

<Writing Mode>

Figure 10:
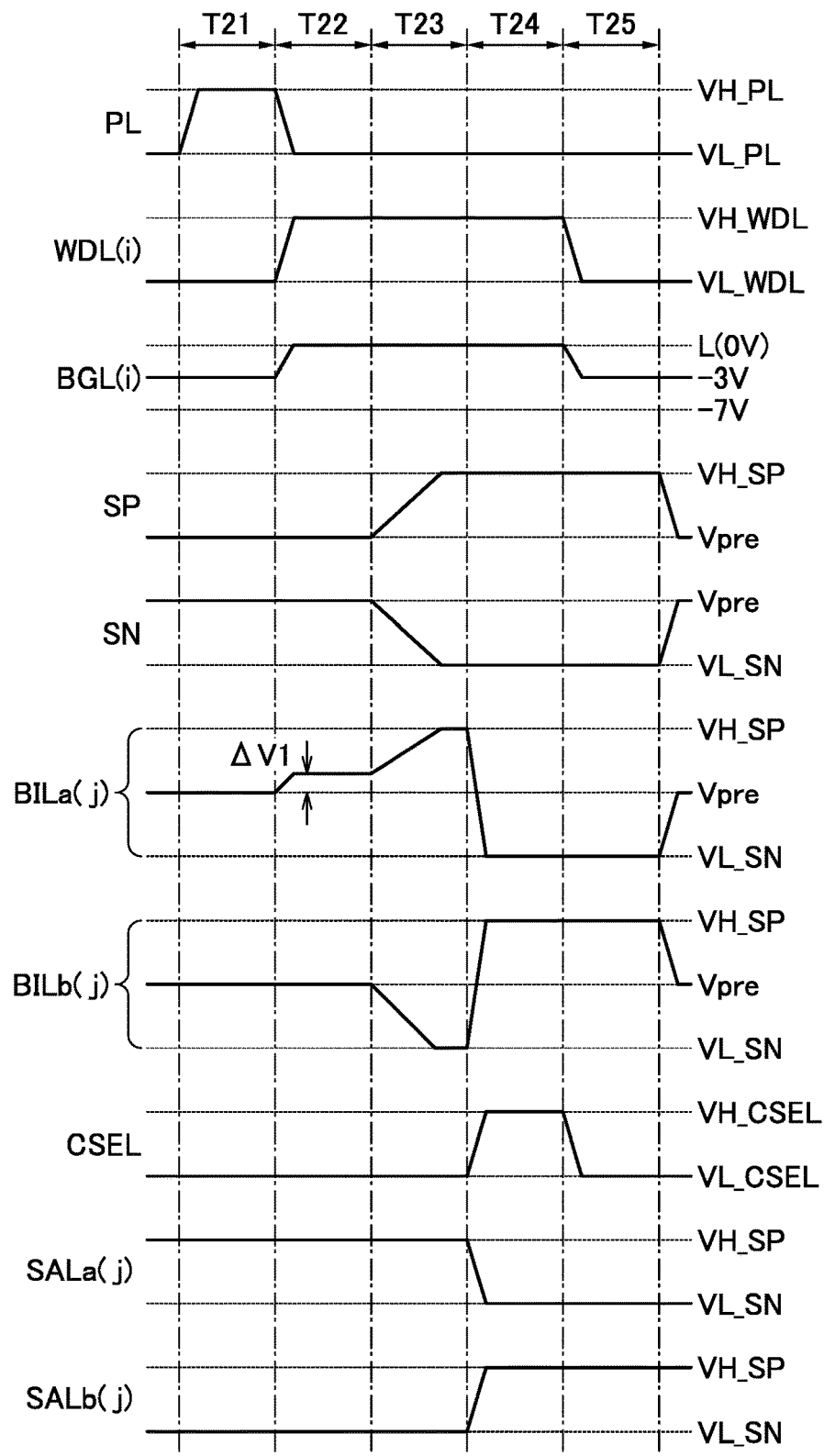
FIG. 10 is a timing chart showing an operation example of a memory device.

Next, an operation example of the sense amplifier 134(j) when data is written to the memory cell 214[i,j] is described with reference to a timing chart shown in FIG. 10. Data can be written to the memory cell 214[i+1,j] on the principle similar to that described above.

[Period T21]

In Period T21, the transistor Tr21 to the transistor Tr23 included in the precharge circuit 133(j) are brought into an on state, and the potentials of the wiring BILa(j) and the wiring BILb(j) are initialized. Specifically, the potential of the wiring PL is set to a high level (VH_PL) to bring the transistor Tr21 to the transistor Tr23 into an on state. Thus, the potential Vpre of the wiring PRE is supplied to the wiring BILa(j) and the wiring BILb(j). Note that the potential Vpre can be set to (VH_SP+VL_SN)/2, for example.
[Period T22]

After that, in Period T22, the potential of the wiring PL is set to a low level (VL_PL) to bring the transistor Tr21 to the transistor Tr23 into an off state. The wiring WDL(i) connected to the memory cell 214[i,j] to which data is written is selected. Specifically, the potential of the wiring WDL(i) is set to a high level (VH_WDL) to bring the transistor M12 included in the memory cell 214[i,j] into an on state. This establishes electrical continuity between the wiring BILa(j) and the capacitor CB through the transistor M12 in the memory cell 214[i,j].

Note that although a negative bias may be continuously supplied to the wiring BGL(i) while operation is performed in a writing mode, the potential of the wiring BGL(i) may be increased in accordance with the change of the potential of the wiring WDL(i) into VH_WDL. In FIG. 10, the potential of the wiring BGL(i) is set to an L potential (e.g., 0 V) in Period T22.

By increasing the potential of the wiring BGL(i) in accordance with the increase in the potential of the wiring WDL(i), the operating speed of the transistor M12 can be increased. Accordingly, the time needed for the writing operation can be reduced. Consequently, the operating speed of the memory device 10 can be increased.

In the case where both of the potentials of the wiring WDL(i) and the wiring BGL(i) are increased, the same writing speed can be achieved with a smaller potential increase than in the case where only one of the potentials is increased. Consequently, electric field stress applied to the transistor M12 can be reduced, so that the transistor M12 can have higher reliability. Furthermore, the power consumption of the transistor M12 can be reduced. That is, the reliability of the memory device 10 can be increased, and the power consumption can be reduced.

At this time, in the case where data "1" is already stored in the memory cell 214[i,j], the release of charge from the capacitor CB to the wiring BILa(j) increases the potential of the wiring BILa(j) from the potential Vpre by ΔV1.
[Period T23]

In Period T23, the potential of the wiring SP is set to a high level (VH_SP) and the potential of the wiring SN is set to a low level (VL_SN) to bring the sense amplifier 134(j) into an operation state.
[Period T24]

In Period T24, the potential of the wiring CSEL is controlled to bring the input/output circuit 135(j) into an on state. This establishes electrical continuity between the wiring BILa(j) and the wiring SALa(j) and electrical continuity between the wiring BILb(j) and the wiring SALb(j).

The data signal WDATA is supplied to the input/output circuit 135(j) through the wiring SALa(j) and the wiring SALb(j). By supplying a writing potential corresponding to the data signal WDATA to the wiring SALa(j) and the wiring SALb(j), the writing potential is supplied to the wiring BILa(j) and the wiring BILb(j) through the input/output circuit 135(j). For example, when data "0" is stored in the memory cell 214[i,j], a low level (VL_SN) is supplied to the wiring SALa(j) and a high level (VH_SP) is supplied to the wiring SALb(j).

Thus, the on/off state of the transistor Tr31 to the transistor Tr34 included in the sense amplifier 134(j) is inverted, the potential of the wiring SN (VL_SN) is supplied to the wiring BILa(j), and the potential of the wiring SP (VH_SP) is supplied to the wiring BILb(j). Accordingly, the amount of charge corresponding to the potential representing the data "0" (VL_SN) is accumulated in the capacitor CB. Through the operations described above, data can be written to the memory cell 214[i,j].
[Period T25]

In Period T25, VL_WDL is supplied to the wiring WDL(i) to bring the wiring WDL(i) into a non-selection state. Accordingly, charge written to the memory cell 214[i,j] is retained. In the case where the potential of the wiring BGL(i) is increased in accordance with the increase in potential of the wiring WDL(i), the potential of the wiring BGL(i) is decreased in accordance with the change of the potential of the wiring WDL(i) into VL_WDL. For example, −3 V is supplied to the wiring BGL(i).

In addition, the potential of the wiring CSEL is set to a low level (VL_CSEL) to bring the transistor Tr41 and the transistor Tr42 into an off state.

Note that after the potential of the wiring SALa(j) is supplied to the wiring BILa(j), the potentials of the wiring BILa(j) and the wiring BILb(j) are retained by the sense amplifier 134(j) as long as the sense amplifier 134(j) is in an operation state even when the transistor Tr41 and the transistor Tr42 are brought into an off state in the input/output circuit 135(j). Thus, the timing of switching the transistor Tr41 and the transistor Tr42 from an on state to an off state can be either before or after the wiring WDL(i) is selected.

Through the operations described above, data can be written to the memory cell 214[i,j]. Note that writing of data to the memory cell 214[i+1,j] can be performed in a manner similar to that of the memory cell 214[i,j].

When VL_WDL supplied to the wiring WDL(i) is set to a negative potential, the transistor M12 can be brought into an off state more surely. A memory device whose data retention time is long even in a high-temperature environment, in particular, can be provided.

<Refresh Mode>

In order to maintain data written to the memory cell 214[i,j], refresh operation (rewriting operation) is performed at regular intervals. An operation example of the sense amplifier 134(j) at refresh operation is described with reference to a timing chart shown in FIG. 11. Note that the refresh operation can be performed in the same principle as the above.
[Period T31]

In Period T31, the transistor Tr21 to the transistor Tr23 included in the precharge circuit 133(j) are brought into an on state, and the potentials of the wiring BILa(j) and the wiring BILb(j) are initialized. Specifically, the potential of the wiring PL is set to a high level (VH_PL) to bring the transistor Tr21 to the transistor Tr23 into an on state. Thus, a potential Vpre of the wiring PRE is supplied to the wiring BILa(j) and the wiring BILb(j).
[Period T32]

In Period T32, the potential of the wiring PL is set to a low level (VL_PL) to bring the transistor Tr21 to the transistor Tr23 into an off state. The wiring WDL(i) connected to the memory cell 214[i,j] to which data is written is selected. Specifically, the potential of the wiring WDL(i) is set to a high level (VH_WDL) to bring the transistor M12 included in the memory cell 214[i,j] into an on state. This establishes electrical continuity between the wiring BILa(j) and the capacitor CB through the transistor M12 in the memory cell 214[i,j].

Figure 11:
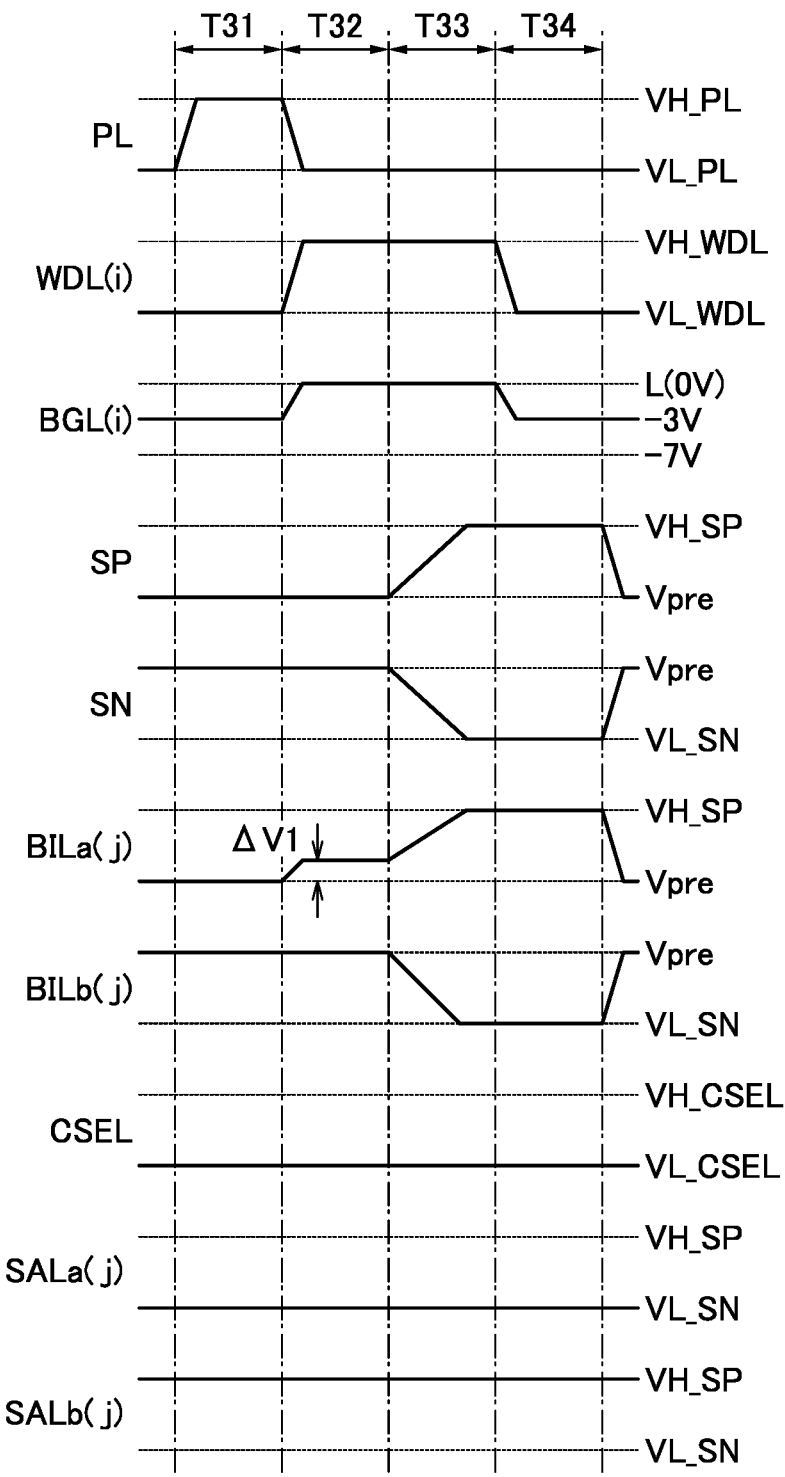
FIG. 11 is a timing chart showing an operation example of a memory device.

Note that although a negative bias may be continuously supplied to the wiring BGL(i) while operation is performed in a refresh mode, the potential of the wiring BGL(i) may be increased in accordance with the change of the potential of the wiring WDL(i) into VH_WDL. In FIG. 11, the potential of the wiring BGL(i) is set to an L potential (e.g., 0 V) in Period T32.

By increasing the potential of the wiring BGL(i) in accordance with the increase in the potential of the wiring WDL(i), the operating speed of the transistor M12 can be increased. Accordingly, the time needed for the refresh operation can be reduced. Consequently, the operating speed of the memory device 10 can be increased.

In the case where both of the potentials of the wiring WDL(i) and the wiring BGL(i) are increased, the same writing speed can be achieved with a smaller potential increase than in the case where only one of the potentials is increased. Consequently, electric field stress applied to the transistor M12 can be reduced, so that the transistor M12 can have higher reliability. Furthermore, the power consumption of the transistor M12 can be reduced.

At this time, in the case where data "1" is already stored in the memory cell 214[i,j], the release of charge from the capacitor CB to the wiring BILa(j) increases the potential of the wiring BILa(j) from the potential Vpre by ΔV1.

[Period T33]

In Period T33, the potential of the wiring SP is set to a high level (VH_SP) and the potential of the wiring SN is set to a low level (VL_SN) to bring the sense amplifier 134(j) into an operation state. Bringing the sense amplifier circuit 134(j) into an operation state makes the potential of the wiring BILa(j) closer to the potential of the wiring SP (VH_SP) from Vpre+ΔV1. In addition, the potential of the wiring BILb(j) is made closer to the potential of the wiring SN (VL_SN) from Vpre. Note that the time required for Period T33 is referred to as "writing time" in this specification and the like.

[Period T34]

In Period T34, VL_WDL is supplied to the wiring WDL (i) to bring the wiring WDL(i) into a non-selection state. Specifically, the potential of the wiring WDL(i) is set to a low level (VL_WDL) to bring the transistor included in the memory cell 214[i,j] into an off state. Thus, the amount of charge corresponding to the potential of the wiring BILa(j) (VH_SP) is retained in the capacitor CB included in the memory cell 214[i,j].

When VL_WDL is a negative potential, the transistor M12 can be brought into an off state more surely. A memory device whose data retention time is long even in a high-temperature environment, in particular, can be provided.

Furthermore, the potential of the wiring BGL(i) is decreased in accordance with the change of the potential of the wiring WDL(i) into VL_WDL. For example, −3 V is supplied to the wiring BGL(i).

Since data reading or writing is not performed in the refresh mode, the input/output circuit 135(j) remains in an off state. Thus, the refresh mode can be performed in a shorter period than the reading mode and the writing mode. Note that the refresh mode of the memory cell 214[i+1,j] can be performed in a manner similar to that of the memory cell 214[i,j].

Note that this embodiment can be implemented in combination with the other embodiments described in this specification as appropriate.

Embodiment 3

In this embodiment, a structure example of a transistor included in the memory device 10 described in the above embodiment is described. In this embodiment, a structure example of a memory device having a structure in which a layer including an OS transistor is provided above a layer including a Si transistor formed in a single crystal silicon substrate is described.

<Structure Example of Memory Device>

Figure 12:
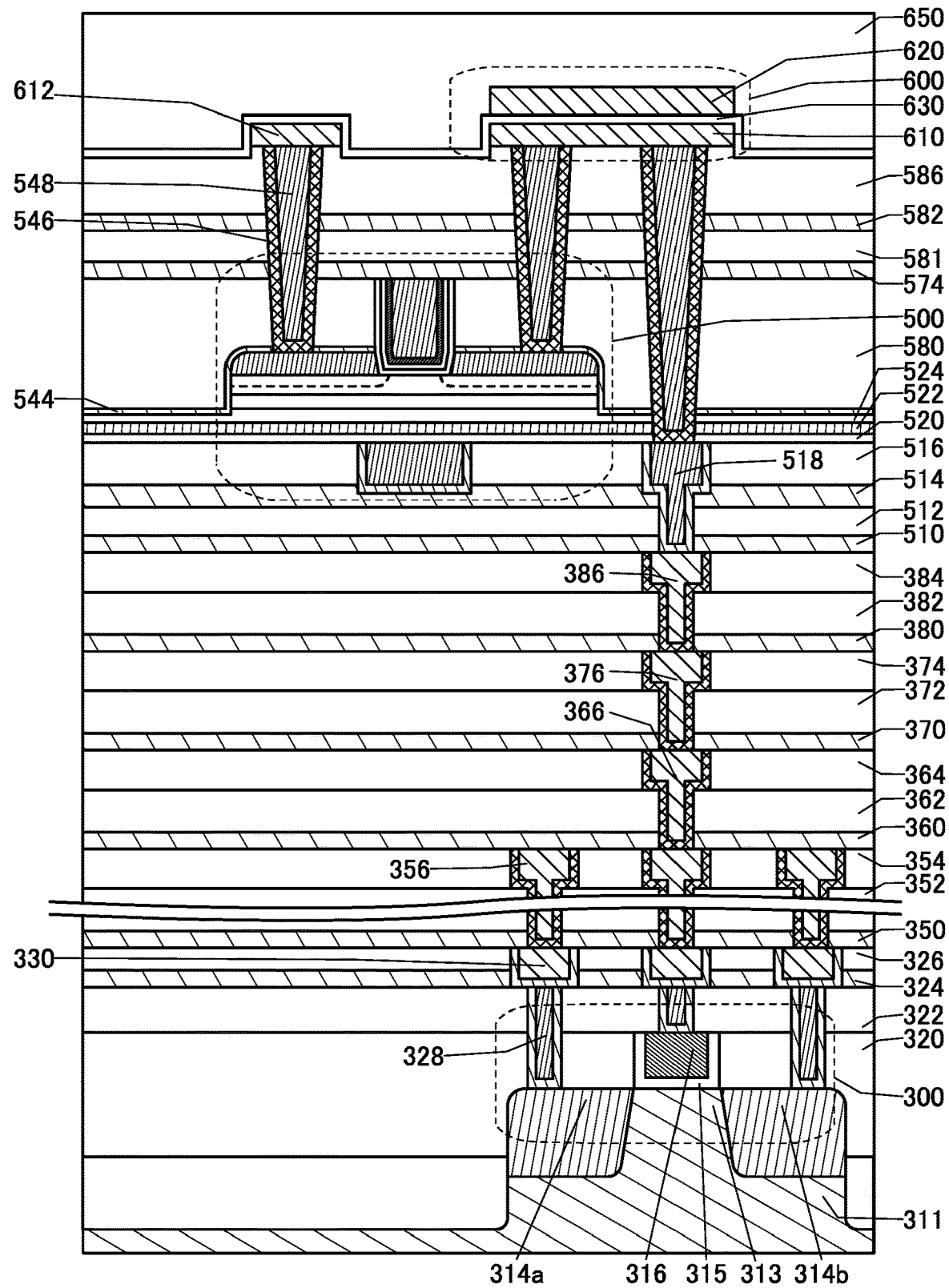
FIG. 12 is a cross-sectional view illustrating a structure example of a memory device.
Figure 13A:
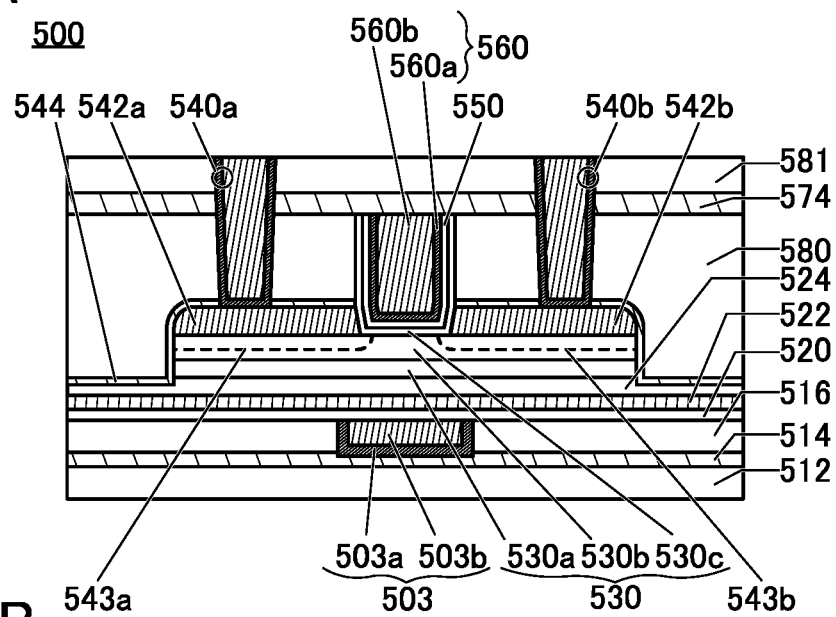
FIG. 13A, FIG. 13B, and FIG. 13C are cross-sectional views illustrating a structure example of a transistor.
Figure 13B:
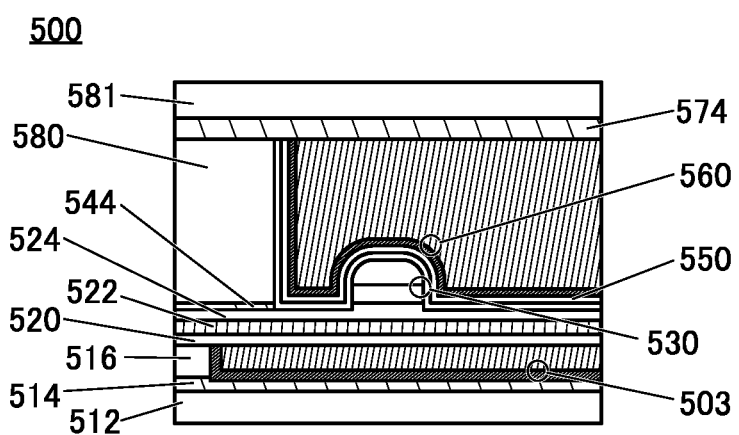
Figure 13C:
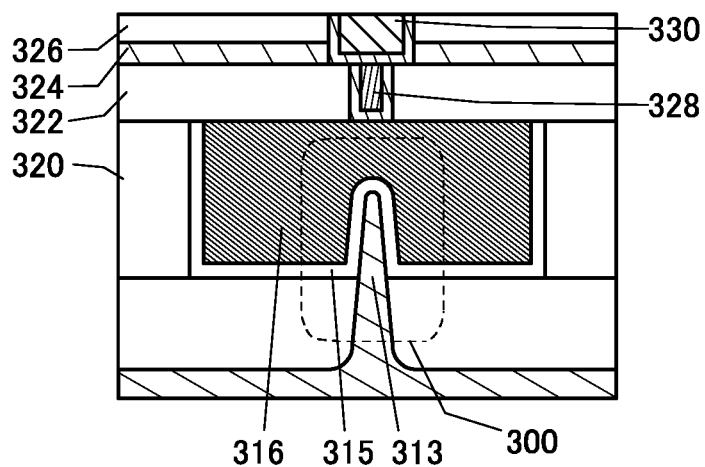

The memory device illustrated in FIG. 12 includes a transistor 300, a transistor 500, and a capacitor 600. FIG. 13A is a cross-sectional view of the transistor 500 in the channel length direction, FIG. 13B is a cross-sectional view of the transistor 500 in the channel width direction, and FIG. 13C is a cross-sectional view of the transistor 300 in the channel width direction.

The transistor 500 is a transistor including a metal oxide in its channel formation region (an OS transistor). The transistor 500 has the following features: a high voltage can be applied between a source and a drain, off-state current is less likely to be increased even in a high-temperature environment, and the ratio of on-state current to off-state current is high even in a high-temperature environment; therefore, in the above embodiment, the use of this transistor in the memory device 10 allows the memory device to have high reliability.

As illustrated in FIG. 12, in the memory device described in this embodiment, the transistor 500 is provided above the transistor 300, and the capacitor 600 is provided above the transistor 300 and the transistor 500.

The transistor 300 is provided on a substrate 311 and includes a conductor 316, an insulator 315, a semiconductor region 313 that is a part of the substrate 311, and a low-resistance region 314a and a low-resistance region 314b functioning as a source region and a drain region.

As illustrated in FIG. 13C, in the transistor 300, a top surface and a side surface in the channel width direction of the semiconductor region 313 are covered with the conductor 316 with the insulator 315 therebetween. Such a Fin-type transistor 300 can have an increased effective channel width, and thus the transistor 300 can have improved on-state characteristics. In addition, since contribution of an electric field of a gate electrode can be increased, the off-state characteristics of the transistor 300 can be improved.

Note that the transistor 300 can be either a p-channel transistor or an n-channel transistor.

It is preferable that a region of the semiconductor region 313 where a channel is formed, a region in the vicinity thereof, the low-resistance region 314a and the low-resistance region 314b functioning as the source region and the drain region, and the like contain a semiconductor such as a silicon-based semiconductor, further preferably single crystal silicon. Alternatively, these regions may be formed using a material containing Ge (germanium), SiGe (silicon germanium), GaAs (gallium arsenide), GaAlAs (gallium aluminum arsenide), or the like. A structure may be employed in which silicon whose effective mass is controlled by applying stress to the crystal lattice and changing the lattice spacing is used. Alternatively, the transistor 300 may be an HEMT (High Electron Mobility Transistor) with GaAs and GaAlAs, or the like.

The low-resistance region 314a and the low-resistance region 314b contain an element that imparts n-type conductivity, such as arsenic or phosphorus, or an element that imparts p-type conductivity, such as boron, in addition to the semiconductor material used for the semiconductor region 313.

The conductor 316 functioning as a gate electrode can be formed using a semiconductor material such as silicon containing an element that imparts n-type conductivity, such as arsenic or phosphorus, or an element that imparts p-type conductivity, such as boron, or using a conductive material such as a metal material, an alloy material, or a metal oxide material.

Note that since the work function of a conductor depends on a material of the conductor, Vth of the transistor can be adjusted by changing the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

Note that the transistor 300 shown in FIG. 12 is an example and is not limited to the structure shown therein; an appropriate transistor is used in accordance with a circuit configuration or a driving method.

An insulator 320, an insulator 322, an insulator 324, and an insulator 326 are stacked in this order to cover the transistor 300.

The insulator 320, the insulator 322, the insulator 324, and the insulator 326 can be formed using, for example, silicon oxide, silicon oxynitride, silicon nitride oxide, silicon nitride, aluminum oxide, aluminum oxynitride, aluminum nitride oxide, or aluminum nitride.

The insulator 322 may have a function of a planarization film for planarizing a level difference caused by the transistor 300 or the like provided below the insulator 322. For example, the top surface of the insulator 322 may be planarized by planarization treatment using a chemical mechanical polishing (CMP) method or the like to improve planarity.

The insulator 324 is preferably formed using a film having a barrier property that prevents diffusion of hydrogen or impurities from the substrate 311, the transistor 300, or the like into the region where the transistor 500 is provided.

For the film having a barrier property against hydrogen, silicon nitride formed by a CVD method can be used, for example. Here, diffusion of hydrogen to a semiconductor element including an oxide semiconductor, such as the transistor 500, degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

The amount of released hydrogen can be measured by thermal desorption spectroscopy (TDS), for example. The amount of hydrogen released from the insulator 324 that is converted into hydrogen atoms per area of the insulator 324 is less than or equal to $10\times10^{15}$ atoms/cm$^2$, preferably less than or equal to $5\times10^{15}$ atoms/cm$^2$, in the TDS analysis in a film-surface temperature range of 50° C. to 500° C., for example.

Note that the permittivity of the insulator 326 is preferably lower than that of the insulator 324. For example, the dielectric constant of the insulator 326 is preferably lower than 4, further preferably lower than 3. The dielectric constant of the insulator 326 is, for example, preferably 0.7 times or less, further preferably 0.6 times or less the dielectric constant of the insulator 324. When a material with a low dielectric constant is used for an interlayer film, the parasitic capacitance generated between wirings can be reduced.

A conductor 328, a conductor 330, and the like that are connected to the capacitor 600 or the transistor 500 are embedded in the insulator 320, the insulator 322, the insulator 324, and the insulator 326. Note that the conductor 328 and the conductor 330 have a function of a plug or a wiring.

A plurality of conductors functioning as plugs or wirings are collectively denoted by the same reference numeral in some cases. Moreover, in this specification and the like, a wiring and a plug connected to the wiring may be a single component. That is, there are cases where part of a conductor functions as a wiring and another part of the conductor functions as a plug.

As a material for each of plugs and wirings (the conductor 328, the conductor 330, and the like), a single layer or stacked layers of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, it is preferable to use a low-resistance conductive material such as aluminum or copper. The use of a low-resistance conductive material can reduce wiring resistance.

A wiring layer may be provided over the insulator 326 and the conductor 330. For example, in FIG. 12, an insulator 350, an insulator 352, and an insulator 354 are provided to be stacked in this order. Furthermore, a conductor 356 is formed in the insulator 350, the insulator 352, and the insulator 354. The conductor 356 has a function of a plug or a wiring that is connected to the transistor 300. Note that the conductor 356 can be provided using a material similar to those for the conductor 328 and the conductor 330.

For example, like the insulator 324, the insulator 350 is preferably formed using an insulator having a barrier property against hydrogen. The conductor 356 preferably contains a conductor having a barrier property against hydrogen. In particular, the conductor having a barrier property against hydrogen is formed in an opening portion of the insulator 350 having a barrier property against hydrogen. With this structure, the transistor 300 and the transistor 500 can be separated by the barrier layer, so that diffusion of hydrogen from the transistor 300 into the transistor 500 can be inhibited.

For the conductor having a barrier property against hydrogen, tantalum nitride is preferably used, for example. In addition, the use of a stack including tantalum nitride and tungsten, which has high conductivity, can inhibit diffusion of hydrogen from the transistor 300 while the conductivity of a wiring is maintained. In that case, a structure is preferable in which a tantalum nitride layer having a barrier property against hydrogen is in contact with the insulator 350 having a barrier property against hydrogen.

A wiring layer may be provided over the insulator 354 and the conductor 356. For example, in FIG. 12, an insulator 360, an insulator 362, and an insulator 364 are provided to be stacked in this order. Furthermore, a conductor 366 is formed in the insulator 360, the insulator 362, and the insulator 364. The conductor 366 has a function of a plug or a wiring. Note that the conductor 366 can be provided using a material similar to those for the conductor 328 and the conductor 330.

For example, like the insulator 324, the insulator 360 is preferably formed using an insulator having a barrier property against hydrogen. Furthermore, the conductor 366 preferably contains a conductor having a barrier property against hydrogen. In particular, the conductor having a barrier property against hydrogen is formed in an opening portion of the insulator 360 having a barrier property against hydrogen. With this structure, the transistor 300 and the transistor 500 can be separated by the barrier layer, so that diffusion of hydrogen from the transistor 300 into the transistor 500 can be inhibited.

A wiring layer may be provided over the insulator 364 and the conductor 366. For example, in FIG. 12, an insulator 370, an insulator 372, and an insulator 374 are provided to be stacked in this order. Furthermore, a conductor 376 is formed in the insulator 370, the insulator 372, and the insulator 374. The conductor 376 has a function of a plug or a wiring. Note that the conductor 376 can be provided using a material similar to those for the conductor 328 and the conductor 330.

For example, like the insulator 324, the insulator 370 is preferably formed using an insulator having a barrier property against hydrogen. Furthermore, the conductor 376 preferably contains a conductor having a barrier property against hydrogen. In particular, the conductor having a barrier property against hydrogen is formed in an opening portion of the insulator 370 having a barrier property against hydrogen. With this structure, the transistor 300 and the transistor 500 can be separated by the barrier layer, so that diffusion of hydrogen from the transistor 300 into the transistor 500 can be inhibited.

A wiring layer may be provided over the insulator 374 and the conductor 376. For example, in FIG. 12, an insulator 380, an insulator 382, and an insulator 384 are provided to be stacked in this order. Furthermore, a conductor 386 is formed in the insulator 380, the insulator 382, and the insulator 384. The conductor 386 has a function of a plug or a wiring. Note that the conductor 386 can be provided using a material similar to those for the conductor 328 and the conductor 330.

For example, like the insulator 324, the insulator 380 is preferably formed using an insulator having a barrier property against hydrogen. Furthermore, the conductor 386 preferably contains a conductor having a barrier property against hydrogen. In particular, the conductor having a barrier property against hydrogen is formed in an opening portion of the insulator 380 having a barrier property against hydrogen. With this structure, the transistor 300 and the transistor 500 can be separated by the barrier layer, so that diffusion of hydrogen from the transistor 300 into the transistor 500 can be inhibited.

Although the wiring layer including the conductor 356, the wiring layer including the conductor 366, the wiring layer including the conductor 376, and the wiring layer including the conductor 386 are described above, the memory device of this embodiment is not limited thereto. Three or less wiring layers that are similar to the wiring layer including the conductor 356 may be provided, or five or more wiring layers that are similar to the wiring layer including the conductor 356 may be provided.

An insulator 510, an insulator 512, an insulator 514, and an insulator 516 are provided to be stacked in this order over the insulator 384. A substance having a barrier property against oxygen or hydrogen is preferably used for any of the insulator 510, the insulator 512, the insulator 514, and the insulator 516.

For example, the insulator 510 and the insulator 514 are preferably formed using a film having a barrier property that prevents diffusion of hydrogen or impurities from the substrate 311, the region where the transistor 300 is provided, or the like into the region where the transistor 500 is provided. Thus, a material similar to that for the insulator 324 can be used.

For the film having a barrier property against hydrogen, silicon nitride formed by a CVD method can be used, for example. Here, diffusion of hydrogen to a semiconductor element including an oxide semiconductor, such as the transistor 500, degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

For the film having a barrier property against hydrogen used as the insulator 510 and the insulator 514, for example, a metal oxide such as aluminum oxide, hafnium oxide, or tantalum oxide is preferably used.

In particular, aluminum oxide has a high blocking effect that inhibits the passage of both oxygen and impurities such as hydrogen and moisture which are factors of a change in electrical characteristics of the transistor. Thus, aluminum oxide can prevent the entry of impurities such as hydrogen and moisture into the transistor 500 in the fabrication process and after the fabrication of the transistor. In addition, release of oxygen from the oxide included in the transistor 500 can be inhibited. Therefore, aluminum oxide is suitably used for a protective film of the transistor 500.

The insulator 512 and the insulator 516 can be formed using a material similar to that for the insulator 320, for example. When a material with a relatively low permittivity is used for the interlayer film, the parasitic capacitance between wirings can be reduced. Silicon oxide films, silicon oxynitride films, or the like can be used as the insulator 512 and the insulator 516, for example.

A conductor 518, a conductor included in the transistor 500 (a conductor 503), and the like are embedded in the insulator 510, the insulator 512, the insulator 514, and the insulator 516. Note that the conductor 518 has a function of a plug or a wiring that is connected to the capacitor 600 or the transistor 300. The conductor 518 can be provided using a material similar to those for the conductor 328 and the conductor 330.

In particular, the conductor 518 in a region in contact with the insulator 510 and the insulator 514 is preferably a conductor having a barrier property against oxygen, hydrogen, and water. With this structure, the transistor 300 and the transistor 500 can be separated by the layer having a barrier property against oxygen, hydrogen, and water; thus, the diffusion of hydrogen from the transistor 300 into the transistor 500 can be inhibited.

The transistor 500 is provided above the insulator 512.

As illustrated in FIG. 13A and FIG. 13B, the transistor 500 includes the conductor 503 positioned to be embedded in the insulator 514 and the insulator 516; an insulator 520 positioned over the insulator 516 and the conductor 503; an insulator 522 positioned over the insulator 520; an insulator 524 positioned over the insulator 522; an oxide 530a positioned over the insulator 524; an oxide 530b positioned over the oxide 530a; a conductor 542a and a conductor 542b positioned apart from each other over the oxide 530b; an insulator 580 that is positioned over the conductor 542a and the conductor 542b and is provided with an opening formed to overlap a region between the conductor 542a and the conductor 542b; a conductor 560 positioned in the opening; an insulator 550 positioned between the conductor 560 and the oxide 530b, the conductor 542a, the conductor 542b, and the insulator 580; and an oxide 530c positioned between the insulator 550 and the oxide 530b, the conductor 542a, the conductor 542b, and the insulator 580.

As illustrated in FIG. 13A and FIG. 13B, an insulator 544 is preferably positioned between the insulator 580 and the oxide 530a, the oxide 530b, the conductor 542a, and the conductor 542b. In addition, as illustrated in FIG. 13A and FIG. 13B, the conductor 560 preferably includes a conductor 560a provided inside the insulator 550 and a conductor 560b embedded inside the conductor 560a. As illustrated in FIG. 13A and FIG. 13B, an insulator 574 is preferably positioned over the insulator 580, the conductor 560, and the insulator 550.

Hereinafter, the oxide 530a, the oxide 530b, and the oxide 530c may be collectively referred to as an oxide 530. The conductor 542a and the conductor 542b may be collectively referred to as a conductor 542.

Note that the transistor 500 having a structure in which three layers of the oxide 530a, the oxide 530b, and the oxide 530c are stacked in the region where the channel is formed and its vicinity is illustrated; however, the present invention is not limited thereto. For example, a single layer of the oxide 530b, a two-layer structure of the oxide 530b and the oxide 530a, a two-layer structure of the oxide 530b and the oxide 530c, or a stacked-layer structure of four or more layers may be employed. Furthermore, although the conductor 560 having a stacked-layer structure of two layers in the transistor 500 is illustrated, the present invention is not limited thereto. For example, the conductor 560 may have a single-layer structure or a stacked-layer structure of three or more layers. The transistor 500 illustrated in FIG. 12, FIG. 13A, and FIG. 13B is an example, and the structure is not limited thereto; an appropriate transistor can be used in accordance with a circuit configuration or a driving method.

Here, the conductor 560 functions as a gate electrode of the transistor, and the conductor 542a and the conductor 542b function as a source electrode and a drain electrode. As described above, the conductor 560 is formed to be embedded in the opening of the insulator 580 and the region between the conductor 542a and the conductor 542b. The positions of the conductor 560, the conductor 542a, and the conductor 542b are selected in a self-aligned manner with respect to the opening of the insulator 580. That is, in the transistor 500, the gate electrode can be positioned between the source electrode and the drain electrode in a self-aligned manner. Thus, the conductor 560 can be formed without an alignment margin, resulting in a reduction in the area occupied by the transistor 500. Accordingly, miniaturization and high integration of the memory device can be achieved.

In addition, since the conductor 560 is formed in the region between the conductor 542a and the conductor 542b in a self-aligned manner, the conductor 560 does not include a region overlapping the conductor 542a or the conductor 542b. Thus, parasitic capacitance formed between the conductor 560 and each of the conductor 542a and the conductor 542b can be reduced. As a result, the switching speed of the transistor 500 can be improved, and the transistor 500 can have high frequency characteristics.

The conductor 560 sometimes functions as a first gate (also referred to as top gate) electrode. In addition, the conductor 503 sometimes functions as a second gate (also referred to as bottom gate) electrode. In that case, Vth of the transistor 500 can be controlled by changing a potential applied to the conductor 503 independently of a potential applied to the conductor 560. In particular, Vth of the transistor 500 can be higher than 0 V and the off-state current can be reduced by applying a negative potential to the conductor 503. Thus, a drain current at the time when a potential applied to the conductor 560 is 0 V can be lower in the case where a negative potential is applied to the conductor 503 than in the case where a negative potential is not applied to the conductor 503.

The conductor 503 is positioned to be overlapped by the oxide 530 and the conductor 560. Thus, when potentials are applied to the conductor 560 and the conductor 503, an electric field generated from the conductor 560 and an electric field generated from the conductor 503 are connected, so that the channel formation region formed in the oxide 530 can be covered. In this specification and the like, a transistor structure in which a channel formation region is electrically surrounded by electric fields of a first gate electrode and a second gate electrode is referred to as a surrounded channel (S-channel) structure.

Furthermore, in this specification and the like, the S-channel structure has a feature that the side surface and the vicinity of the oxide 530 in contact with the conductor 542a and the conductor 542b functioning as the source electrode and the drain electrode are of i-type like the channel formation region. The side surface and the vicinity of the oxide 530 in contact with the conductor 542a and the conductor 542b are in contact with the insulator 544 and thus can be of i-type like the channel formation region. Note that in this specification and the like, "i-type" can be equated with "highly purified intrinsic" to be described later. The S-channel structure disclosed in this specification and the like is different from a Fin-type structure and a planar structure. With the S-channel structure, resistance to a short-channel effect can be enhanced, that is, a transistor in which a short-channel effect is less likely to occur can be provided.

The conductor 503 has a structure similar to that of the conductor 518; a conductor 503a is formed in contact with an inner wall of an opening in the insulator 514 and the insulator 516, and a conductor 503b is formed on the inner side.

The insulator 520, the insulator 522, the insulator 524, and the insulator 550 each have a function of a gate insulating film.

Here, as the insulator 524 in contact with the oxide 530, an insulator that contains oxygen more than oxygen in the stoichiometric composition is preferably used. That is, an excess-oxygen region is preferably formed in the insulator 524. When such an insulator containing excess oxygen is provided in contact with the oxide 530, oxygen vacancies in the oxide 530 can be reduced and the reliability of the transistor 500 can be improved.

As the insulator including an excess-oxygen region, specifically, an oxide material from which part of oxygen is released by heating is preferably used. An oxide from which oxygen is released by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS analysis. Note that the temperature of the film surface in the TDS analysis is preferably within the range of 100° C. to 700° C., or 100° C. to 400° C.

When the insulator 524 includes an excess-oxygen region, it is preferable that the insulator 522 have a function of inhibiting diffusion of oxygen (e.g., oxygen atoms and oxygen molecules) (or that the above oxygen be less likely to pass through the insulator 522).

When the insulator 522 has a function of inhibiting diffusion of oxygen or impurities, oxygen contained in the oxide 530 is not diffused to the insulator 520 side, which is preferable. Furthermore, the conductor 503 can be inhibited from reacting with oxygen contained in the insulator 524 or the oxide 530.

For example, the insulator 522 is preferably formed using a single layer or stacked layers of an insulator containing what is called a high-k material such as aluminum oxide, hafnium oxide, tantalum oxide, zirconium oxide, lead zirconate titanate (PZT), strontium titanate (SrTiO$_3$), (Ba,Sr)

TiO$_3$ (BST), or the like. With miniaturization and high integration of transistors, a problem such as leakage current may arise because of a thinner gate insulating film. When a high-k material is used for the insulator functioning as the gate insulating film, a gate potential at the time when the transistor operates can be reduced while the physical thickness is maintained.

It is particularly preferable to use an insulator containing an oxide of one or both of aluminum and hafnium, which is an insulating material having a function of inhibiting diffusion of impurities, oxygen, and the like (through which the above oxygen is less likely to pass). As the insulator containing an oxide of one or both of aluminum and hafnium, aluminum oxide, hafnium oxide, an oxide containing aluminum and hafnium (hafnium aluminate), or the like is preferably used. In the case where the insulator 522 is formed using such a material, the insulator 522 functions as a layer that inhibits release of oxygen from the oxide 530 and mixing of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

It is preferable that the insulator 520 be thermally stable. For example, silicon oxide and silicon oxynitride, which have thermal stability, are preferable. Furthermore, when an insulator that is a high-k material is combined with silicon oxide or silicon oxynitride, the insulator 520 having a stacked-layer structure that has thermal stability and a high dielectric constant can be obtained.

Note that the insulator 520, the insulator 522, and the insulator 524 may each have a stacked-layer structure of two or more layers. In such cases, without limitation to a stacked-layer structure formed of the same material, a stacked-layer structure formed of different materials may be employed.

In the transistor 500, a metal oxide functioning as an oxide semiconductor is preferably used as the oxide 530 including the channel formation region. For example, as the oxide 530, a metal oxide such as an In-M-Zn oxide (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used. Furthermore, as the oxide 530, an In—Ga oxide or an In—Zn oxide may be used.

Furthermore, a metal oxide with a low carrier density is preferably used in the transistor 500. In order to reduce the carrier density of the metal oxide, the concentration of impurities in the metal oxide is reduced so that the density of defect states can be reduced. In this specification and the like, a state with a low impurity concentration and a low density of defect states is referred to as a highly purified intrinsic or substantially highly purified intrinsic state. Examples of impurities in a metal oxide include hydrogen, nitrogen, alkali metal, alkaline earth metal, iron, nickel, and silicon.

In particular, hydrogen contained in a metal oxide reacts with oxygen bonded to a metal atom to be water, and thus forms oxygen vacancies in the metal oxide in some cases. If the channel formation region in the metal oxide includes oxygen vacancies, the transistor sometimes has normally-on characteristics. In some cases, a defect that is an oxygen vacancy into which hydrogen has entered functions as a donor and generates an electron serving as a carrier. In other cases, bonding of part of hydrogen to oxygen bonded to a metal atom generates electrons serving as carriers. Thus, a transistor using a metal oxide containing a large amount of hydrogen is likely to have normally-on characteristics.

A defect that is an oxygen vacancy into which hydrogen has entered can function as a donor of a metal oxide. However, it is difficult to evaluate the defects quantitatively. Thus, the metal oxide is sometimes evaluated by not its donor concentration but its carrier density. Therefore, in this specification and the like, as the parameter of the metal oxide, the carrier density assuming the state where an electric field is not applied is sometimes used instead of the donor concentration. That is, "carrier density" in this specification and the like can be replaced with "donor concentration" in some cases.

Consequently, when a metal oxide is used for the oxide 530, hydrogen in the metal oxide is preferably reduced as much as possible. Specifically, the hydrogen concentration of the metal oxide, which is measured by secondary ion mass spectrometry (SIMS), is lower than $1 \times 10^{20}$ atoms/cm$^3$, preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$. When a metal oxide with a sufficiently low concentration of impurities such as hydrogen is used for a channel formation region of a transistor, the transistor can have stable electrical characteristics.

When a metal oxide is used for the oxide 530, the carrier density of the metal oxide in the channel formation region is preferably lower than or equal to $1 \times 10^{18}$ cm$^{-3}$, further preferably lower than $1 \times 10^{17}$ cm$^{-3}$, still further preferably lower than $1 \times 10^{16}$ cm$^{-3}$, yet further preferably lower than $1 \times 10^{13}$ cm$^{-3}$, yet still further preferably lower than $1 \times 10^{12}$ cm$^{-3}$. Note that the lower limit of the carrier density of the metal oxide in the channel formation region is not particularly limited and can be, for example, $1 \times 10^{-9}$ cm$^{-3}$.

When a metal oxide is used for the oxide 530, contact between the conductor 542 (the conductor 542$a$ and the conductor 542$b$) and the oxide 530 may make oxygen in the oxide 530 diffuse into the conductor 542, resulting in oxidation of the conductor 542. It is highly possible that oxidation of the conductor 542 lowers the conductivity of the conductor 542. Note that diffusion of oxygen in the oxide 530 into the conductor 542 can be interpreted as absorption of oxygen in the oxide 530 by the conductor 542.

When oxygen in the oxide 530 is diffused into the conductor 542 (the conductor 542$a$ and the conductor 542$b$), a layer is sometimes formed between the conductor 542$a$ and the oxide 530$b$, and between the conductor 542$b$ and the oxide 530$b$. The layer contains more oxygen than the conductor 542 does, and thus presumably has an insulating property. In this case, a three-layer structure of the conductor 542, the layer, and the oxide 530$b$ can be regarded as a three-layer structure of a metal, an insulator, and a semiconductor and is sometimes referred to as a MIS (Metal-Insulator-Semiconductor) structure or a diode junction structure having a MIS structure as its main part.

The above layer is not necessarily formed between the conductor 542 and the oxide 530$b$, but the layer may be formed between the conductor 542 and the oxide 530$c$, or formed between the conductor 542 and the oxide 530$b$ and between the conductor 542 and the oxide 530$c$.

The metal oxide functioning as the channel formation region in the oxide 530 has a bandgap of preferably 2 eV or larger, further preferably 2.5 eV or larger. With the use of a metal oxide having such a wide bandgap, the off-state current of the transistor can be reduced.

Semiconductor materials that can be used for the oxide 530 are not limited to the above metal oxides. A semiconductor material having a bandgap (a semiconductor material that is not a zero-gap semiconductor) can be used for the oxide 530. For example, a single element semiconductor such as silicon, a compound semiconductor such as gallium arsenide, or a layered material (also referred to as an atomic layered material or a two-dimensional material) is preferably used as a semiconductor material. In particular, a layered material functioning as a semiconductor is preferably used as a semiconductor material.

Here, in this specification and the like, the layered material is a general term of a group of materials having a layered crystal structure. In the layered crystal structure, layers formed by covalent bonding or ionic bonding are stacked with bonding such as the Van der Waals force, which is weaker than covalent bonding or ionic bonding. The layered material has high electrical conductivity in a monolayer, that is, function as a semiconductor having high two-dimensional electrical conductivity, and when a material having high two-dimensional electrical conductivity is used for a channel formation region, a transistor having a high on-state current can be provided.

Examples of the layered material include graphene, silicene, and chalcogenide. Chalcogenide is a compound containing chalcogen. Chalcogen is a general term of elements belonging to Group 16, which includes oxygen, sulfur, selenium, tellurium, polonium, and livermorium. Examples of chalcogenide include transition metal chalcogenide and chalcogenide of Group 13 elements.

As the oxide 530, a transition metal chalcogenide functioning as a semiconductor is preferably used, for example. Specific examples of the transition metal chalcogenide which can be used for the oxide 530 include molybdenum sulfide (typically $MoS_2$), molybdenum selenide (typically $MoSe_2$), molybdenum telluride (typically $MoTe_2$), tungsten sulfide ($WS_2$), tungsten selenide (typically $WSe_2$), tungsten telluride (typically $WTe_2$), hafnium sulfide ($HfS_2$), hafnium selenide ($HfSe_2$), zirconium sulfide ($ZrS_2$), and zirconium selenide ($ZrSe_2$).

When the oxide 530 includes the oxide 530a under the oxide 530b, it is possible to inhibit diffusion of impurities into the oxide 530b from the components formed below the oxide 530a. Moreover, including the oxide 530c over the oxide 530b makes it possible to inhibit diffusion of impurities into the oxide 530b from the components formed above the oxide 530c.

Note that the oxide 530 preferably has a stacked-layer structure of a plurality of oxide layers that differ in the atomic ratio of metal atoms. Specifically, the atomic proportion of the element M in the constituent elements in the metal oxide used as the oxide 530a is preferably higher than the atomic proportion of the element M in the constituent elements in the metal oxide used as the oxide 530b. In addition, the atomic ratio of the element M to In in the metal oxide used as the oxide 530a is preferably higher than the atomic ratio of the element M to In in the metal oxide used as the oxide 530b. Furthermore, the atomic ratio of In to the element M in the metal oxide used as the oxide 530b is preferably higher than the atomic ratio of In to the element M in the metal oxide used as the oxide 530a. A metal oxide that can be used as the oxide 530a or the oxide 530b can be used as the oxide 530c.

The energy of the conduction band minimum of each of the oxide 530a and the oxide 530c is preferably higher than the energy of the conduction band minimum of the oxide 530b. In other words, the electron affinity of each of the oxide 530a and the oxide 530c is preferably smaller than the electron affinity of the oxide 530b.

The energy level of the conduction band minimum gradually changes at junction portions of the oxide 530a, the oxide 530b, and the oxide 530c. In other words, the energy level of the conduction band minimum at the junction portions of the oxide 530a, the oxide 530b, and the oxide 530c continuously changes or is continuously connected. To obtain this, the density of defect states in a mixed layer formed at the interface between the oxide 530a and the oxide 530b and the interface between the oxide 530b and the oxide 530c is preferably made low.

Specifically, when the oxide 530a and the oxide 530b or the oxide 530b and the oxide 530c contain a common element (as a main component) in addition to oxygen, a mixed layer with a low density of defect states can be formed. For example, in the case where the oxide 530b is an In—Ga—Zn oxide, an In—Ga—Zn oxide, a Ga—Zn oxide, gallium oxide, or the like is preferably used as the oxide 530a and the oxide 530c.

At this time, the oxide 530b serves as a main carrier path. When the oxide 530a and the oxide 530c have the above structure, the density of defect states at the interface between the oxide 530a and the oxide 530b and the interface between the oxide 530b and the oxide 530c can be made low. Thus, the influence of interface scattering on carrier conduction is small, and the transistor 500 can have a high on-state current.

The conductor 542 (the conductor 542a and the conductor 542b) functioning as the source electrode and the drain electrode is provided over the oxide 530b. For the conductor 542, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that maintain their conductivity even after absorbing oxygen.

As illustrated in FIG. 13A, a region 543 (a region 543a and a region 543b) is sometimes formed as a low-resistance region at and near the interface between the oxide 530 and the conductor 542. In that case, the region 543a functions as one of a source region and a drain region, and the region 543b functions as the other of the source region and the drain region. Furthermore, the channel formation region is formed in a region between the region 543a and the region 543b.

When the conductor 542 is provided in contact with the oxide 530, the oxygen concentration in the region 543 sometimes decreases. In addition, a metal compound layer that contains the metal contained in the conductor 542 and the component of the oxide 530 is sometimes formed in the region 543. In such a case, the carrier density of the region 543 increases, and the region 543 becomes a low-resistance region.

The insulator 544 is provided to cover the conductor 542 and inhibits oxidation of the conductor 542. At this time, the insulator 544 may be provided to cover a side surface of the oxide 530 and to be in contact with the insulator 524.

A metal oxide containing one or more kinds selected from hafnium, aluminum, gallium, yttrium, zirconium, tungsten, titanium, tantalum, nickel, germanium, magnesium, and the like can be used as the insulator 544.

For the insulator 544, it is particularly preferable to use an insulator containing an oxide of one or both of aluminum and hafnium, for example, aluminum oxide, hafnium oxide, or an oxide containing aluminum and hafnium (hafnium aluminate). In particular, hafnium aluminate has higher heat resistance than a hafnium oxide film. Therefore, hafnium aluminate is preferable because it is less likely to be crystallized by heat treatment in a later step. Note that the insulator 544 is not an essential component when the conductor 542 is an oxidation-resistant material or does not significantly lose its conductivity even after absorbing oxygen. Design is appropriately set in consideration of required transistor characteristics.

The insulator 550 functions as a gate insulating film. The insulator 550 is preferably positioned in contact with the inner side (the top surface and the side surface) of the oxide 530c. The insulator 550 is preferably formed using an insulator from which oxygen is released by heating. For example, the insulator 550 is an oxide film in which the amount of released oxygen converted into oxygen atoms is greater than or equal to $1.0\times10^{18}$ atoms/cm$^3$, preferably greater than or equal to $1.0\times10^{19}$ atoms/cm$^3$, further preferably greater than or equal to $2.0\times10^{19}$ atoms/cm$^3$ or greater than or equal to $3.0\times10^{20}$ atoms/cm$^3$ in TDS analysis. Note that the temperature of the film surface in the TDS analysis is preferably within the range of 100° C. to 700° C.

Specifically, silicon oxide containing excess oxygen, silicon oxynitride, silicon nitride oxide, silicon nitride, silicon oxide to which fluorine is added, silicon oxide to which carbon is added, silicon oxide to which carbon and nitrogen are added, porous silicon oxide, or the like can be used. In particular, silicon oxide and silicon oxynitride, which have thermal stability, are preferable.

When an insulator from which oxygen is released by heating is provided as the insulator 550 in contact with the top surface of the oxide 530c, oxygen can be effectively supplied from the insulator 550 to the channel formation region of the oxide 530b through the oxide 530c. Furthermore, as in the insulator 524, the concentration of impurities such as water or hydrogen in the insulator 550 is preferably reduced. The thickness of the insulator 550 is preferably greater than or equal to 1 nm and less than or equal to 20 nm.

To efficiently supply excess oxygen contained in the insulator 550 to the oxide 530, a metal oxide may be provided between the insulator 550 and the conductor 560. The metal oxide preferably inhibits diffusion of oxygen from the insulator 550 to the conductor 560. Providing the metal oxide that inhibits diffusion of oxygen inhibits diffusion of excess oxygen from the insulator 550 to the conductor 560. That is, a reduction in the amount of excess oxygen supplied to the oxide 530 can be inhibited. Moreover, oxidation of the conductor 560 due to excess oxygen can be inhibited. For the metal oxide, a material that can be used for the insulator 544 is used.

Although the conductor 560 functioning as the first gate electrode and having a two-layer structure is illustrated in FIG. 13A and FIG. 13B, the conductor 560 may have a single-layer structure or a stacked-layer structure of three or more layers.

For the conductor 560a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Alternatively, it is preferable to use a conductive material having a function of inhibiting diffusion of oxygen (e.g., at least one of an oxygen atom, an oxygen molecule, and the like). When the conductor 560a has a function of inhibiting diffusion of oxygen, it is possible to inhibit a reduction in conductivity of the conductor 560b due to oxidation caused by oxygen contained in the insulator 550. As a conductive material having a function of inhibiting diffusion of oxygen, for example, tantalum, tantalum nitride, ruthenium, ruthenium oxide, or the like is preferably used.

The conductor 560b is preferably formed using a conductive material containing tungsten, copper, or aluminum as its main component. Furthermore, the conductor 560b also functions as a wiring and thus is preferably a conductor having high conductivity. For example, a conductive material containing tungsten, copper, or aluminum as its main component can be used. The conductor 560b can have a stacked-layer structure, for example, a stacked-layer structure of any of the above conductive materials and titanium or titanium nitride.

The insulator 580 is provided over the conductor 542 with the insulator 544 therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. In particular, silicon oxide and silicon oxynitride, which have thermal stability, are preferable. In particular, silicon oxide and porous silicon oxide are preferable because an excess-oxygen region can be easily formed in a later step.

When the insulator 580 from which oxygen is released by heating is provided in contact with the oxide 530c, oxygen in the insulator 580 can be efficiently supplied to the oxide 530b through the oxide 530c. Note that the concentration of impurities such as water or hydrogen in the insulator 580 is preferably reduced.

The opening in the insulator 580 is formed to overlap the region between the conductor 542a and the conductor 542b. Accordingly, the conductor 560 is formed to be embedded in the opening in the insulator 580 and the region between the conductor 542a and the conductor 542b.

The gate length needs to be short for miniaturization of the memory device, but it is necessary to prevent a reduction in conductivity of the conductor 560. When the conductor 560 is made thick to achieve this, the conductor 560 might have a shape with a high aspect ratio. In this embodiment, the conductor 560 is provided to be embedded in the opening in the insulator 580; thus, even when the conductor 560 has a shape with a high aspect ratio, the conductor 560 can be formed without collapsing during the process.

The insulator 574 is preferably provided in contact with the top surface of the insulator 580, the top surface of the conductor 560, and the top surface of the insulator 550. When the insulator 574 is deposited by a sputtering method, an excess-oxygen region can be provided in the insulator 550 and the insulator 580. Thus, oxygen can be supplied from the excess-oxygen region to the oxide 530.

As the insulator 574, a metal oxide containing one or more kinds selected from hafnium, aluminum, gallium, yttrium, zirconium, tungsten, titanium, tantalum, nickel, germanium, magnesium, and the like can be used, for example.

In particular, aluminum oxide has a high barrier property, and even a thin aluminum oxide film having a thickness greater than or equal to 0.5 nm and less than or equal to 3.0 nm can inhibit diffusion of hydrogen and nitrogen. Thus, aluminum oxide deposited by a sputtering method serves as an oxygen supply source and can also have a function of a barrier film against impurities such as hydrogen.

An insulator 581 functioning as an interlayer film is preferably provided over the insulator 574. As in the insulator 524 and the like, the concentration of impurities such as water or hydrogen in the insulator 581 is preferably reduced.

A conductor 540a and a conductor 540b are positioned in openings formed in the insulator 581, the insulator 574, the insulator 580, and the insulator 544. The conductor 540a and the conductor 540b are provided to face each other with the conductor 560 therebetween. The structures of the conductor 540a and the conductor 540b are similar to those of a conductor 546 and a conductor 548 that are described later.

An insulator 582 is provided over the insulator 581. A substance having a barrier property against oxygen or hydrogen is preferably used for the insulator 582. Therefore, a material similar to that for the insulator 514 can be used for the insulator 582. For the insulator 582, a metal oxide such as aluminum oxide, hafnium oxide, or tantalum oxide is preferably used, for example.

In particular, aluminum oxide has a high blocking effect that inhibits the passage of both oxygen and impurities such as hydrogen and moisture which are factors of a change in electrical characteristics of the transistor. Thus, aluminum oxide can prevent the entry of impurities such as hydrogen and moisture into the transistor 500 in the fabrication process and after the fabrication of the transistor. In addition, release of oxygen from the oxide included in the transistor 500 can be inhibited. Therefore, aluminum oxide is suitably used for a protective film of the transistor 500.

An insulator 586 is provided over the insulator 582. For the insulator 586, a material similar to that for the insulator 320 can be used. When a material with a relatively low permittivity is used for the interlayer film, the parasitic capacitance between wirings can be reduced. A silicon oxide film, a silicon oxynitride film, or the like can be used for the insulator 586, for example.

The conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 have functions of plugs or wirings that are connected to the capacitor 600, the transistor 500, or the transistor 300. The conductor 546 and the conductor 548 can be provided using a material similar to those for the conductor 328 and the conductor 330.

Next, the capacitor 600 is provided above the transistor 500. The capacitor 600 includes a conductor 610, a conductor 620, and an insulator 630.

A conductor 612 may be provided over the conductor 546 and the conductor 548. The conductor 612 has a function of a plug or a wiring that is connected to the transistor 500. The conductor 610 has a function of an electrode of the capacitor 600. The conductor 612 and the conductor 610 can be formed at the same time.

The conductor 612 and the conductor 610 can be formed using a metal film containing an element selected from molybdenum, titanium, tantalum, tungsten, aluminum, copper, chromium, neodymium, and scandium; a metal nitride film containing any of the above elements as its component (a tantalum nitride film, a titanium nitride film, a molybdenum nitride film, or a tungsten nitride film); or the like. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

Although the conductor 612 and the conductor 610 having a single-layer structure are illustrated in FIG. 12, the structure is not limited thereto, and a stacked-layer structure of two or more layers may be employed. For example, between a conductor having a barrier property and a conductor having high conductivity, a conductor that is highly adhesive to the conductor having a barrier property and the conductor having high conductivity may be formed.

The conductor 620 is provided to overlap the conductor 610 with the insulator 630 therebetween. Note that the conductor 620 can be formed using a conductive material such as a metal material, an alloy material, or a metal oxide material. It is preferable to use a high-melting-point material that has both heat resistance and conductivity, such as tungsten or molybdenum, and it is particularly preferable to use tungsten. In addition, in the case where the conductor 620 is formed concurrently with another component such as a conductor, Cu (copper), Al (aluminum), or the like, which is a low-resistance metal material, is used.

An insulator 650 is provided over the conductor 620 and the insulator 630. The insulator 650 can be provided using a material similar to that for the insulator 320. The insulator 650 may function as a planarization film that covers an uneven shape thereunder.

With the use of this structure, a change in electrical characteristics can be inhibited and reliability can be improved in a memory device using a transistor including an oxide semiconductor. Alternatively, a transistor including an oxide semiconductor and having a high on-state current can be provided. Alternatively, a transistor including an oxide semiconductor and having a low off-state current can be provided. Alternatively, a memory device with low power consumption can be provided. Alternatively, a memory device using a transistor including an oxide semiconductor can be miniaturized or highly integrated.

<Structure Example of Transistor>

Note that the structure of the transistor 500 in the memory device described in this embodiment is not limited to the above. Examples of structures that can be used for the transistor 500 are described below.

<Structure Example 1 of Transistor>

Figure 14A:
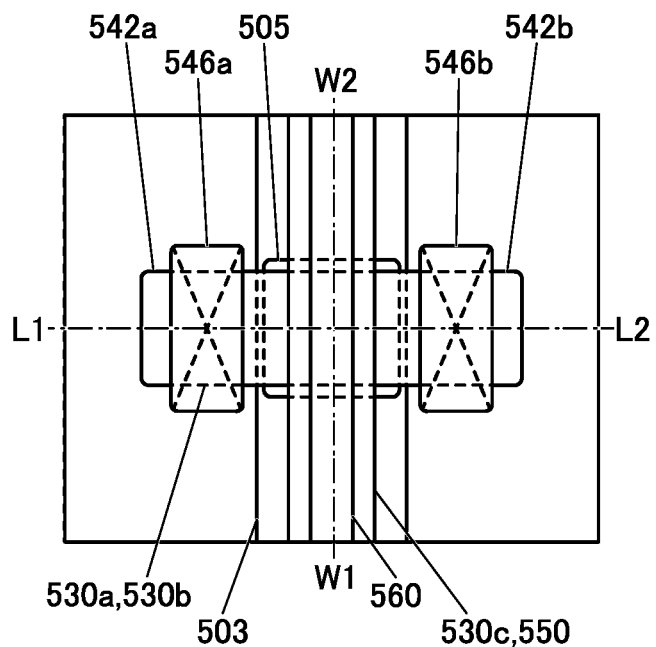
FIG. 14A is a top view illustrating a structure example of a transistor.
Figure 14C:
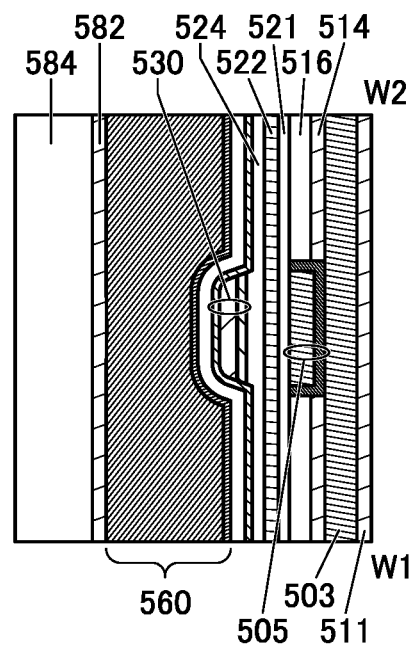
FIG. 14B and FIG. 14C are cross-sectional views illustrating the structure example of the transistor.
Figure 14B:
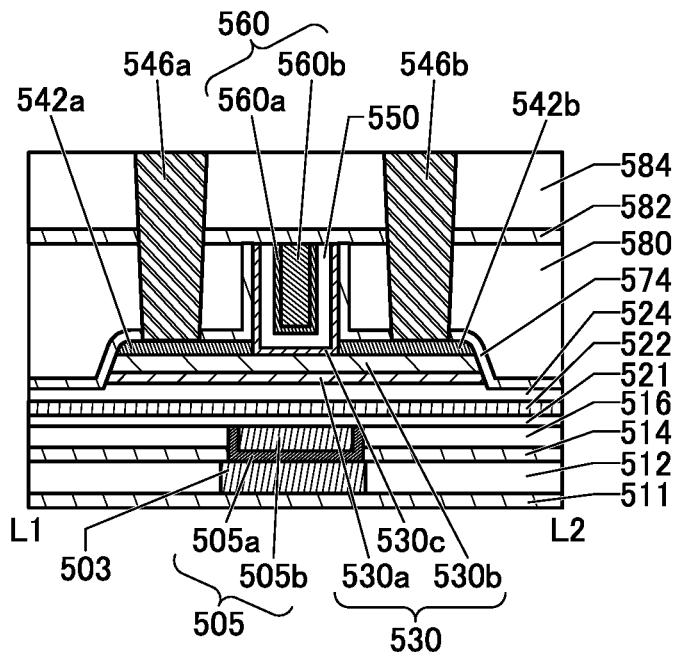

A structure example of a transistor 510A is described with reference to FIG. 14A, FIG. 14B, and FIG. 14C. FIG. 14A is a top view of the transistor 510A. FIG. 14B is a cross-sectional view of a portion indicated by the dashed-dotted line L1-L2 in FIG. 14A. FIG. 14C is a cross-sectional view of a portion indicated by the dashed-dotted line W1-W2 in FIG. 14A. Note that for clarity of the drawing, some components are not illustrated in the top view of FIG. 14A.

FIG. 14A, FIG. 14B, and FIG. 14C illustrate the transistor 510A and the insulator 511, the insulator 512, the insulator 514, the insulator 516, the insulator 580, the insulator 582, and an insulator 584 that function as interlayer films. In addition, the conductor 546 (a conductor 546a and a conductor 546b) that is electrically connected to the transistor 510A and functions as a contact plug, and the conductor 503 functioning as a wiring are illustrated.

The transistor 510A includes the conductor 560 (the conductor 560a and the conductor 560b) functioning as a first gate electrode; a conductor 505 (a conductor 505a and a conductor 505b) functioning as a second gate electrode; the insulator 550 functioning as a first gate insulating film; an insulator 521, the insulator 522, and the insulator 524 that function as a second gate insulating film; the oxide 530 (the oxide 530a, the oxide 530b, and the oxide 530c) including a region where a channel is formed; the conductor 542a functioning as one of a source and a drain; the conductor 542b functioning as the other of the source and the drain; and the insulator 574.

In the transistor 510A illustrated in FIG. 14, the oxide 530c, the insulator 550, and the conductor 560 are positioned in an opening portion provided in the insulator 580 with the insulator 574 therebetween. Moreover, the oxide 530c, the insulator 550, and the conductor 560 are positioned between the conductor 542a and the conductor 542b.

The insulator 511 and the insulator 512 each function as an interlayer film.

As the interlayer film, a single layer or stacked layers of an insulator such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), or $(Ba,Sr)TiO_3$ (BST) can be used. Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

For example, the insulator 511 preferably functions as a barrier film that inhibits entry of impurities such as water or hydrogen into the transistor 510A from the substrate side. Accordingly, for the insulator 511, it is preferable to use an insulating material that has a function of inhibiting diffusion of impurities such as a hydrogen atom, a hydrogen molecule, a water molecule, and a copper atom (through which the above impurities are less likely to pass). Alternatively, it is preferable to use an insulating material that has a function of inhibiting diffusion of oxygen (e.g., at least one of an oxygen atom, an oxygen molecule, and the like) (through which the above oxygen is less likely to pass). Moreover, aluminum oxide or silicon nitride, for example, may be used for the insulator 511. This structure can inhibit diffusion of impurities such as hydrogen and water to the transistor 510A side from the substrate side through the insulator 511.

For example, the permittivity of the insulator 512 is preferably lower than that of the insulator 511. When a material with a low permittivity is used for the interlayer film, the parasitic capacitance generated between wirings can be reduced.

The conductor 503 is formed to be embedded in the insulator 512. Here, the top surface of the conductor 503 and the top surface of the insulator 512 can be substantially level with each other. Note that although a structure in which the conductor 503 is a single layer is illustrated, the present invention is not limited thereto. For example, the conductor 503 may have a multilayer structure of two or more layers. Note that for the conductor 503, a conductive material that has high conductivity and contains tungsten, copper, or aluminum as its main component is preferably used.

In the transistor 510A, the conductor 560 sometimes functions as a first gate (also referred to as top gate) electrode. The conductor 505 sometimes functions as a second gate (also referred to as bottom gate) electrode. In that case, the threshold voltage of the transistor 510A can be controlled by changing a potential applied to the conductor 505 independently of a potential applied to the conductor 560. In particular, when a negative potential is applied to the conductor 505, the threshold voltage of the transistor 510A can be higher than 0 V, and the off-state current can be reduced. Thus, a drain current at the time when a potential applied to the conductor 560 is 0 V can be lower in the case where a negative potential is applied to the conductor 505 than in the case where a negative potential is not applied to the conductor 505.

For example, when the conductor 505 and the conductor 560 are provided to overlap each other, in the case where a potential is applied to the conductor 560 and the conductor 505, an electric field generated from the conductor 560 and an electric field generated from the conductor 505 are connected, so that the channel formation region formed in the oxide 530 can be covered.

That is, the channel formation region can be electrically surrounded by the electric field of the conductor 560 having a function of the first gate electrode and the electric field of the conductor 505 having a function of the second gate electrode. In other words, the transistor 510A has a surrounded channel (S-channel) structure, like the transistor 500 described above.

Like the insulator 511 or the insulator 512, the insulator 514 and the insulator 516 each function as an interlayer film. For example, the insulator 514 preferably functions as a barrier film that inhibits entry of impurities such as water or hydrogen into the transistor 510A from the substrate side. This structure can inhibit diffusion of impurities such as hydrogen and water to the transistor 510A side from the substrate side through the insulator 514. Moreover, for example, the insulator 516 preferably has a lower permittivity than the insulator 514. When a material with a low permittivity is used for the interlayer film, the parasitic capacitance generated between wirings can be reduced.

In the conductor 505 functioning as the second gate, the conductor 505a is formed in contact with an inner wall of an opening in the insulator 514 and the insulator 516, and the conductor 505b is formed further inside. Here, the top surfaces of the conductor 505a and the conductor 505b and the top surface of the insulator 516 can be substantially level with each other. Although the transistor 510A having a structure in which the conductor 505a and the conductor 505b are stacked is illustrated, the present invention is not limited thereto. For example, the conductor 505 may have a single-layer structure or a stacked-layer structure of three or more layers.

Here, for the conductor 505a, it is preferable to use a conductive material that has a function of inhibiting diffusion of impurities such as a hydrogen atom, a hydrogen molecule, a water molecule, and a copper atom (through which the above impurities are less likely to pass). Alternatively, it is preferable to use a conductive material that has a function of inhibiting diffusion of oxygen (e.g., at least one of an oxygen atom, an oxygen molecule, and the like) (through which the above oxygen is less likely to pass). Note that in this specification, a function of inhibiting diffusion of impurities or oxygen means a function of inhibiting diffusion of any one or all of the above impurities and the above oxygen.

For example, when the conductor 505a has a function of inhibiting diffusion of oxygen, a reduction in conductivity of the conductor 505b due to oxidation can be inhibited.

In the case where the conductor 505 doubles as a wiring, the conductor 505b is preferably formed using a conductive material that has high conductivity and contains tungsten, copper, or aluminum as its main component. In that case, the conductor 503 is not necessarily provided. Note that the conductor 505b is illustrated as a single layer but may have a stacked-layer structure, for example, a stack of any of the above conductive materials and titanium or titanium nitride.

The insulator 521, the insulator 522, and the insulator 524 each have a function of a second gate insulating film.

The insulator 522 preferably has a barrier property. The insulator 522 having a barrier property functions as a layer that inhibits entry of impurities such as hydrogen into the transistor 510A from the surroundings of the transistor 510A.

For the insulator 522, a single layer or stacked layers of an insulator containing what is called a high-k material, such as aluminum oxide, hafnium oxide, an oxide containing aluminum and hafnium (hafnium aluminate), tantalum oxide, zirconium oxide, lead zirconate titanate (PZT), strontium titanate ($SrTiO_3$), or $(Ba,Sr)TiO_3$ (BST), are preferably used, for example. With miniaturization and high integration of transistors, a problem such as leakage current may arise because of a thinner gate insulating film. When a high-k material is used for the insulator functioning as the gate insulating film, a gate potential at the time when the transistor operates can be reduced while the physical thickness is maintained.

It is preferable that the insulator 521 be thermally stable. For example, silicon oxide and silicon oxynitride, which have thermal stability, are preferable. In addition, a combination of an insulator of a high-k material and silicon oxide or silicon oxynitride allows the insulator 521 to have a stacked-layer structure with thermal stability and a high dielectric constant.

Note that the second gate insulating film is shown to have a stacked-layer structure of three layers in FIG. 14, but may be two or less layers or have a stacked-layer structure of four or more layers. In such cases, without limitation to a stacked-layer structure formed of the same material, a stacked-layer structure formed of different materials may be employed.

The oxide 530 including a region functioning as the channel formation region includes the oxide 530a, the oxide 530b over the oxide 530a, and the oxide 530c over the oxide 530b. Including the oxide 530a under the oxide 530b makes it possible to inhibit diffusion of impurities into the oxide 530b from the components formed below the oxide 530a. Moreover, including the oxide 530c over the oxide 530b makes it possible to inhibit diffusion of impurities into the oxide 530b from the components formed above the oxide 530c. As the oxide 530, the above-described oxide semiconductor, which is one type of metal oxide, can be used.

Note that the oxide 530c is preferably provided in the opening portion provided in the insulator 580 with the insulator 574 therebetween. When the insulator 574 has a barrier property, diffusion of impurities from the insulator 580 into the oxide 530 can be inhibited.

One of the conductors 542 functions as a source electrode and the other functions as a drain electrode.

For the conductor 542a and the conductor 542b, a metal such as aluminum, titanium, chromium, nickel, copper, yttrium, zirconium, molybdenum, silver, tantalum, or tungsten or an alloy containing any of the metals as its main component can be used. In particular, a metal nitride film of tantalum nitride or the like is preferable because it has a barrier property against hydrogen or oxygen and high oxidation resistance.

In addition, although the conductor 542a and the conductor 542b each having a single-layer structure are illustrated in FIG. 14, a stacked-layer structure of two or more layers may be employed. For example, it is preferable to stack a tantalum nitride film and a tungsten film. Alternatively, a titanium film and an aluminum film may be stacked. Alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

Other examples include a three-layer structure where a titanium film or a titanium nitride film is formed, an aluminum film or a copper film is stacked over the titanium film or the titanium nitride film, and a titanium film or a titanium nitride film is formed thereover; and a three-layer structure where a molybdenum film or a molybdenum nitride film is formed, an aluminum film or a copper film is stacked over the molybdenum film or the molybdenum nitride film, and a molybdenum film or a molybdenum nitride film is formed thereover. Note that a transparent conductive material containing indium oxide, tin oxide, or zinc oxide may be used.

A barrier layer may be provided over the conductor 542. The barrier layer is preferably formed using a substance having a barrier property against oxygen or hydrogen. This structure can inhibit oxidation of the conductor 542 at the time of depositing the insulator 574.

A metal oxide can be used for the barrier layer, for example. In particular, an insulating film of aluminum oxide, hafnium oxide, gallium oxide, or the like, which has a barrier property against oxygen and hydrogen, is preferably used. Alternatively, silicon nitride formed by a CVD method may be used.

With the barrier layer, the range of choices for the material of the conductor 542 can be expanded. For example, a material having a low oxidation resistance and high conductivity, such as tungsten or aluminum, can be used for the conductor 542. Moreover, for example, a conductor that can be easily deposited or processed can be used.

The insulator 550 functions as a first gate insulating film. The insulator 550 is preferably provided in the opening portion provided in the insulator 580 with the oxide 530c and the insulator 574 therebetween.

With miniaturization and high integration of transistors, a problem such as leakage current may arise because of a thinner gate insulating film. In that case, the insulator 550 may have a stacked-layer structure like the second gate insulating film. When the insulator functioning as the gate insulating film has a stacked-layer structure of a high-k material and a thermally stable material, a gate potential at the time when the transistor operates can be reduced while the physical thickness is maintained. Furthermore, the stacked-layer structure can be thermally stable and have a high dielectric constant.

The conductor 560 functioning as the first gate electrode includes the conductor 560a and the conductor 560b over the conductor 560a. Like the conductor 505a, the conductor 560a is preferably formed using a conductive material having a function of inhibiting diffusion of impurities such as a hydrogen atom, a hydrogen molecule, a water molecule, and a copper atom. Alternatively, it is preferable to use a conductive material having a function of inhibiting diffusion of oxygen (e.g., at least one of an oxygen atom, an oxygen molecule, and the like).

When the conductor 560a has a function of inhibiting oxygen diffusion, the range of choices for the material of the conductor 560b can be expanded. That is, the conductor 560a inhibits oxidation of the conductor 560b, thereby preventing the decrease in conductivity.

As a conductive material having a function of inhibiting diffusion of oxygen, tantalum, tantalum nitride, ruthenium, or ruthenium oxide is preferably used, for example. For the conductor 560a, the oxide semiconductor that can be used as the oxide 530 can be used. In that case, when the conductor 560b is deposited by a sputtering method, the conductor 560a can have a reduced electric resistance value to be a conductor. This can be referred to as an OC (Oxide Conductor) electrode.

The conductor 560b is preferably formed using a conductive material containing tungsten, copper, or aluminum as its main component. In addition, since the conductor 560b also functions as a wiring, a conductor having high conductivity is preferably used as the conductor 560b. For example, a conductive material containing tungsten, copper, or aluminum as its main component can be used. The conductor 560b may have a stacked-layer structure, for example, a stack of any of the above conductive materials and titanium or titanium nitride.

The insulator 574 is positioned between the insulator 580 and the transistor 510A. For the insulator 574, an insulating material having a function of inhibiting diffusion of oxygen and impurities such as water or hydrogen is preferably used. For example, aluminum oxide or hafnium oxide is preferably used. Moreover, it is possible to use, for example, a metal oxide such as magnesium oxide, gallium oxide, germanium oxide, yttrium oxide, zirconium oxide, lanthanum oxide, neodymium oxide, or tantalum oxide or silicon nitride oxide, silicon nitride, or the like.

The insulator 574 can inhibit diffusion of impurities such as water and hydrogen contained in the insulator 580 into the oxide 530b through the oxide 530c and the insulator 550. Furthermore, oxidation of the conductor 560 due to excess oxygen contained in the insulator 580 can be inhibited.

The insulator 580, the insulator 582, and the insulator 584 each function as an interlayer film.

Like the insulator 514, the insulator 582 preferably functions as a barrier insulating film that inhibits entry of impurities such as water or hydrogen into the transistor 510A from the outside.

Like the insulator 516, the insulator 580 and the insulator 584 preferably have a lower permittivity than the insulator 582. When a material with a low permittivity is used for the interlayer film, the parasitic capacitance generated between wirings can be reduced.

The transistor 510A may be electrically connected to another component through a plug or a wiring such as the conductor 546 embedded in the insulator 580, the insulator 582, and the insulator 584.

As a material for the conductor 546, a single layer or stacked layers of a conductive material such as a metal material, an alloy material, a metal nitride material, or a metal oxide material can be used, as in the case of the conductor 505. For example, it is preferable to use a high-melting-point material that has both heat resistance and conductivity, such as tungsten or molybdenum. Alternatively, it is preferable to use a low-resistance conductive material such as aluminum or copper. The use of a low-resistance conductive material can reduce wiring resistance.

For example, when the conductor 546 has a stacked-layer structure of tantalum nitride or the like, which is a conductor having a barrier property against hydrogen and oxygen, and tungsten, which has high conductivity, diffusion of impurities from the outside can be inhibited while the conductivity of the wiring is maintained.

With the above structure, a memory device using a transistor that includes an oxide semiconductor and has a high on-state current can be provided. Alternatively, a memory device that uses a transistor including an oxide semiconductor and having a low off-state current can be provided. Alternatively, a memory device that has small variations in electrical characteristics, stable electrical characteristics, and high reliability can be provided.

<Structure Example 2 of Transistor>

Figure 15A:
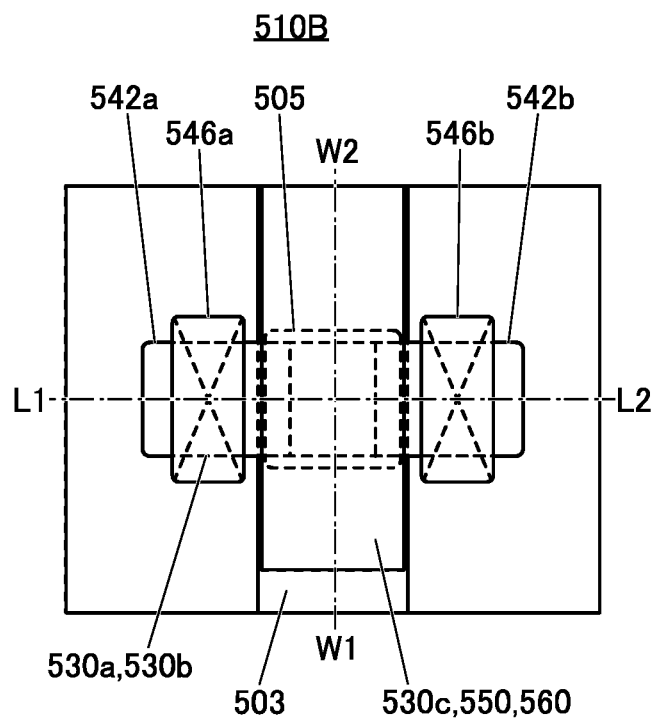
FIG. 15A is a top view illustrating a structure example of a transistor.
Figure 15C:
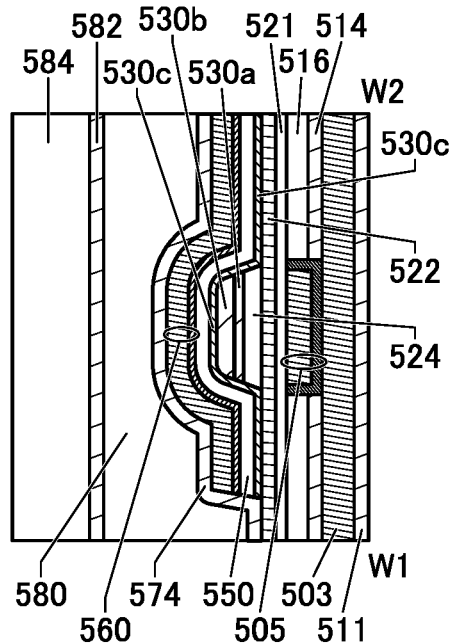
FIG. 15B and FIG. 15C are cross-sectional views illustrating the structure example of the transistor.
Figure 15B:
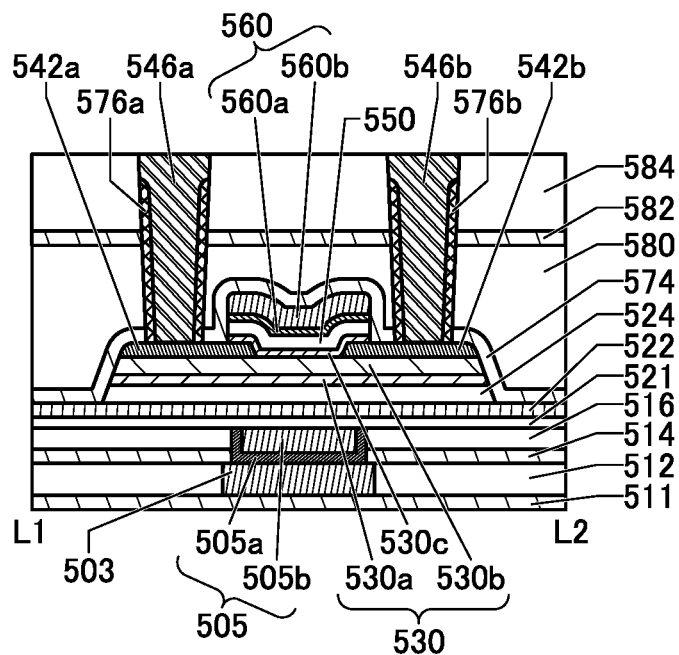

A structure example of a transistor 510B is described with reference to FIG. 15A, FIG. 15B, and FIG. 15C. FIG. 15A is a top view of the transistor 510B. FIG. 15B is a cross-sectional view of a portion indicated by a dashed-dotted line L1-L2 in FIG. 15A. FIG. 15C is a cross-sectional view of a portion indicated by a dashed-dotted line W1-W2 in FIG. 15A. Note that for clarity of the drawing, some components are not illustrated in the top view of FIG. 15A.

The transistor 510B is a modification example of the transistor 510A. Therefore, differences from the transistor 510A are mainly described to avoid repeated description.

The transistor 510B includes a region where the oxide 530c, the insulator 550, and the conductor 560 overlap the conductor 542 (the conductor 542a and the conductor 542b). With this structure, a transistor having a high on-state current can be provided. Moreover, a transistor having high controllability can be provided.

The conductor 560 functioning as the first gate electrode includes the conductor 560a and the conductor 560b over the conductor 560a. Like the conductor 505a, the conductor 560a is preferably formed using a conductive material having a function of inhibiting diffusion of impurities such as a hydrogen atom, a hydrogen molecule, a water molecule, and a copper atom. Alternatively, it is preferable to use a conductive material having a function of inhibiting diffusion of oxygen (e.g., at least one of an oxygen atom, an oxygen molecule, and the like).

When the conductor 560a has a function of inhibiting oxygen diffusion, the range of choices for the material of the conductor 560b can be expanded. That is, the conductor 560a inhibits oxidation of the conductor 560b, thereby preventing the decrease in conductivity.

The insulator 574 is preferably provided to cover the top surface and a side surface of the conductor 560, a side surface of the insulator 550, and a side surface of the oxide 530c. For the insulator 574, an insulating material having a function of inhibiting diffusion of oxygen and impurities such as water or hydrogen is preferably used. For example, aluminum oxide or hafnium oxide is preferably used. Moreover, it is possible to use, for example, a metal oxide such as magnesium oxide, gallium oxide, germanium oxide, yttrium oxide, zirconium oxide, lanthanum oxide, neodymium oxide, or tantalum oxide or silicon nitride oxide, silicon nitride, or the like.

The insulator 574 can inhibit oxidation of the conductor 560. Moreover, the insulator 574 can inhibit diffusion of impurities such as water and hydrogen contained in the insulator 580 into the transistor 510B.

An insulator 576 (an insulator 576a and an insulator 576b) having a barrier property may be provided between the conductor 546 and the insulator 580. Providing the insulator 576 can prevent oxygen in the insulator 580 from reacting with the conductor 546 and oxidizing the conductor 546.

Furthermore, with the insulator 576 having a barrier property, the range of choices for the material of the conductor used as the plug or the wiring can be expanded. The use of a metal material having an oxygen absorbing property and high conductivity for the conductor 546, for example, can provide a memory device with low power consumption. Specifically, a material having a low oxidation resistance and high conductivity, such as tungsten or aluminum, can be used. Moreover, for example, a conductor that can be easily deposited or processed can be used.

<Structure Example 3 of Transistor>

Figure 16A:
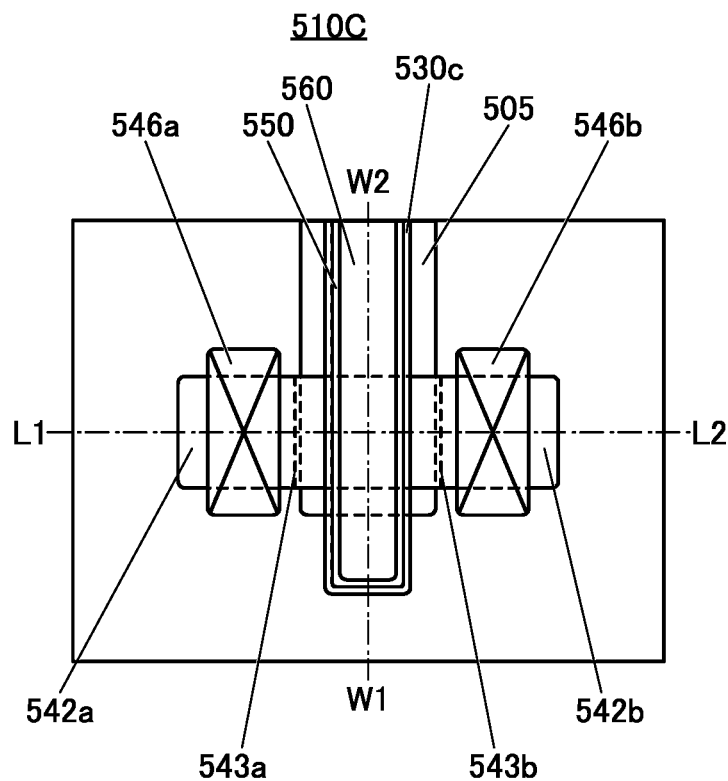
FIG. 16A is a top view illustrating a structure example of a transistor.
Figure 16C:
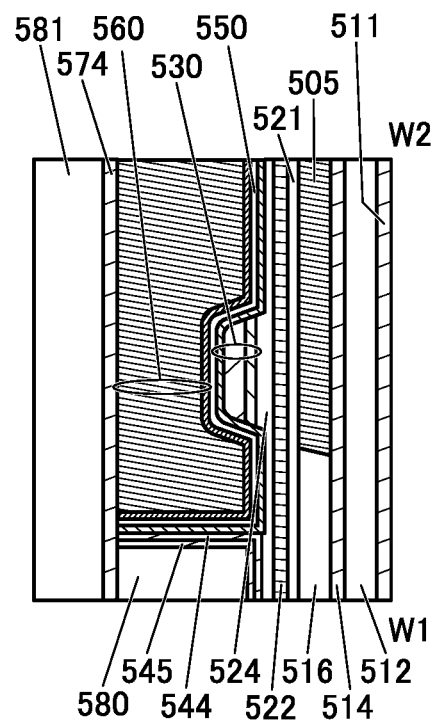
FIG. 16B and FIG. 16C are cross-sectional views illustrating the structure example of the transistor.
Figure 16B:
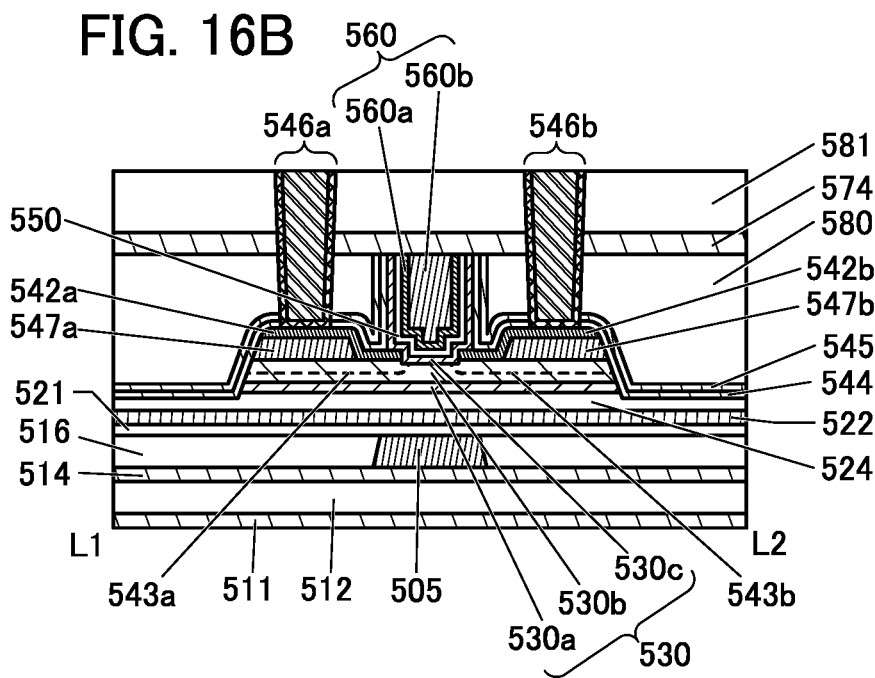

A structure example of a transistor 510C is described with reference to FIG. 16A, FIG. 16B, and FIG. 16C. FIG. 16A is a top view of the transistor 510C. FIG. 16B is a cross-sectional view of a portion indicated by a dashed-dotted line L1-L2 in FIG. 16A. FIG. 16C is a cross-sectional view of a portion indicated by a dashed-dotted line W1-W2 in FIG. 16A. Note that for clarity of the drawing, some components are not illustrated in the top view of FIG. 16A.

The transistor 510C is a modification example of the transistor 510A. Therefore, differences from the transistor 510A are mainly described to avoid repeated description.

In the transistor 510C illustrated in FIG. 16, a conductor 547a is positioned between the conductor 542a and the oxide 530b, and a conductor 547b is positioned between the conductor 542b and the oxide 530b. Here, the conductor 542a (the conductor 542b) has a region that extends beyond the top surface of the conductor 547a (the conductor 547b) and its side surface on the conductor 560 side and is in contact with the top surface of the oxide 530b. For the conductors 547, a conductor that can be used as the conductor 542 is used. It is preferable that the thickness of the conductor 547 be at least greater than that of the conductor 542.

In the transistor 510C illustrated in FIG. 16, because of the above structure, the conductor 542 can be closer to the conductor 560 than in the transistor 510A. Alternatively, the conductor 560 can overlap an end portion of the conductor 542a and an end portion of the conductor 542b. Thus, the effective channel length of the transistor 510C can be shortened, and the on-state current and the frequency characteristics can be improved.

The conductor 547a (the conductor 547b) is preferably provided to be overlapped by the conductor 542a (the conductor 542b). With such a structure, the conductor 547a (the conductor 547b) can function as a stopper to prevent over-etching of the oxide 530b in etching for forming the opening in which the conductor 546a (the conductor 546b) is to be embedded.

The transistor 510C illustrated in FIG. 16 may have a structure in which an insulator 545 is positioned over and in contact with the insulator 544. The insulator 544 preferably functions as a barrier insulating film that inhibits entry of impurities such as water or hydrogen and excess oxygen into the transistor 510C from the insulator 580 side. The insulator 545 can be formed using an insulator that can be used for the insulator 544. In addition, the insulator 544 may be formed using a nitride insulator such as aluminum nitride, aluminum titanium nitride, titanium nitride, silicon nitride, or silicon nitride oxide, for example.

Unlike in the transistor 510A illustrated in FIG. 14, in the transistor 510C illustrated in FIG. 16, the conductor 505 may be provided to have a single-layer structure. In this case, an insulating film to be the insulator 516 is formed over the patterned conductor 505, and an upper portion of the insulating film is removed by a CMP method or the like until the top surface of the conductor 505 is exposed. Preferably, the planarity of the top surface of the conductor 505 is made favorable. For example, the average surface roughness (Ra) of the top surface of the conductor 505 is less than or equal to 1 nm, preferably less than or equal to 0.5 nm, further preferably less than or equal to 0.3 nm. This allows the improvement in planarity of an insulating layer formed over the conductor 505 and the increase in crystallinity of the oxide 530b and the oxide 530c.

<Structure Example 4 of Transistor>

Figure 17A:
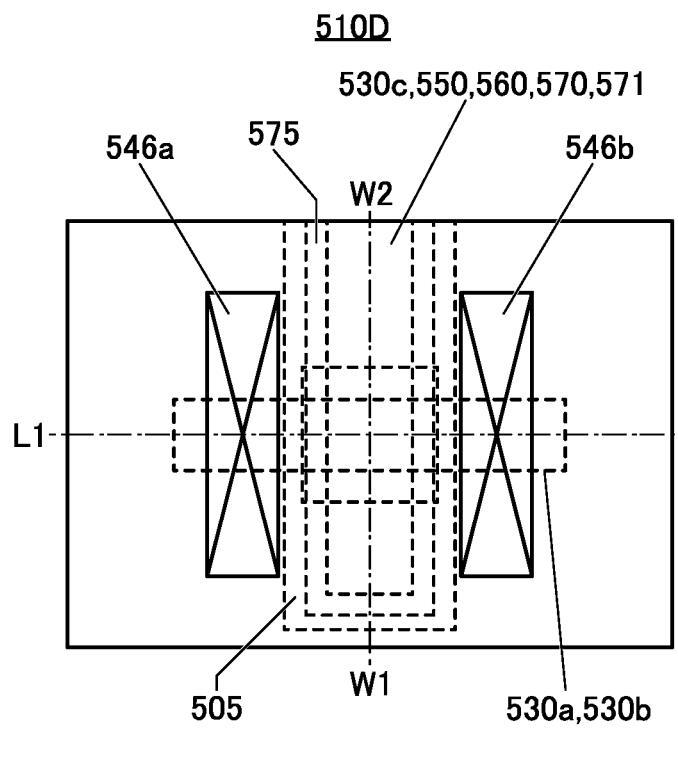
FIG. 17A is a top view illustrating a structure example of a transistor.
Figure 17C:
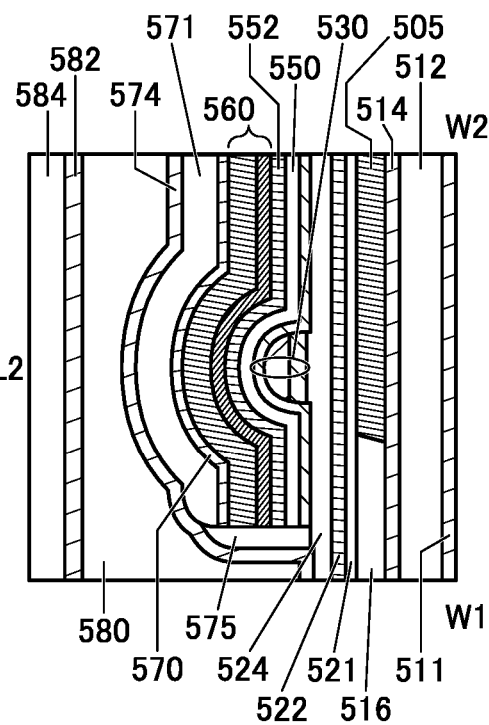
FIG. 17B and FIG. 17C are cross-sectional views illustrating the structure example of the transistor.
Figure 17B:
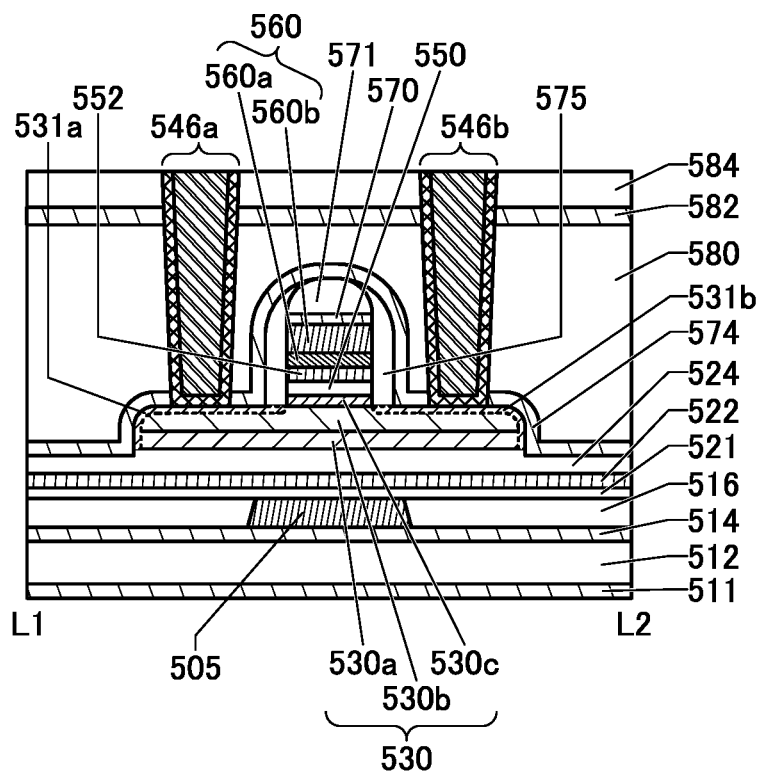

A structure example of a transistor 510D is described with reference to FIG. 17A, FIG. 17B, and FIG. 17C. FIG. 17A is a top view of the transistor 510D. FIG. 17B is a cross-sectional view of a portion indicated by a dashed-dotted line L1-L2 in FIG. 17A. FIG. 17C is a cross-sectional view of a portion indicated by a dashed-dotted line W1-W2 in FIG. 17A. Note that for clarity of the drawing, some components are not illustrated in the top view in FIG. 17A.

The transistor 510D is a modification example of the above transistors. Therefore, differences from the above transistors are mainly described to avoid repeated description.

In FIG. 17A to FIG. 17C, the conductor 503 is not provided, and the conductor 505 that has a function of a second gate is made to function also as a wiring. In addition, the insulator 550 is provided over the oxide 530c and a metal oxide 552 is provided over the insulator 550. In addition, the conductor 560 is provided over the metal oxide 552, and an insulator 570 is provided over the conductor 560. Furthermore, an insulator 571 is provided over the insulator 570.

The metal oxide 552 preferably has a function of inhibiting diffusion of oxygen. When the metal oxide 552 that inhibits oxygen diffusion is provided between the insulator 550 and the conductor 560, diffusion of oxygen into the conductor 560 is inhibited. That is, a reduction in the amount of oxygen supplied to the oxide 530 can be inhibited. Moreover, oxidation of the conductor 560 due to oxygen can be inhibited.

Note that the metal oxide 552 may have a function of part of the first gate. For example, the oxide semiconductor that can be used for the oxide 530 can be used for the metal oxide 552. In this case, when the conductor 560 is deposited by a sputtering method, the electric resistance value of the metal oxide 552 is lowered so that the metal oxide 552 can be a conductive layer. This can be referred to as an OC (Oxide Conductor) electrode.

The metal oxide 552 may have a function of part of a gate insulating film. Thus, when silicon oxide, silicon oxynitride, or the like is used for the insulator 550, a metal oxide that is a high-k material with a high dielectric constant is preferably used for the metal oxide 552. Such a stacked-layer structure can be thermally stable and can have a high dielectric constant. Thus, a gate potential that is applied when the transistor operates can be lowered while the physical thickness is maintained. In addition, the equivalent oxide thickness (EOT) of an insulating layer functioning as the gate insulating film can be reduced.

Although the metal oxide 552 in the transistor 510D is shown as a single layer, the metal oxide 552 may have a stacked-layer structure of two or more layers. For example, a metal oxide functioning as part of the gate electrode and a metal oxide functioning as part of the gate insulating film may be stacked.

With the metal oxide 552 functioning as a gate electrode, the on-state current of the transistor 510D can be increased without a reduction in the influence of the electric field from the conductor 560. With the metal oxide 552 functioning as the gate insulating film, the distance between the conductor 560 and the oxide 530 is kept by the physical thicknesses of the insulator 550 and the metal oxide 552, so that leakage current between the conductor 560 and the oxide 530 can be reduced. Thus, with the stacked-layer structure of the insulator 550 and the metal oxide 552, the physical distance between the conductor 560 and the oxide 530 and the intensity of electric field applied from the conductor 560 to the oxide 530 can be easily adjusted as appropriate.

Specifically, the oxide semiconductor that can be used for the oxide 530 can also be used for the metal oxide 552 when the resistance thereof is reduced. Alternatively, a metal oxide containing one kind or two or more kinds selected from hafnium, aluminum, gallium, yttrium, zirconium, tungsten, titanium, tantalum, nickel, germanium, magnesium, and the like can be used.

It is particularly preferable to use an insulating layer containing an oxide of one or both of aluminum and hafnium, for example, aluminum oxide, hafnium oxide, or an oxide containing aluminum and hafnium (hafnium aluminate). In particular, hafnium aluminate has higher heat resistance than a hafnium oxide film. Therefore, hafnium aluminate is preferable because it is less likely to be crystallized by heat treatment in a later step. Note that the metal oxide 552 is not an essential component. Design is appropriately set in consideration of required transistor characteristics.

For the insulator 570, an insulating material having a function of inhibiting the passage of oxygen and impurities such as water and hydrogen is preferably used. For example, aluminum oxide or hafnium oxide is preferably used. Thus, oxidation of the conductor 560 due to oxygen from above the insulator 570 can be inhibited. Moreover, entry of impurities such as water or hydrogen from above the insulator 570 into the oxide 530 through the conductor 560 and the insulator 550 can be inhibited.

The insulator 571 functions as a hard mask. By providing the insulator 571, the conductor 560 can be processed to have a side surface that is substantially vertical; specifically, an angle formed by the side surface of the conductor 560 and a substrate surface can be greater than or equal to 75° and less than or equal to 100°, preferably greater than or equal to 80° and less than or equal to 95°.

Note that an insulating material having a function of inhibiting the passage of oxygen and impurities such as water or hydrogen may be used for the insulator 571 so that the insulator 571 also functions as a barrier layer. In that case, the insulator 570 does not have to be provided.

Parts of the insulator 570, the conductor 560, the metal oxide 552, the insulator 550, and the oxide 530c are selected and removed using the insulator 571 as a hard mask, whereby their side surfaces can be substantially aligned with each other and a surface of the oxide 530b can be partly exposed.

The transistor 510D includes a region 531a and a region 531b on part of the exposed surface of the oxide 530b. One of the region 531a and the region 531b functions as a source region, and the other functions as a drain region.

The region 531a and the region 531b can be formed by introduction of an impurity element such as phosphorus or boron to the exposed surface of the oxide 530b by an ion implantation method, an ion doping method, a plasma immersion ion implantation method, or plasma treatment, for example. In this embodiment and the like, an "impurity element" refers to an element other than main constituent elements.

Alternatively, the region 531a and the region 531b can be formed in such manner that, after part of the surface of the oxide 530b is exposed, a metal film is formed and then heat treatment is performed so that the element contained in the metal film is diffused into the oxide 530b.

The electrical resistivity of regions of the oxide 530b to which the impurity element is added decreases. For that reason, the region 531a and the region 531b are sometimes referred to as "impurity regions" or "low-resistance regions".

The region 531a and the region 531b can be formed in a self-aligned manner by using the insulator 571 and/or the conductor 560 as a mask. Thus, the conductor 560 does not overlap the region 531a and/or the region 531b, so that the parasitic capacitance can be reduced. Moreover, an offset region is not formed between a channel formation region and the source/drain region (the region 531a or the region 531b). The formation of the region 531a and the region 531b in a self-aligned manner achieves an increase in on-state current, a reduction in threshold voltage, and an improvement in operating frequency, for example.

Note that an offset region may be provided between the channel formation region and the source/drain region in order to further reduce the off-state current. The offset region is a region where the electrical resistivity is high and the impurity element is not added. The offset region can be formed by the addition of the impurity element after the formation of an insulator 575. In this case, the insulator 575 serves as a mask like the insulator 571 or the like. Thus, the impurity element is not added to a region of the oxide 530b overlapped by the insulator 575, so that the electrical resistivity of the region can be kept high.

The transistor 510D includes the insulator 575 on the side surfaces of the insulator 570, the conductor 560, the metal oxide 552, the insulator 550, and the oxide 530c. The insulator 575 is preferably an insulator having a low dielectric constant. For example, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like is preferably used. In particular, silicon oxide, silicon oxynitride, silicon nitride oxide, or porous silicon oxide is preferably used for the insulator 575, in which case an excess-oxygen region can be easily formed in the insulator 575 in a later step. Silicon oxide and silicon oxynitride are preferable because of their thermal stability. The insulator 575 preferably has a function of diffusing oxygen.

The transistor 510D also includes the insulator 574 over the insulator 575 and the oxide 530. The insulator 574 is preferably deposited by a sputtering method. When a sputtering method is used, an insulator containing few impurities such as water or hydrogen can be deposited. For example, aluminum oxide is preferably used for the insulator 574.

Note that an oxide film obtained by a sputtering method may extract hydrogen from the component over which the oxide film is deposited. Thus, the hydrogen concentration in the oxide 530 and the insulator 575 can be reduced when the insulator 574 absorbs hydrogen and water from the oxide 530 and the insulator 575.

<Structure Example 5 of Transistor>

Figure 18A:
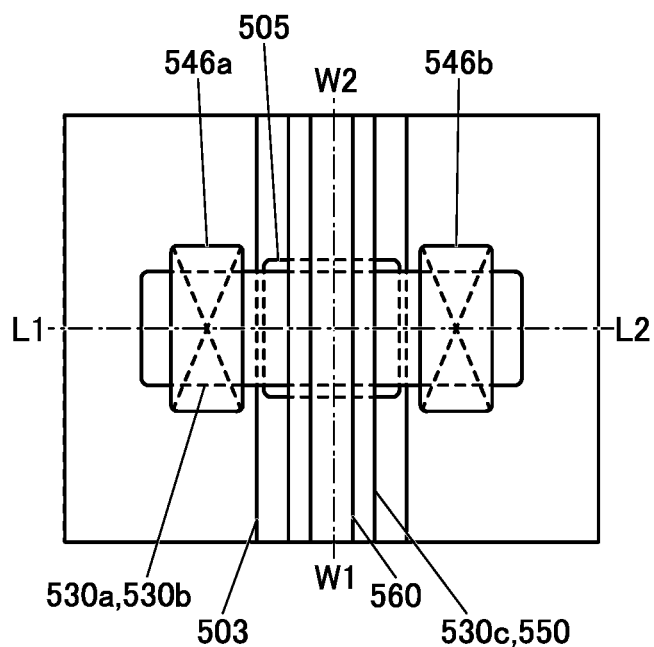
FIG. 18A is a top view illustrating a structure example of a transistor.
Figure 18C:
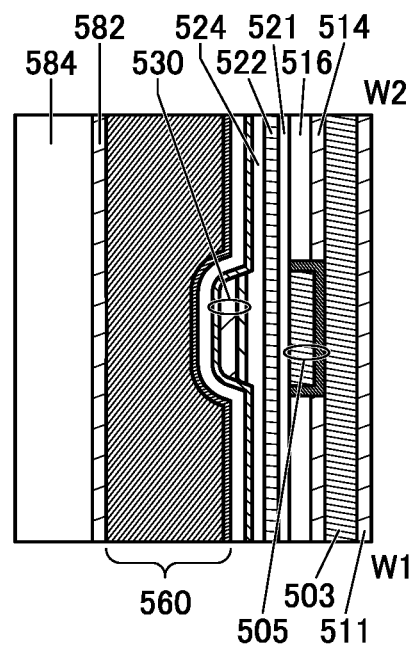
FIG. 18B and FIG. 18C are cross-sectional views illustrating the structure example of the transistor.
Figure 18B:
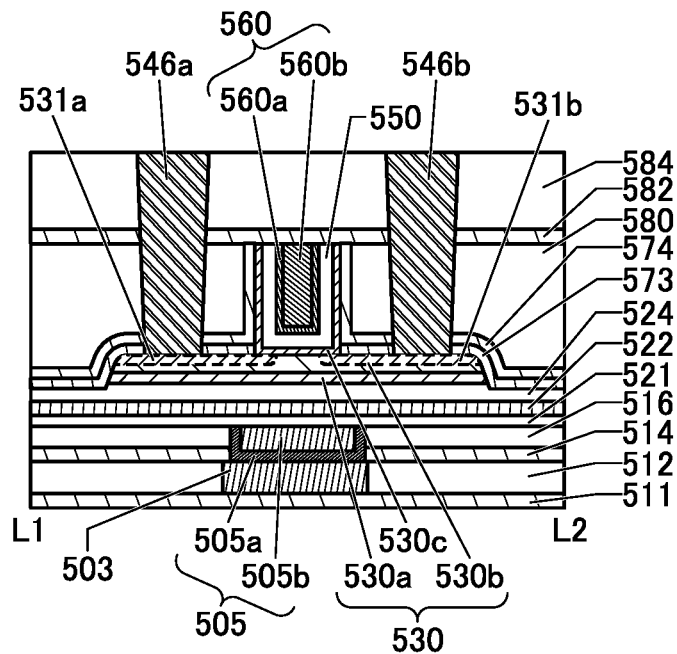

A structure example of a transistor 510E is described with reference to FIG. 18A to FIG. 18C. FIG. 18A is a top view of the transistor 510E. FIG. 18B is a cross-sectional view of a portion indicated by the dashed-dotted line L1-L2 in FIG. 18A. FIG. 18C is a cross-sectional view of a portion indicated by the dashed-dotted line W1-W2 in FIG. 18A. Note that for clarity of the drawing, some components are not illustrated in the top view in FIG. 18A.

The transistor 510E is a modification example of the above transistors. Therefore, differences from the above transistors are mainly described to avoid repeated description.

In FIG. 18A to FIG. 18C, the conductor 542 is not provided, and part of the exposed surface of the oxide 530b includes the region 531a and the region 531b. One of the region 531a and the region 531b functions as a source region, and the other functions as a drain region. Moreover, an insulator 573 is included between the oxide 530b and the insulator 574.

The regions 531 (the region 531a and the region 531b) illustrated in FIG. 18 are regions where an element described below is added to the oxide 530b. The regions 531 can be formed using a dummy gate, for example.

Specifically, a dummy gate is provided over the oxide 530b, and the element that reduces the resistance of the oxide 530b is added using the dummy gate as a mask. That is, the element is added to regions of the oxide 530 that are not overlapped by the dummy gate, whereby the regions 531 are formed. As a method of adding the element, an ion implantation method by which an ionized source gas is subjected to mass separation and then added, an ion doping method by which an ionized source gas is added without mass separation, a plasma immersion ion implantation method, or the like can be used.

Typical examples of the element that reduces the resistance of the oxide 530 are boron and phosphorus. Moreover, hydrogen, carbon, nitrogen, fluorine, sulfur, chlorine, titanium, a rare gas, or the like may be used. Typical examples of the rare gas include helium, neon, argon, krypton, and xenon. The concentration of the element is measured by secondary ion mass spectrometry (SIMS) or the like.

In particular, boron and phosphorus are preferable because an apparatus used in a manufacturing line for low-temperature polysilicon or the like can be used, for example. Since the existing facility can be used, capital investment can be reduced.

Next, an insulating film to be the insulator 573 and an insulating film to be the insulator 574 may be formed over the oxide 530b and the dummy gate. Stacking the insulating film to be the insulator 573 and the insulating film to be the insulator 574 can provide a region where the oxide 530c and the insulator 550 overlap the region 531.

Specifically, after an insulating film to be the insulator 580 is provided over the insulating film to be the insulator 574, the insulating film to be the insulator 580 is subjected to CMP (Chemical Mechanical Polishing) treatment, whereby part of the insulating film to be the insulator 580 is removed and the dummy gate is exposed. Then, when the dummy gate is removed, part of the insulator 573 in contact with the dummy gate is preferably also removed. Thus, the insulator 574 and the insulator 573 are exposed at a side surface of an opening portion provided in the insulator 580, and the region 531 provided in the oxide 530b is partly exposed at the bottom surface of the opening portion. Next, an oxide film to be the oxide 530c, an insulating film to be the insulator 550, and a conductive film to be the conductor 560 are formed in this order in the opening portion, and then the oxide film to be the oxide 530c, the insulating film to be the insulator 550, and the conductive film to be the conductor 560 are partly removed by CMP treatment or the like until the insulator 580 is exposed; thus, the transistor illustrated in FIG. 18 can be formed.

Note that the insulator 573 and the insulator 574 are not essential components. Design is appropriately set in consideration of required transistor characteristics.

The cost of the transistor illustrated in FIG. 18 can be reduced because an existing apparatus can be used and the conductor 542 is not provided.

<Structure Example 6 of Transistor>

Figure 19A:
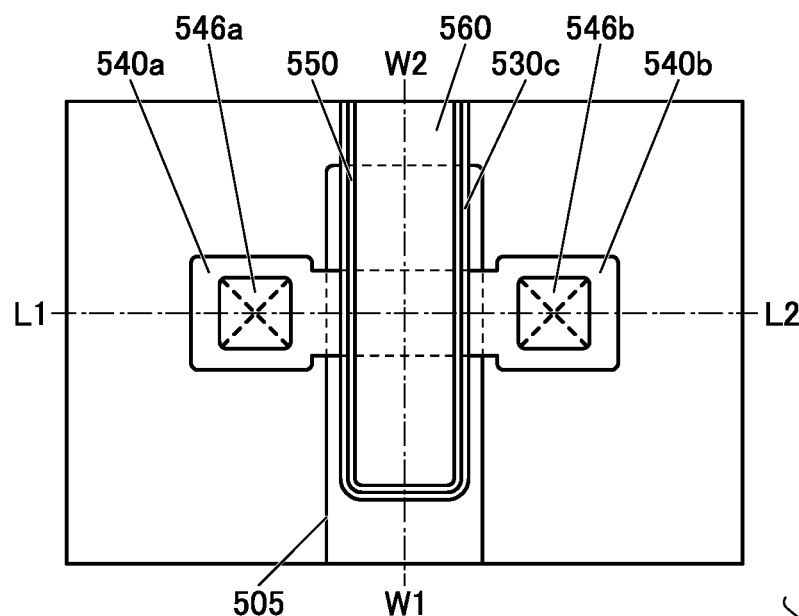
FIG. 19A is a top view illustrating a structure example of a transistor.
Figure 19C:
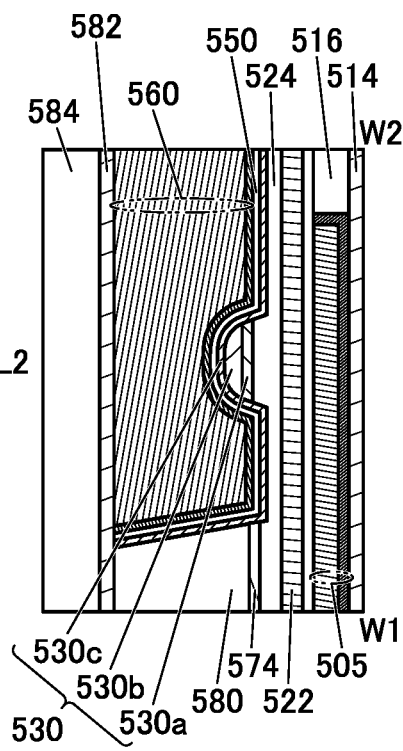
FIG. 19B and FIG. 19C are cross-sectional views illustrating the structure example of the transistor.
Figure 19B:
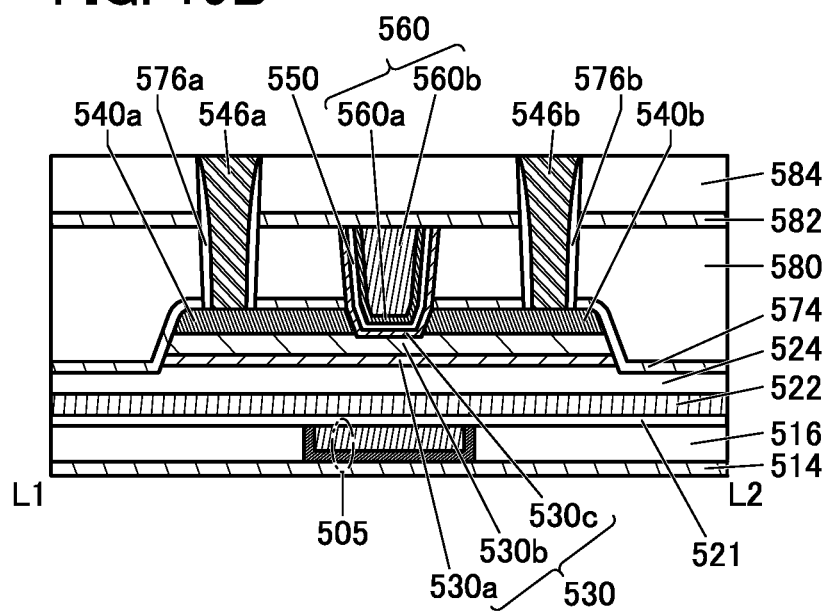

A structure example of a transistor 510F is described with reference to FIG. 19A to FIG. 19C. FIG. 19A is a top view of the transistor 510F. FIG. 19B is a cross-sectional view of a portion indicated by a dashed-dotted line L1-L2 in FIG. 19A. FIG. 19C is a cross-sectional view of a portion indicated by a dashed-dotted line W1-W2 in FIG. 19A. Note that for clarity of the drawing, some components are not illustrated in the top view in FIG. 19A.

The transistor 510F is a modification example of the transistor 510A. Therefore, differences from the above transistors are mainly described to avoid repeated description.

In the transistor 510A, part of the insulator 574 is provided in the opening portion provided in the insulator 580 and covers the side surface of the conductor 560. Meanwhile, in the transistor 510F, an opening is formed by partly removing the insulator 580 and the insulator 574.

An insulator 576 (an insulator 576a and an insulator 576b) having a barrier property may be provided between the conductor 546 and the insulator 580. Providing the insulator 576 can prevent oxygen in the insulator 580 from reacting with the conductor 546 and oxidizing the conductor 546.

Note that when an oxide semiconductor is used as the oxide 530, the oxide 530 preferably has a stacked-layer structure of a plurality of oxide layers that differ in the atomic ratio of metal atoms. Specifically, the atomic proportion of the element M in the constituent elements in the metal oxide used as the oxide 530a is preferably higher than the atomic proportion of the element M in the constituent elements in the metal oxide used as the oxide 530b. In addition, the atomic ratio of the element M to In in the metal oxide used as the oxide 530a is preferably higher than the atomic ratio of the element M to In in the metal oxide used as the oxide 530b. Furthermore, the atomic ratio of In to the element M in the metal oxide used as the oxide 530b is preferably higher than the atomic ratio of In to the element M in the metal oxide used as the oxide 530a. A metal oxide that can be used as the oxide 530a or the oxide 530b can be used as the oxide 530c.

The oxide 530a, the oxide 530b, and the oxide 530c preferably have crystallinity, and in particular, it is preferable to use a CAAC-OS. An oxide having crystallinity, such as a CAAC-OS, has a dense structure with small amounts of impurities and defects (e.g., oxygen vacancies) and high crystallinity. This can inhibit extraction of oxygen from the oxide 530b by the source electrode or the drain electrode. This can reduce extraction of oxygen from the oxide 530b even when heat treatment is performed; hence, the transistor 510F is stable against high temperatures in the manufacturing process (what is called thermal budget).

Note that one or both of the oxide 530a and the oxide 530c may be omitted. The oxide 530 may be a single layer of the oxide 530b. In the case where the oxide 530 is a stack of the oxide 530a, the oxide 530b, and the oxide 530c, the energy of the conduction band minimum of each of the oxide 530a and the oxide 530c is preferably higher than the energy of the conduction band minimum of the oxide 530b. In other words, the electron affinity of each of the oxide 530a and the oxide 530c is preferably smaller than the electron affinity of the oxide 530b. In that case, for the oxide 530c, a metal oxide that can be used for the oxide 530a is preferably used. Specifically, the atomic proportion of the element M in the constituent elements in the metal oxide used as the oxide 530c is preferably higher than the atomic proportion of the element M in the constituent elements in the metal oxide used as the oxide 530b. Moreover, the atomic ratio of the element M to In in the metal oxide used as the oxide 530c is preferably higher than the atomic ratio of the element M to In in the metal oxide used as the oxide 530b. Furthermore, the atomic ratio of In to the element M in the metal oxide used as the oxide 530b is preferably higher than the atomic ratio of In to the element M in the metal oxide used as the oxide 530c.

The energy level of the conduction band minimum gradually changes at junction portions of the oxide 530a, the oxide 530b, and the oxide 530c. In other words, the energy level of the conduction band minimum at the junction portions of the oxide 530a, the oxide 530b, and the oxide 530c continuously changes or is continuously connected. To obtain this, the density of defect states in a mixed layer formed at the interface between the oxide 530a and the oxide 530b and the interface between the oxide 530b and the oxide 530c is preferably made low.

Specifically, when the oxide 530a and the oxide 530b or the oxide 530b and the oxide 530c contain a common element (as a main component) in addition to oxygen, a mixed layer with a low density of defect states can be formed. For example, in the case where the oxide 530b is an In—Ga—Zn oxide, an In—Ga—Zn oxide, a Ga—Zn oxide, gallium oxide, or the like may be used as the oxide 530a and the oxide 530c. In addition, the oxide 530c may have a stacked-layer structure. For example, it is possible to employ a stacked-layer structure of an In—Ga—Zn oxide and a Ga—Zn oxide over the In—Ga—Zn oxide, or a stacked-layer structure of an In—Ga—Zn oxide and gallium oxide over the In—Ga—Zn oxide. In other words, the oxide 530c may employ a stacked-layer structure of an In—Ga—Zn oxide and an oxide that does not contain In.

Specifically, as the oxide 530a, a metal oxide with In:Ga:Zn=1:3:4 [atomic ratio] or 1:1:0.5 [atomic ratio] is used. As the oxide 530b, a metal oxide with In:Ga:Zn=4:2:3 [atomic ratio] or 3:1:2 [atomic ratio] is used. As the oxide 530c, a metal oxide with In:Ga:Zn=1:3:4 [atomic ratio], In:Ga:Zn=4:2:3 [atomic ratio], Ga:Zn=2:1 [atomic ratio], or Ga:Zn=2:5 [atomic ratio] is used. Furthermore, specific examples of the case where the oxide 530c has a stacked-layer structure include a stacked-layer structure of In:Ga:Zn=4:2:3 [atomic ratio] and Ga:Zn=2:1 [atomic ratio], a stacked-layer structure of In:Ga:Zn=4:2:3 [atomic ratio] and Ga:Zn=2:5 [atomic ratio], and a stacked-layer structure of In:Ga:Zn=4:2:3 [atomic ratio] and gallium oxide.

At this time, the oxide 530b serves as a main carrier path. When the oxide 530a and the oxide 530c have the above structure, the density of defect states at the interface between the oxide 530a and the oxide 530b and the interface between the oxide 530b and the oxide 530c can be made low. Thus, the influence of interface scattering on carrier conduction is small, and the transistor 510F can have a high on-state current and high frequency characteristics. Note that in the case where the oxide 530c has a stacked-layer structure, in addition to the effect of reducing the density of defect states at the interface between the oxide 530b and the oxide 530c, the effect of inhibiting diffusion of the constituent element of the oxide 530c to the insulator 550 side is expected. More specifically, the oxide 530c has a stacked-layer structure and the oxide that does not contain In is positioned at the upper part of the stacked-layer structure, whereby the amount of In that would diffuse to the insulator 550 side can be reduced. Since the insulator 550 functions as a gate insulator, the transistor has defects in characteristics when In diffuses. Thus, when the oxide 530c has a stacked-layer structure, a highly reliable memory device can be provided.

A metal oxide functioning as an oxide semiconductor is preferably used as the oxide 530. For example, as the metal oxide to be the channel formation region in the oxide 530, a metal oxide having a bandgap of 2 eV or larger, preferably 2.5 eV or larger is preferably used. With the use of a metal oxide having such a wide bandgap, the off-state current of the transistor can be reduced. With the use of such a transistor, a memory device with low power consumption can be provided.

<Structure Example 7 of Transistor>

A structure example of a transistor 510G is described with reference to FIG. 20A and FIG. 20B. The transistor 510G is a modification example of the transistor 500. Therefore, differences from the above transistors are mainly described to avoid repeated description. Note that the structure illustrated in FIG. 20A and FIG. 20B can be employed for other transistors, such as the transistor 300, included in the memory device of one embodiment of the present invention.

Figure 20A:
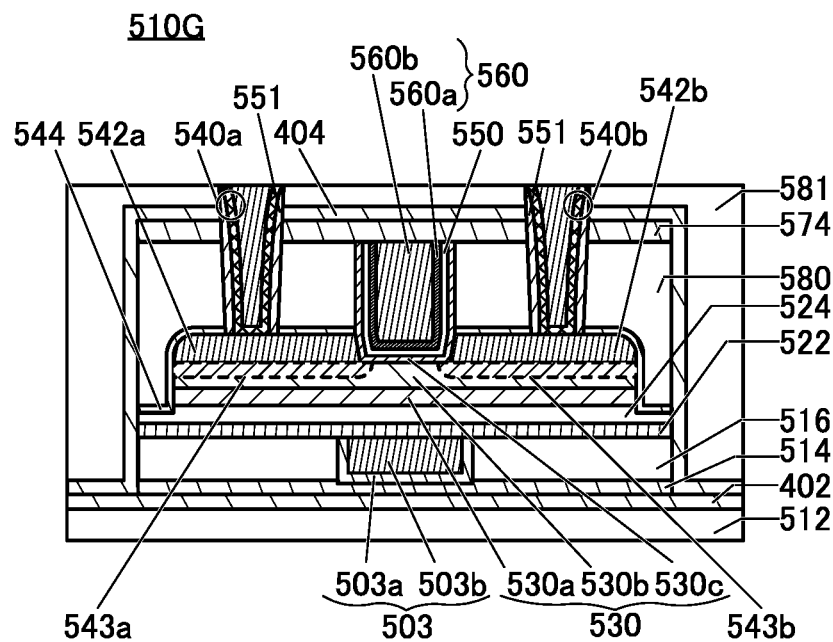
FIG. 20A and FIG. 20B are cross-sectional views illustrating a structure example of a transistor.
Figure 20B:
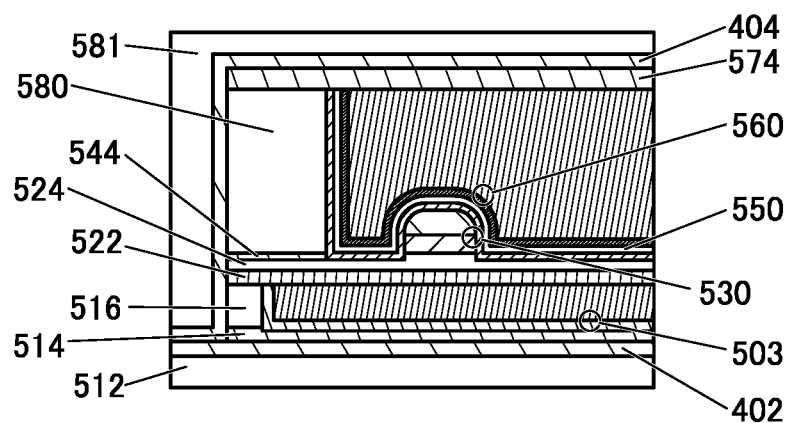

FIG. 20A is a cross-sectional view of the transistor 510G in the channel length direction, and FIG. 20B is a cross-sectional view of the transistor 510G in the channel width direction. The transistor 510G illustrated in FIG. 20A and FIG. 20B is different from the transistor 500 illustrated in FIG. 13A and FIG. 13B in including the insulator 402 and the insulator 404. Another difference from the transistor 500 illustrated in FIG. 13A and FIG. 13B is that the insulator 551 is provided in contact with a side surface of the conductor 540a and the insulator 551 is provided in contact with a side surface of the conductor 540b. Another difference from the transistor 500 illustrated in FIG. 13A and FIG. 13B is that the insulator 520 is not provided.

In the transistor 510G illustrated in FIG. 20A and FIG. 20B, the insulator 402 is provided over the insulator 512. In addition, the insulator 404 is provided over the insulator 574 and the insulator 402.

The transistor 510G illustrated in FIG. 20A and FIG. 20B has a structure in which the insulator 514, the insulator 516, the insulator 522, the insulator 524, the insulator 544, the insulator 580, and the insulator 574 are patterned and covered with the insulator 404. That is, the insulator 404 is in contact with the top surface of the insulator 574, a side surface of the insulator 574, a side surface of the insulator 580, a side surface of the insulator 544, a side surface of the insulator 524, a side surface of the insulator 522, a side surface of the insulator 516, a side surface of the insulator 514, and the top surface of the insulator 402. Thus, the oxide 530 and the like are isolated from the outside by the insulator 404 and the insulator 402.

It is particularly preferable that the insulator 402 and the insulator 404 have higher capability of inhibiting diffusion of hydrogen (e.g., at least one of a hydrogen atom, a hydrogen molecule, and the like) or a water molecule. For example, the insulator 402 and the insulator 404 are preferably formed using silicon nitride or silicon nitride oxide with a high hydrogen barrier property. This can inhibit diffusion of hydrogen or the like into the oxide 530, thereby inhibiting the degradation of the characteristics of the transistor 510G. Consequently, the reliability of the memory device of one embodiment of the present invention can be increased.

The insulator 551 is provided in contact with the insulator 581, the insulator 404, the insulator 574, the insulator 580, and the insulator 544. The insulator 551 preferably has a function of inhibiting diffusion of hydrogen or water molecules. For example, as the insulator 551, an insulator such as silicon nitride, aluminum oxide, or silicon nitride oxide that has a high hydrogen barrier property is preferably used. In particular, silicon nitride is suitably used for the insulator 551 because of its high hydrogen barrier property. The use of a material having a high hydrogen barrier property for the insulator 551 can inhibit diffusion of impurities such as water or hydrogen from the insulator 580 and the like into the oxide 530 through the conductor 540*a* and the conductor 540*b*. Furthermore, oxygen contained in the insulator 580 can be inhibited from being absorbed by the conductor 540*a* and the conductor 540*b*. Consequently, the reliability of the memory device of one embodiment of the present invention can be increased.

Figure 21:
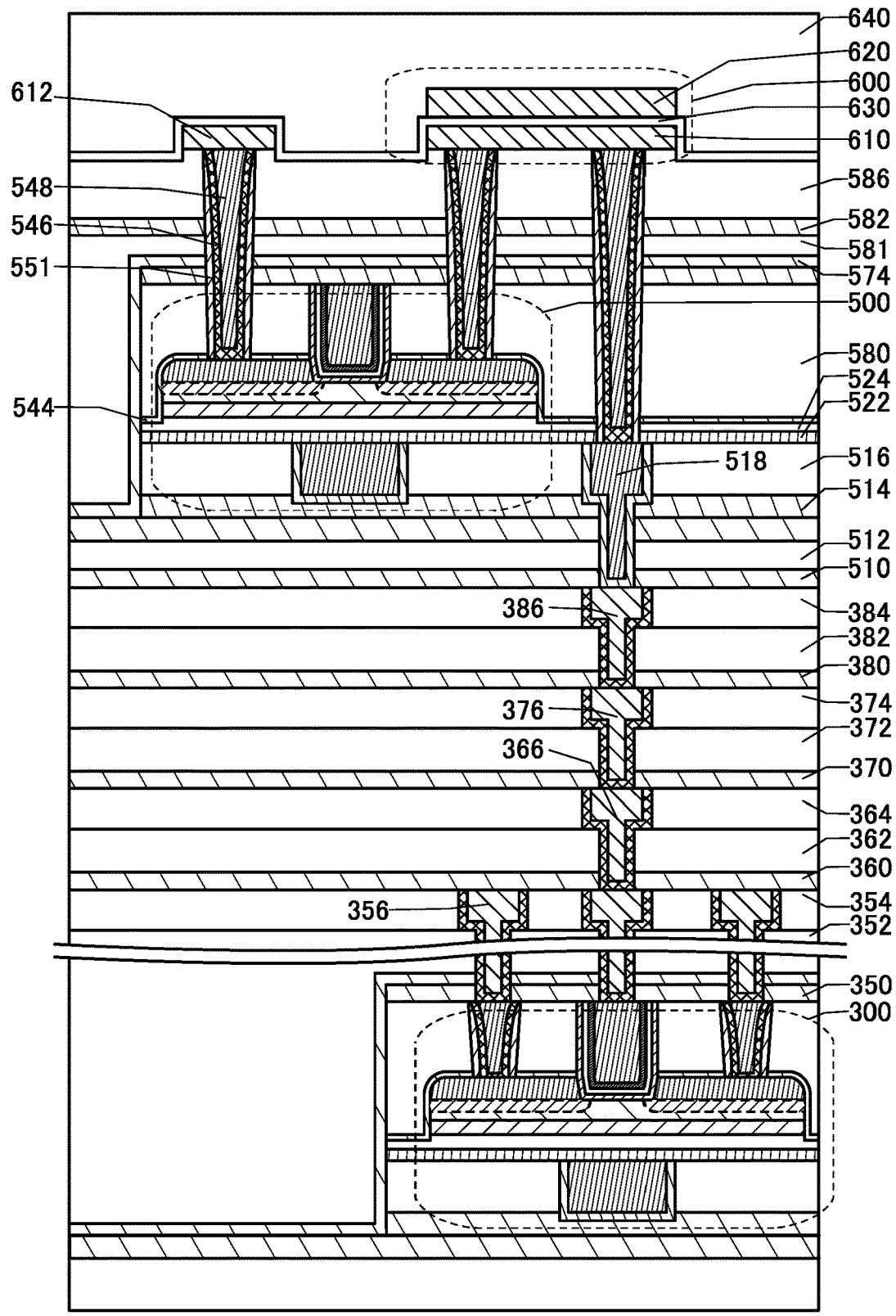
FIG. 21 is a cross-sectional view illustrating a structure example of a memory device.

FIG. 21 is a cross-sectional view illustrating a structure example of the memory device in the case where the transistor 500 and the transistor 300 have the structure illustrated in FIG. 20A and FIG. 20B. The insulator 551 is provided on the side surface of the conductor 546.

Figure 22A:
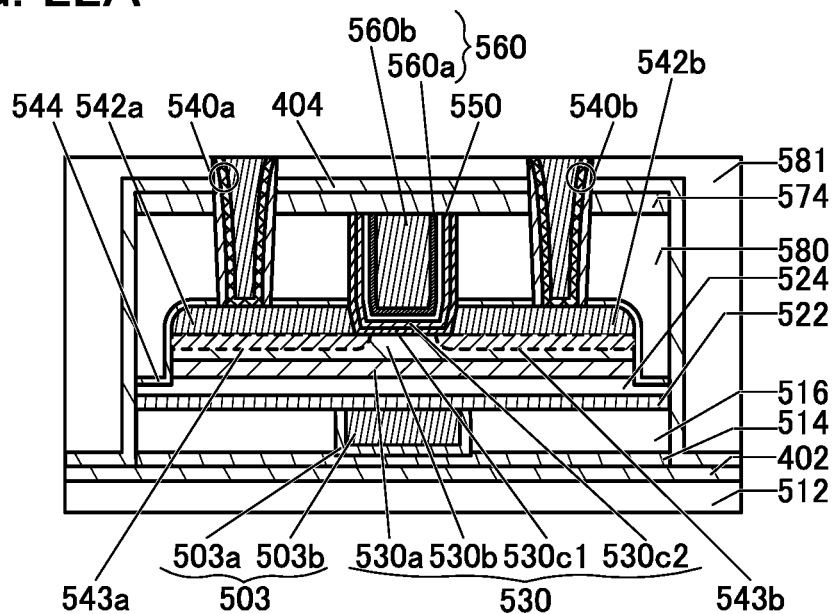
FIG. 22A and FIG. 22B are cross-sectional views illustrating a structure example of a transistor.
Figure 22B:
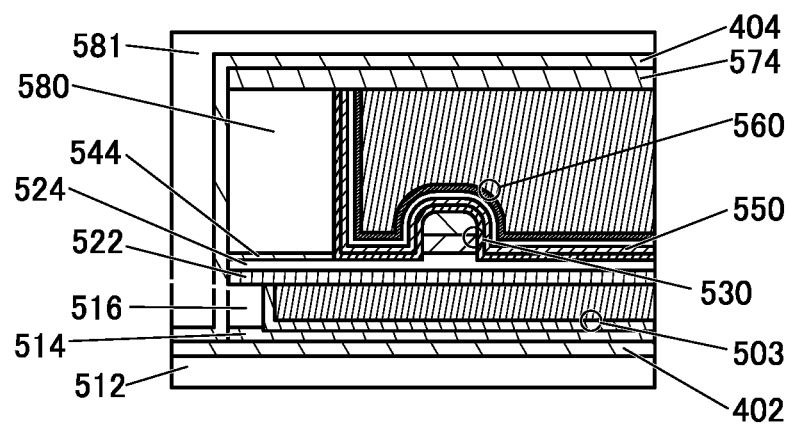

FIG. 22A and FIG. 22B show a modification example of the transistor illustrated in FIG. 20A and FIG. 20B. FIG. 22A is a cross-sectional view of the transistor in the channel length direction, and FIG. 22B is a cross-sectional view of the transistor in the channel width direction. The transistor illustrated in FIG. 22A and FIG. 22B is different from the transistor illustrated in FIG. 20A and FIG. 20B in that the oxide 530*c* has a two-layer structure of an oxide 530*c*1 and an oxide 530*c*2.

The oxide 530*c*1 is in contact with the top surface of the insulator 524, a side surface of the oxide 530*a*, the top surface and a side surface of the oxide 530*b*, side surfaces of the conductor 542*a* and the conductor 542*b*, a side surface of the insulator 544, and a side surface of the insulator 580. The oxide 530*c*2 is in contact with the insulator 550.

An In—Zn oxide can be used as the oxide 530*c*1, for example. For the oxide 530*c*2, it is possible to use a material similar to the material that can be used for the oxide 530*c* when the oxide 530*c* has a single-layer structure. For example, as the oxide 530*c*2, a metal oxide with In:Ga:Zn=1:3:4 [atomic ratio], Ga:Zn=2:1 [atomic ratio], or Ga:Zn=2:5 [atomic ratio] can be used.

When the oxide 530*c* has a two-layer structure of the oxide 530*c*1 and the oxide 530*c*2, the on-state current of the transistor can be increased as compared with the case where the oxide 530*c* has a single-layer structure. Thus, a transistor can be a power MOS transistor, for example. Note that the oxide 530*c* included in the transistor illustrated in FIG. 13A and FIG. 13B can also have a two-layer structure of the oxide 530*c*1 and the oxide 530*c*2.

The transistor illustrated in FIG. 22A and FIG. 22B can be employed for the transistor 500, the transistor 300, or both thereof.

Note that this embodiment can be implemented in combination with the other embodiments described in this specification as appropriate.

Embodiment 4

A metal oxide (hereinafter also referred to as an oxide semiconductor) that can be used in an OS transistor described in the above embodiment is described in this embodiment.

The metal oxide preferably contains at least indium or zinc. In particular, indium and zinc are preferably contained. In addition, aluminum, gallium, yttrium, tin, or the like is preferably contained. Furthermore, one or more kinds of elements selected from boron, titanium, iron, nickel, germanium, zirconium, molybdenum, lanthanum, cerium, neodymium, hafnium, tantalum, tungsten, magnesium, cobalt, and the like may be contained.

<Classification of Crystal Structure>

First, the classification of the crystal structures of oxide semiconductor is explained with FIG. 23A. FIG. 23A is a diagram showing the classification of crystal structures of an oxide semiconductor, typically IGZO (a metal oxide containing In, Ga, and Zn).

As shown in FIG. 23A, an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (cloud-aligned composite). Note that the term "Crystalline" excludes single crystal, poly crystal, and completely amorphous. The term "Crystal" includes single crystal and poly crystal.

Note that the structures in the thick frame in FIG. 23A are in an intermediate state between "Amorphous" and "Crystal", and belong to a new crystalline phase. That is, these structures are completely different from "Amorphous", which is energetically unstable, and "Crystal".

A crystal structure of a film or a substrate can be analyzed with an X-ray diffraction (XRD) spectrum. FIG. 23B shows an XRD spectrum, which is obtained by GIXD (Grazing-Incidence XRD) measurement, of a CAAC-IGZO film classified into "Crystalline". Note that a GIXD method is also referred to as a thin film method or a Seemann-Bohlin method. The XRD spectrum that is shown in FIG. 23B and obtained by GIXD measurement is hereinafter simply referred to as an XRD spectrum. The CAAC-IGZO film in FIG. 23B has a composition in the vicinity of In:Ga:Zn=4:2:3 [atomic ratio]. The CAAC-IGZO film in FIG. 23B has a thickness of 500 nm.

As shown in FIG. 23B, a clear peak indicating crystallinity is detected in the XRD spectrum of the CAAC-IGZO film. Specifically, a peak indicating c-axis alignment is detected at $2\theta$ of around 31° in the XRD spectrum of the CAAC-IGZO film. As shown in FIG. 23B, the peak at $2\theta$ of around 31° is asymmetric with respect to the axis of the angle at which the peak intensity is detected.

A crystal structure of a film or a substrate can also be evaluated with a diffraction pattern obtained by a nanobeam electron diffraction (NBED) method (such a pattern is also referred to as a nanobeam electron diffraction pattern). FIG. 23C shows a diffraction pattern of the CAAC-IGZO film. FIG. 23C shows a diffraction pattern obtained with the NBED method in which an electron beam is incident in the direction parallel to the substrate. The composition of the CAAC-IGZO film in FIG. 23C is In:Ga:Zn=4:2:3 [atomic ratio] or the neighborhood thereof. In the nanobeam electron diffraction method, electron diffraction is performed with a probe diameter of 1 nm.

As shown in FIG. 23C, a plurality of spots indicating c-axis alignment are observed in the diffraction pattern of the CAAC-IGZO film.

<<Structure of Oxide Semiconductor>>

Oxide semiconductors might be classified in a manner different from one shown in FIG. 23A when classified in terms of the crystal structure. Oxide semiconductors are classified into a single crystal oxide semiconductor and a non-single-crystal oxide semiconductor, for example.

Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that the distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a stacked-layer structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear grain boundary is observed is what is called polycrystal. It is highly probable that the grain boundary becomes a recombination center and captures carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, reduction in electron mobility due to the grain boundary is unlikely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable.

Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis using out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., 1 nm or larger and 30 nm or smaller).

[a-like OS]

The a-like OS is an oxide semiconductor having a structure between those of the nc-OS and the amorphous oxide semiconductor. The a-like OS includes a void or a low-density region. That is, the a-like OS has low crystallinity as compared with the nc-OS and the CAAC-OS.

Moreover, the a-like OS has higher hydrogen concentration in the film than the nc-OS and the CAAC-OS.

<<Structure of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Here, the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide has [In] higher than that in the composition of the CAC-OS film. Moreover, the second region has [Ga] higher than that in the composition of the CAC-OS film. For example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. A CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current (Ion), high field-effect mobility ($\mu$), and excellent switching operation can be achieved.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor with a low carrier concentration is preferably used for the transistor. For example, the carrier concentration of an oxide semiconductor is lower than or equal to $1 \times 10^{17}$ cm$^{-3}$, preferably lower than or equal to $1 \times 10^{15}$ cm$^{-3}$, further preferably lower than or equal to $1 \times 10^{13}$ cm$^{-3}$, still further preferably lower than or equal to $1 \times 10^{11}$ cm$^{-3}$, yet further preferably lower than $1 \times 10^{10}$ cm$^{-3}$, and higher than or equal to $1 \times 10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Electric charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained using SIMS, is lower than or equal to $1\times10^{18}$ atoms/cm$^3$, preferably lower than or equal to $2\times10^{16}$ atoms/cm$^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained using SIMS, is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained using SIMS, is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for the channel formation region of the transistor, stable electrical characteristics can be given.

Note that this embodiment can be implemented in combination with the other embodiments described in this specification as appropriate.

Embodiment 5

In this embodiment, examples of an electronic component and an electronic device that include the memory device 10 described in the above embodiments are described.

<Electronic Component>

First, examples of electronic components in which the memory device 10 is incorporated are described with reference to FIG. 24A and FIG. 24B.

Figure 24A:
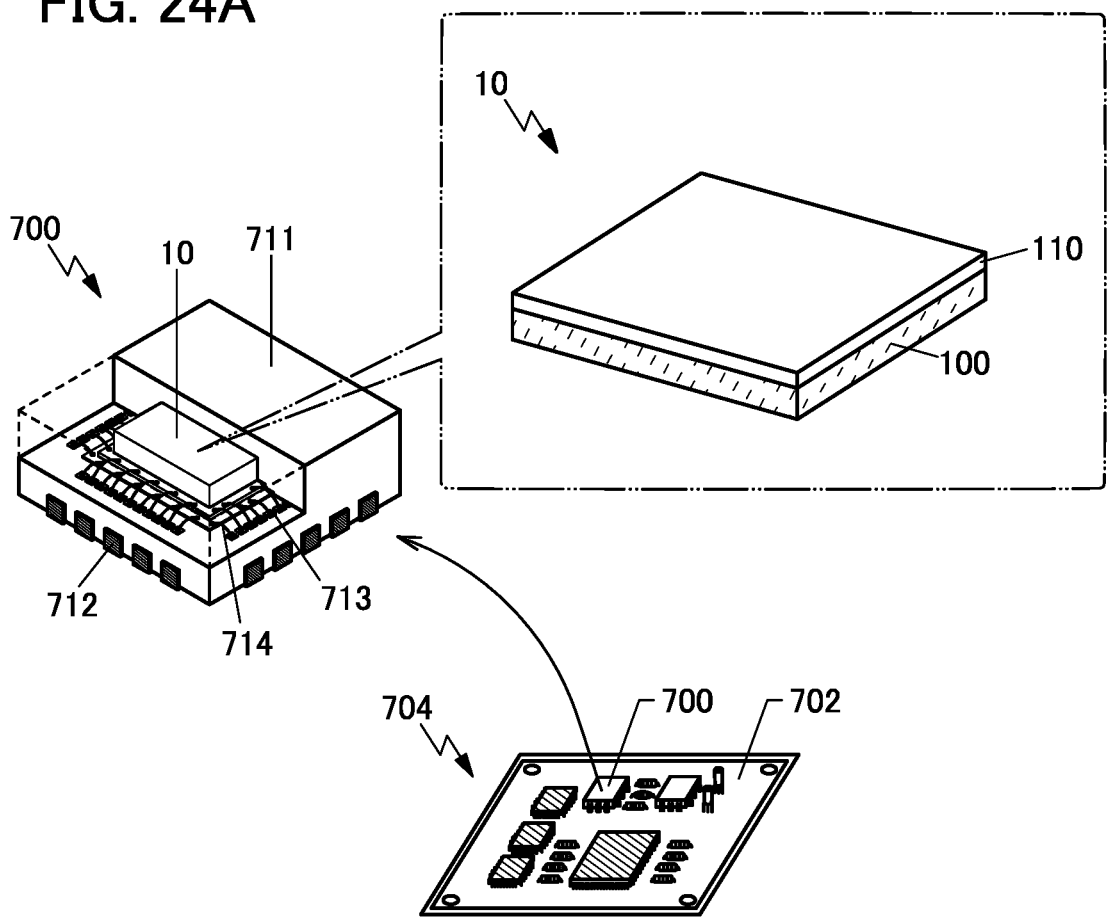
FIG. 24A and FIG. 24B are schematic diagrams illustrating examples of electronic devices.

FIG. 24A is a perspective view of an electronic component 700 and a substrate (a mounting board 704) on which the electronic component 700 is mounted. In the electronic component 700 illustrated in FIG. 24A, the memory device 10 where the layer 110 is stacked over the layer 100 is included in a mold 711. FIG. 24A omits part of the electronic component 700 to show the inside of the electronic component 700. The electronic component 700 includes a land 712 outside the mold 711. The land 712 is electrically connected to an electrode pad 713, and the electrode pad 713 is electrically connected to the memory device 10 via a wire 714. The electronic component 700 is mounted on a printed circuit board 702, for example. A plurality of such electronic components are combined and electrically connected to each other on the printed circuit board 702, whereby the mounting board 704 is completed.

Figure 24B:
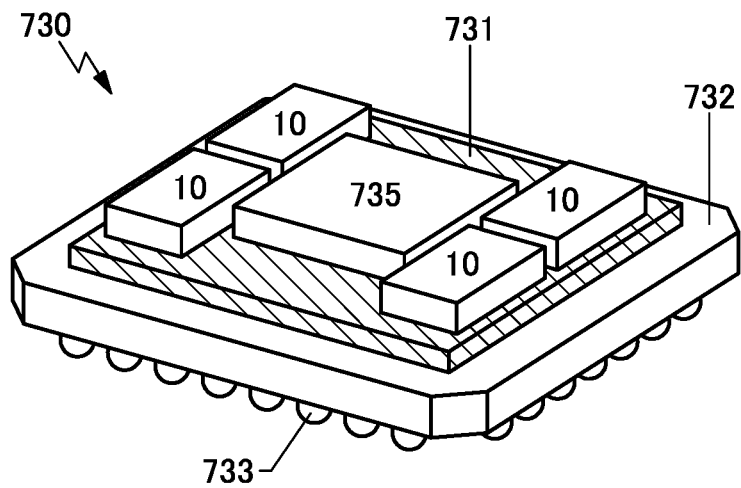

FIG. 24B is a perspective view of an electronic component 730. The electronic component 730 is an example of a SiP (System in package) or an MCM (Multi Chip Module). In the electronic component 730, an interposer 731 is provided on a package substrate 732 (a printed circuit board), and a semiconductor device 735 and a plurality of memory devices 10 are provided on the interposer 731.

The electronic component 730 using the memory devices 10 as high bandwidth memory (HBM) is shown as an example. An integrated circuit (semiconductor device) such as a CPU, a GPU, or an FPGA can be used as the semiconductor device 735.

As the package substrate 732, a ceramic substrate, a plastic substrate, a glass epoxy substrate, or the like can be used. As the interposer 731, a silicon interposer, a resin interposer, or the like can be used.

The interposer 731 includes a plurality of wirings and has a function of electrically connecting a plurality of integrated circuits with different terminal pitches. The plurality of wirings are provided in a single layer or multiple layers. Moreover, the interposer 731 has a function of electrically connecting an integrated circuit provided on the interposer 731 to an electrode provided on the package substrate 732. Accordingly, the interposer is sometimes referred to as a "redistribution substrate" or an "intermediate substrate". A through electrode may be provided in the interposer 731 and used for electrically connecting an integrated circuit and the package substrate 732. For a silicon interposer, a TSV (Through Silicon Via) can also be used as the through electrode.

A silicon interposer is preferably used as the interposer 731. A silicon interposer can be manufactured at lower cost than an integrated circuit because it is not necessary to provide an active element. Meanwhile, since wirings of a silicon interposer can be formed through a semiconductor process, formation of minute wirings, which is difficult for a resin interposer, is easy.

In order to achieve a wide memory bandwidth, many wirings need to be connected to HBM. Therefore, formation of minute and high-density wirings is required for an interposer on which HBM is mounted. For this reason, a silicon interposer is preferably used as the interposer on which HBM is implanted.

In a SiP, an MCM, or the like using a silicon interposer, the decrease in reliability due to a difference in expansion coefficient between an integrated circuit and the interposer is less likely to occur. Furthermore, the surface of a silicon interposer has high planarity, so that a poor connection between the silicon interposer and an integrated circuit provided on the silicon interposer is less likely to occur. It is particularly preferable to use a silicon interposer for a 2.5D package (2.5-dimensional mounting) in which a plurality of integrated circuits are arranged side by side on an interposer.

A heat sink (a radiator plate) may be provided to overlap the electronic component 730. In the case of providing a heat sink, the heights of integrated circuits provided on the interposer 731 are preferably equal to each other. For example, in the electronic component 730 described in this embodiment, the heights of the memory device 10 and the semiconductor device 735 are preferably equal to each other.

To implant the electronic component 730 on another substrate, an electrode 733 may be provided on the bottom portion of the package substrate 732. FIG. 24B illustrates an example in which the electrode 733 is formed of a solder ball. When solder balls are provided in a matrix on the bottom portion of the package substrate 732, BGA (Ball Grid Array) mounting can be achieved. Alternatively, the electrode 733 may be formed of a conductive pin. When conductive pins are provided in a matrix on the bottom portion of the package substrate 732, PGA (Pin Grid Array) mounting can be achieved.

The electronic component 730 can be mounted on another substrate by various mounting methods not limited to BGA and PGA. For example, a mounting method such as SPGA (Staggered Pin Grid Array), LGA (Land Grid Array), QFP (Quad Flat Package), QFJ (Quad Flat J-leaded package), or QFN (Quad Flat Non-leaded package) can be employed.

<Electronic Device>

Figure 25:
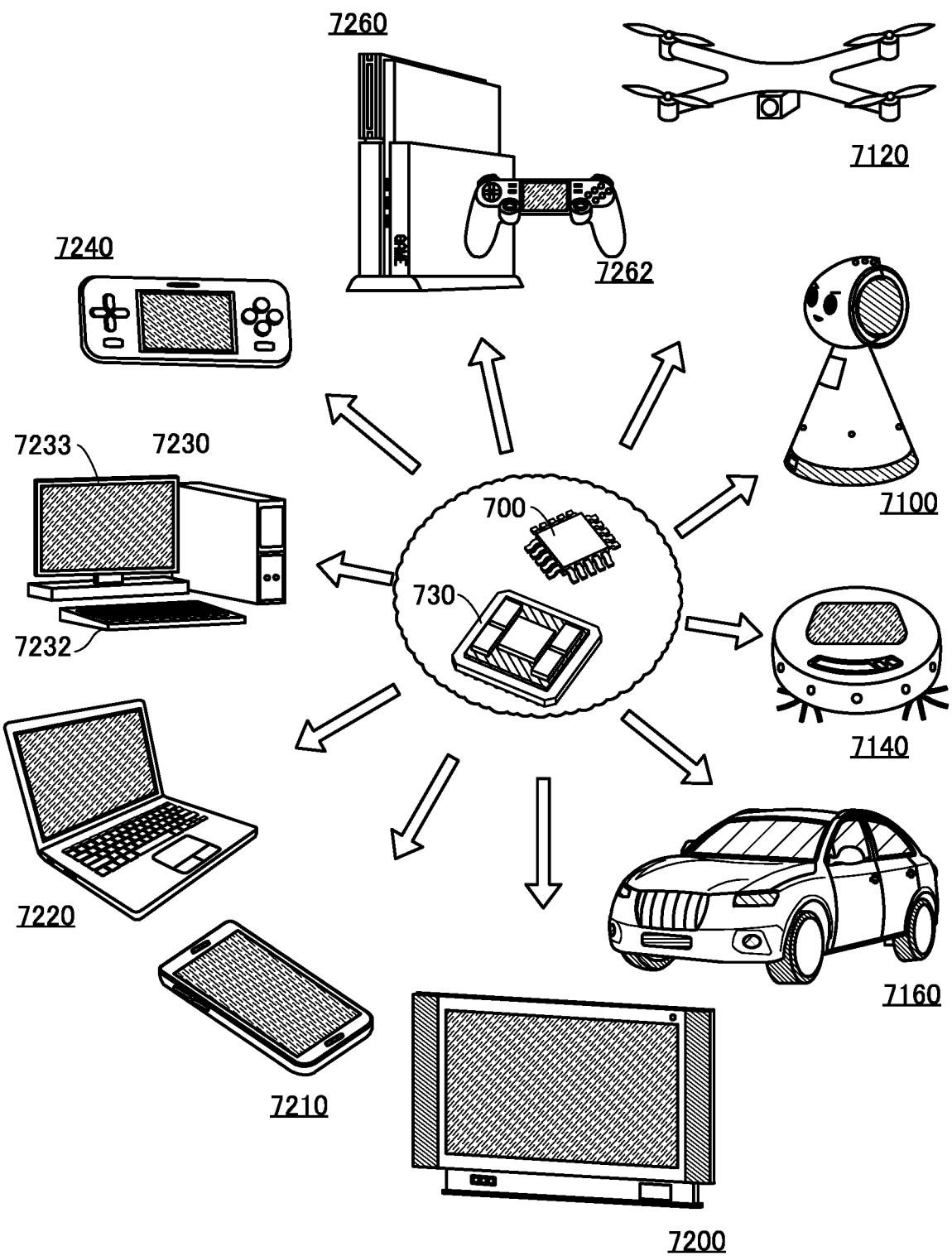
FIG. 25 is a diagram illustrating examples of electronic devices

Next, examples of electronic devices including the above electronic component are described with reference to FIG. 25.

A robot 7100 includes an illuminance sensor, a microphone, a camera, a speaker, a display, various kinds of sensors (e.g., an infrared ray sensor, an ultrasonic wave sensor, an acceleration sensor, a piezoelectric sensor, an optical sensor, and a gyro sensor), a moving mechanism, and the like. The electronic component 730 includes a processor or the like and has a function of controlling these peripheral devices. For example, the electronic component 700 has a function of storing data obtained by the sensors.

The microphone has a function of detecting acoustic signals of a speaking voice of a user, an environmental sound, and the like. The speaker has a function of outputting audio signals such as a voice and a warning beep. The robot 7100 can analyze an audio signal input via the microphone and can output a necessary audio signal from the speaker. The robot 7100 can communicate with the user with use of the microphone and the speaker.

The camera has a function of taking images of the surroundings of the robot 7100. The robot 7100 has a function of moving with use of the moving mechanism. The robot 7100 can take images of the surroundings with use of the camera and analyze the images to sense whether there is an obstacle in the way of the movement.

A flying object 7120 includes propellers, a camera, a battery, and the like and has a function of flying autonomously. The electronic component 730 has a function of controlling these peripheral devices.

For example, image data taken by the camera is stored in the electronic component 700. The electronic component 730 can analyze the image data to sense whether there is an obstacle in the way of the movement. Moreover, the electronic component 730 can estimate the remaining battery level from a change in the power storage capacity of the battery.

A cleaning robot 7140 includes a display provided on the top surface, a plurality of cameras provided on the side surface, a brush, an operation button, various kinds of sensors, and the like. Although not illustrated, the cleaning robot 7140 is provided with a tire, an inlet, and the like. The cleaning robot 7140 can run autonomously, detect dust, and vacuum the dust through the inlet provided on the bottom surface.

For example, the electronic component 730 can analyze images taken by the cameras to judge whether there is an obstacle such as a wall, furniture, or a step. In the case where an object that is likely to be caught in the brush, such as a wire, is detected by image analysis, the rotation of the brush can be stopped.

An automobile 7160 includes an engine, tires, a brake, a steering gear, a camera, and the like. For example, the electronic component 730 performs control for optimizing the running state of the automobile 7160 on the basis of navigation information, the speed, the state of the engine, the gearshift state, the use frequency of the brake, and other data. For example, image data taken by the camera is stored in the electronic component 700.

The electronic component 700 and/or the electronic component 730 can be incorporated in a TV device 7200 (a television receiver), a smartphone 7210, PCs (personal computers) 7220 and 7230, a game machine 7240, a game machine 7260, and the like.

For example, the electronic component 730 incorporated in the TV device 7200 can function as an image processing engine. The electronic component 730 performs, for example, image processing such as noise removal and resolution up-conversion.

The smartphone 7210 is an example of a portable information terminal. The smartphone 7210 includes a microphone, a camera, a speaker, various kinds of sensors, and a display portion. These peripheral devices are controlled by the electronic component 730.

The PC 7220 and the PC 7230 are examples of a laptop PC and a desktop PC. To the PC 7230, a keyboard 7232 and a monitor device 7233 can be connected with or without a wire. The game machine 7240 is an example of a portable game machine. The game machine 7260 is an example of a stationary game machine. To the game machine 7260, a controller 7262 is connected with or without a wire. The electronic component 700 and/or the electronic component 730 can be incorporated in the controller 7262.

Note that this embodiment can be implemented in combination with the other embodiments described in this specification as appropriate.

REFERENCE NUMERALS

C11: capacitor, C12: capacitor, C13: capacitor, C14: capacitor, C15: capacitor, C16: capacitor, C17: capacitor, C18: capacitor, M11: transistor, M12: transistor, N11: node, Tr21: transistor, Tr22: transistor, Tr23: transistor, Tr31: transistor, Tr32: transistor, Tr33: transistor, Tr34: transistor, Tr41: transistor, Tr42: transistor, 10: memory device, 11: transistor, 12: transistor, 13: transistor, 14: transistor, 15: transistor, 16: transistor, 17: transistor, 18: transistor, 21: transistor, 22: transistor, 23: transistor, 24: transistor, 25: transistor, 26: transistor, 27: transistor, 28: transistor, 31: transistor, 32: transistor, 33: transistor, 34: transistor, 41: transistor, 42: transistor, 43: transistor, 44: transistor, 45: transistor, 46: transistor, 100: layer, 101: peripheral circuit, 110: layer, 111: memory cell array, 112: circuit, 113: memory cell block, 114: memory cell, 121: row decoder, 122: word line driver circuit, 131: column decoder, 132: bit line driver circuit, 133: precharge circuit, 134: sense amplifier, 135: input/output circuit, 141: output circuit, 151: control logic circuit, 211: memory cell array, 214: memory cell, 300: transistor, 311: substrate, 313: semiconductor region, 314a: low-resistance region, 314b: low-resistance region, 315: insulator, 316: conductor, 320: insulator, 322: insulator, 324: insulator, 326: insulator, 328: conductor, 330:

conductor, 350: insulator, 352: insulator, 354: insulator, 356: conductor, 360: insulator, 362: insulator, 364: insulator, 366: conductor, 370: insulator, 372: insulator, 374: insulator, 376: conductor, 380: insulator, 382: insulator, 384: insulator, 386: conductor, 402: insulator, 404: insulator, 500: transistor, 503: conductor, 503*a*: conductor, 503*b*: conductor, 505: conductor, 505*a*: conductor, 505*b*: conductor, 510: insulator, 510A: transistor, 510B: transistor, 510C: transistor, 510D: transistor, 510E: transistor, 510F: transistor, 510G: transistor, 511: insulator, 512: insulator, 514: insulator, 516: insulator, 518: conductor, 520: insulator, 521: insulator, 522: insulator, 524: insulator, 530: oxide, 530*a*: oxide, 530*b*: oxide, 530*c*: oxide, 530*c*1: oxide, 530*c*2: oxide, 531: region, 531*a*: region, 531*b*: region, 540*a*: conductor, 540*b*: conductor, 542: conductor, 542*a*: conductor, 542*b*: conductor, 543: region, 543*a*: region, 543*b*: region, 544: insulator, 545: insulator, 546: conductor, 546*a*: conductor, 546*b*: conductor, 547: conductor, 547*a*: conductor, 547*b*: conductor, 548: conductor, 550: insulator, 551: insulator, 552: metal oxide, 560: conductor, 560*a*: conductor, 560*b*: conductor, 570: insulator, 571: insulator, 573: insulator, 574: insulator, 575: insulator, 576: insulator, 576*a*: insulator, 576*b*: insulator, 580: insulator, 581: insulator, 582: insulator, 584: insulator, 586: insulator, 600: capacitor, 610: conductor, 612: conductor, 620: conductor, 630: insulator, 650: insulator, 700: electronic component, 702: printed circuit board, 704: mounting board, 711: mold, 712: land, 713: electrode pad, 714: wire, 730: electronic component, 731: interposer, 732: package substrate, 733: electrode, 735: semiconductor device, 7100: robot, 7120: flying object, 7140: cleaning robot, 7160: automobile, 7200: TV device, 7210: smartphone, 7220: PC, 7230: PC, 7232: keyboard, 7233: monitor device, 7240: game machine, 7260: game machine, 7262: controller

The invention claimed is:

1. A memory device comprising:
a word line driver circuit;
a switching circuit; and
a memory cell array,
wherein the word line driver circuit has a function of outputting signals to k (k is an integer greater than or equal to 1) signal lines,
wherein the memory cell array includes k+1 word lines,
wherein each of the k+1 word lines is electrically connected to a plurality of memory cells,
wherein the switching circuit includes 2×k switch transistors,
wherein each of gates of the 2×k switch transistors is electrically connected to one of a source and a drain of a transistor and one terminal of a capacitor,
wherein one of a source and a drain of one of the 2×k switch transistors is electrically connected to one of the k signal lines, and the other of the source and the drain of the one of the 2×k switch transistors is electrically connected to one of the k+1 word lines, and
wherein one of a source and a drain of a different one of the 2×k switch transistors is electrically connected to the one of the k signal lines, and the other of the source and the drain of the different one of the 2×k switch transistors is electrically connected to a different one of the k+1 word lines.

2. The memory device according to claim 1, wherein the transistor contains a metal oxide in a channel formation region.

3. The memory device according to claim 1, wherein the switch transistors and the transistor each contain a metal oxide in a channel formation region.

4. A memory device comprising:
a word line driver circuit;
first to m-th (m is an integer greater than or equal to 1) switching circuits; and
first to m-th memory cell blocks,
wherein the word line driver circuit includes first to m-th circuits,
wherein the j-th (j is an integer greater than or equal to 1 and less than or equal to m) circuit has a function of outputting signals to the j-th switching circuit through first to k-th (k is an integer greater than or equal to 1) signal lines,
wherein the j-th memory cell block includes k+1 word lines,
wherein each of the k+1 word lines is electrically connected to a plurality of memory cells,
wherein the j-th switching circuit includes 2×k switch transistors,
wherein in the j-th switching circuit, each of gates of the 2×k switch transistors is electrically connected to one of a source and a drain of a transistor and one terminal of a capacitor, and
wherein in the j-th switching circuit, one of a source and a drain of one of the 2×k switch transistors is electrically connected to one of the k signal lines, the other of the source and the drain of the one of the 2×k switch transistors is electrically connected to one of the k+1 word lines, one of a source and a drain of a different one of the 2×k switch transistors is electrically connected to the one of the k signal lines, and the other of the source and the drain of the different one of the 2×k switch transistors is electrically connected to a different one of the k+1 word lines.

5. The memory device according to claim 4, wherein the transistor contains a metal oxide in a channel formation region.

6. The memory device according to claim 4, wherein the switch transistors and the transistor each contain a metal oxide in a channel formation region.

7. A memory device comprising:
a semiconductor substrate including a word line driver circuit; and
an element layer including first to m-th (m is an integer greater than or equal to 1) switching circuits and first to m-th memory cell blocks,
wherein the word line driver circuit includes first to m-th circuits,
wherein the j-th (j is an integer greater than or equal to 1 and less than or equal to m) circuit has a function of outputting signals to the j-th switching circuit through first to k-th (k is an integer greater than or equal to 1) signal lines,
wherein the j-th memory cell block includes k+1 word lines,
wherein each of the k+1 word lines is electrically connected to a plurality of memory cells,
wherein the j-th switching circuit includes 2×k switch transistors,
wherein in the j-th switching circuit, each of gates of the 2×k switch transistors is electrically connected to one of a source and a drain of a transistor and one terminal of a capacitor,
wherein in the j-th switching circuit, one of a source and a drain of one of the 2×k switch transistors is electrically connected to one of the k signal lines, the other of the source and the drain of the one of the 2×k switch transistors is electrically connected to one of the k+1 word lines, one of a source and a drain of a different one of the 2×k switch transistors is electrically connected to the one of the k signal lines, and the other of the source and the drain of the different one of the 2×k switch transistors is electrically connected to a different one of the k+1 word lines, and wherein the element layer is provided to be stacked above the semiconductor substrate.

8. The memory device according to claim 7, wherein the transistor and the switch transistors that are provided in the element layer each contain a metal oxide in a channel formation region.

9. The memory device according to claim 7, wherein the semiconductor substrate is a single crystal silicon substrate, and wherein the transistor and the switch transistors that are provided in the element layer each contain a metal oxide in a channel formation region.

\* \* \* \* \*